United States Patent [19]
Iadanza

[11] Patent Number: 6,091,645
[45] Date of Patent: Jul. 18, 2000

[54] PROGRAMMABLE READ PORTS AND WRITE PORTS FOR I/O BUSES IN A FIELD PROGRAMMABLE MEMORY ARRAY

[75] Inventor: Joseph Andrew Iadanza, Hinesburg, Vt.

[73] Assignee: International Business Machines Corporation, Armonk, N.Y.

[21] Appl. No.: 09/190,681

[22] Filed: Nov. 12, 1998

Related U.S. Application Data

[62] Division of application No. 08/575,312, Dec. 20, 1995, Pat. No. 5,914,906.

[51] Int. Cl.[7] .................................................. G11C 7/00
[52] U.S. Cl. ................................ 365/189.02; 365/230.02; 365/189.05
[58] Field of Search .................... 365/189.02, 230.02, 365/189.05

[56] References Cited

U.S. PATENT DOCUMENTS

| | | | |
|---|---|---|---|
| 4,430,712 | 2/1984 | Coulson et al. ......................... | 364/300 |
| 4,435,775 | 3/1984 | Brantingham et al. .................. | 364/900 |
| 4,636,990 | 1/1987 | Buscaglia et al. . | |
| 4,694,433 | 9/1987 | Wiedman ................................ | 365/230 |
| 4,775,942 | 10/1988 | Ferreri et al. ........................... | 364/491 |
| 4,969,148 | 11/1990 | Nadeau-Dostie et al. ............. | 371/21.1 |
| 5,117,389 | 5/1992 | Yiu ......................................... | 365/104 |
| 5,121,355 | 6/1992 | Gubbels et al. ........................ | 365/200 |
| 5,278,956 | 1/1994 | Thomsen et al. ...................... | 395/250 |
| 5,341,382 | 8/1994 | Levitt ..................................... | 371/22.1 |
| 5,341,488 | 8/1994 | Kobayashi ..................... | 365/189.02 X |
| 5,406,525 | 4/1995 | Nicholes ............................ | 365/230.02 |
| 5,426,378 | 6/1995 | Ong . | |
| 5,434,406 | 7/1995 | Freeman et al. ........................ | 364/490 |
| 5,465,056 | 11/1995 | Hsieh et al. . | |
| 5,469,003 | 11/1995 | Kean . | |
| 5,583,822 | 12/1996 | Rao ................................... | 365/230.03 |
| 5,652,726 | 7/1997 | Tsukude et al. ...................... | 365/63 X |
| 5,870,340 | 2/1999 | Ohsawa ............................... | 365/189.02 |

*Primary Examiner*—Huan Hoang
*Attorney, Agent, or Firm*—Heslin & Rothenberg, P.C.

[57] ABSTRACT

A field programmable memory array having a plurality of sub-arrays is provided. Programmable address decoders, programmable hierarchical bit line arrangements, programmable I/O arrangements, among other features, are provided to enable programming of portions of the array into selected modes. The modes may include wide memory, deep memory, FIFO, LIFO, among others. An embodiment of the invention is disclosed wherein the field programmable memory array is integrated with the programmable resources of a field programmable gate array.

19 Claims, 48 Drawing Sheets

ASSEMBLE FIG. 1 AS FOLLOWS:

ASSEMBLE FIG. 2 AS FOLLOWS:

ASSEMBLE FIG. 6 AS FOLLOWS:

ASSEMBLE FIG. 18 AS FOLLOWS:
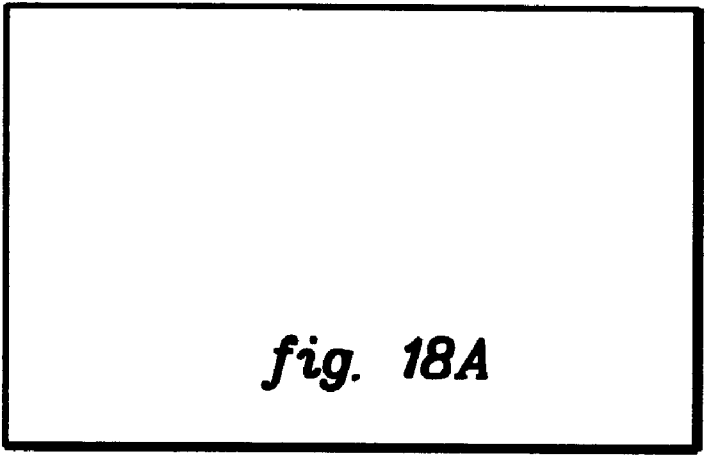
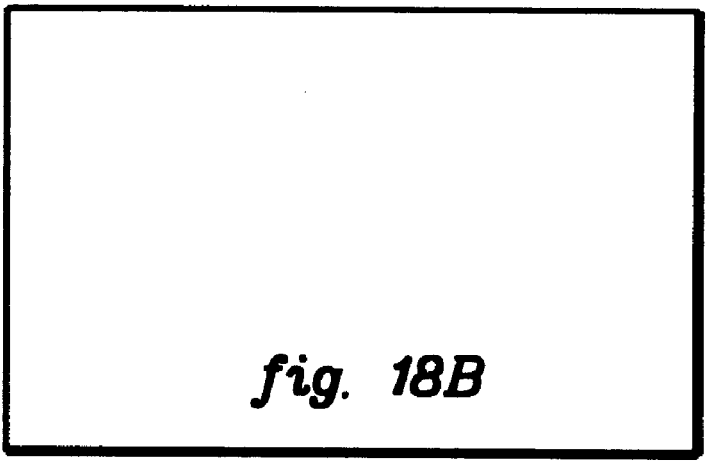

ASSEMBLE FIG. 26 AS FOLLOWS:

ASSEMBLE FIG. 27 AS FOLLOWS:

ASSEMBLE FIG. 28 AS FOLLOWS:

PROGRAMMABLE READ PORTS AND WRITE PORTS FOR I/O BUSES IN A FIELD PROGRAMMABLE MEMORY ARRAY

RELATED APPLICATION INFORMATION

This Application is a divisional of earlier U.S. patent application Ser. No. 08/575,312, filed Dec. 20, 1995, now U.S. Pat. No. 5,914,906 relates to the commonly owned, concurrently or previously filed U.S. Patent Applications:

1. Serial No. 08/575,314 filed Dec. 20, 1995, U.S. Pat. No. 5,719,889, issued Feb. 17, 1998, entitled "PROGRAMMABLE PARITY CHECKING AND COMPARISON CIRCUIT;" and 2. Serial No. 08/575,422 filed Dec. 20, 1995, U.S. Pat. No. 5,802,003, issued Sep. 1, 1998 entitled: "A SYSTEM FOR IMPLEMENTING WRITE, INITIALIZATION, AND RESET IN A MEMORY ARRAY USING A SINGLE CELL WRITE PORT."

Each of these Applications is incorporated herein by reference in its entirety.

TECHNICAL FIELD

This invention relates to data memory and more specifically to a programmable memory array with associated programmable routing and control resources. This invention also relates to a programmable memory array incorporated together with a field programmable gate array.

BACKGROUND OF THE INVENTION

Known integrated memory arrays generally have a fixed depth and fixed width as associated with a given data storage application. Accordingly, different data storage applications may require separate respective memory arrays for meeting the different depth/width requirements. However, it would be advantageous if a single memory resource were capable of meeting the different depth/width application needs.

A variety of known memory devices are available for providing different memory access techniques. The most common memory access technique includes simple addressable read/write memory functionality. Other access techniques include LIFO (Last In First Out), FIFO (First In First Out) and rollover data stack operations. Existing data storage devices are generally tailored to specific, fixed access techniques. However, it would be advantageous if a memory device were programmable to selectively provide combinations of access techniques.

Programmable integrated circuits are known in the art and include programmable gate arrays (PGA) which provide an array of distinct, uncommitted logic cells. A programmable interconnect network is usually provided for interconnecting the cells and/or to provide data input to and output from the array. Customization or programming of the otherwise generally designed logic cells and interconnect network is performed for implementing a particular application. One such device is a field-programmable gate array (FPGA), wherein the configuration of the FPGA can be performed by a user "in the field." The configuration of the FPGA is effected by using electrically programmable fusible links, anti-fuses, memory controlled transistors or floating gate transistors. To program the FPGA, configuration data is transferred from an external memory device to electrically programmable resources of the FPGA. As densities of these field programmable gate arrays increase, the demand for on-board memory/storage functionality likewise increases. Accordingly, it would be desirable to provide an integrated circuit including an FPGA together with a programmable memory array, which memory array could be capable of implementing various configurations, and/or provide one of a variety of memory access techniques.

SUMMARY OF THE INVENTION

Accordingly, it is an object of the present invention to provide an improved memory array.

It is a another object of the present invention to provide a programmable memory array that is programmably configurable for providing a variety of data storage architectures.

It is a further object of the present invention to provide a memory array selectively programmable for implementing a variety of memory access techniques It is yet a further object of the present invention to provide an integrated circuit incorporating a field programmable gate array together with a programmable memory array.

It is yet a further object of the present invention to provide an integrated circuit incorporating a field programmable gate array together with a field programmnable memory array, wherein the field programmable memory array is accessible during configuration of the field programmable gate array, during reconfiguration of the field programmable gate array, or during normal functionality of the field programmable gate array.

The present invention is, in one aspect, a field programmable memory array having a plurality of memory sub-arrays. The memory sub-arrays are selectively programmable for implementing a variety of different memory configurations and operating modes. In general, each sub-array can be programmed into, and thereafter accessed using, one of a set of modes. The set of modes includes, in one embodiment, wide RAM, deep RAM, FIFO and LIFO.

Numerous programmable structures are provided by the present invention to effect the programming of the portions of the memory array. For example, the array may include an address decoder and a programmable access unit for providing read and write input addresses to the address decoder during associated read and write operations of the memory array. The programmable access unit may further comprise a first address counter, a first clock control unit and an address comparison unit.

The bit lines of the memory array are placed into a programmable, hierarchical arrangement. Local bit lines, semi-global bit lines and global bit lines can be provided and are programmably interconnectable to provide a high degree of bit line programmability. Further, the interconnected bit line structure is programmably connectable to I/O buses.

A primary I/O bus and a secondary I/O bus can be provided, along with first and second selective couplers for programmable connections thereto.

A programmable address decoder may be provided having M word lines, a plurality of address lines propagating address data, and a decoder circuit for selectively driving a given word line of the M word lines as selected in accordance with address data of the plurality of address lines. A selective coupler can also be provided having a plurality of inputs coupled to an associated set of lines of an address bus, and an output coupled to an address line of the plurality of address lines, the selective coupler selectively coupling its output to one of its plurality of inputs in accordance with programming data.

A selective read capture latch can be provided for selectively interfacing to the hierarchical bit line structure. The selective read capture latch may include at least first and second hierarchy inputs, a memory unit having an input and an output, and selective coupling means between the first and second hierarchy inputs and the input of the memory unit, for selectively coupling one of the first and second hierarchy inputs to the input of the memory unit for propagating data therebetween in accordance with an associated hierarchy read capture clock. Precharge means may be provided for pre-charging at least one bit line of the hierarchical bit line structure.

In alternate embodiments, programmable transfer paths and scan chain latches can be provided between the memory cells of the array to provide a physical LIFO/FIFO function, as well as provide testability for the cells and related paths in the array, respectively.

In a preferred embodiment, the field programmable memory array (FPMA) disclosed herein can be integrated with the programmable logic cells of a field programmable gate array (FPGA) to provide a fully programmable logic system which includes highly programmable combinational and memory circuitry.

The aforementioned, along with numerous other features of the present invention, disclosed below, provide a significant improvement over prior art memory systems wherein the memory access technique was fixed, offering little or no flexibility for user access thereto.

BRIEF DESCRIPTION OF THE DRAWINGS

The subject matter which is regarded as the invention is particularly pointed out and distinctly claimed in the concluding portion of the specification. The invention, however, both as to organization and method of practice, together with further objects and advantages thereof, may best be understood by reference to the following detailed description of the preferred embodiments and the accompanying drawings in which:

FIG. 1, comprising

FIG. 6, comprising

FIG. 18, comprising

FIG. 26, comprising

FIG. 27, comprising

FIG. 28, comprising

DESCRIPTION OF THE PREFERRED EMBODIMENT

Figure 1A:
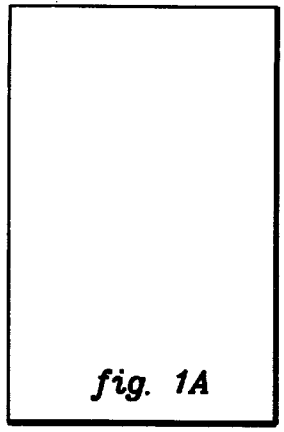
FIGS. 1A–1E depict, at various levels, a field programmable memory array of the present invention.

The description is arranged into the following sections:

Elements of the Field Programmable Memory Array
Memory Sub-arrays
Memory Cell
Transfer Cell
Bit Line Routing Matrix
Read Bit Line Switching Element
Write Bit Line Switching Element
Push/Pop Switching Matrix Elements
Programming Switching Matrix Elements
I/O Routing Matrix
I/O Block
Alternative Data Interfacing Configuration
Alternate Read Capture Latch Topology Providing Simplified Read Bit Line Interface
Address Units
Clock Units
State Machine Access Port
Asynchronous Read
Elements of the Field Programmable Memory Array With reference to FIG. 1A, a field programmable memory array (FPMA) 10 has a plurality of memory sub-arrays $12_1$, $12_2$, ... $12_z$. The memory sub-arrays are selectively programmed for implementing a variety of different memory configurations and operating modes, i.e, access techniques.

Various technologies are known to those skilled in the art for providing array programmability. Mask programming techniques include customizing the deposition of the final layers of the metallization of an otherwise generally designed integrated circuit (see, for example U.S. Pat. No. 3,993,919 to Cox et al. entitled "PROGRAMMABLE LATCH AND OTHER CIRCUITS FOR LOGIC ARRAYS," Nov. 23, 1976; and U.S. Pat. No. 4,742,383 to Fitzgerald entitled "MULTI-FUNCTION FET MASTER-SLICE CELL," May 3, 1988; both patents being assigned to the same assignee as the present application). Laser programming techniques involve customizing the metallization layers following their deposition (see, for example, Raffel et al., "A WAFER-SCALE DIGITAL INTEGRATOR USING RESTRUCTURABLE VSLI," IEEE Journal of Solid-State Circuits, Vol. SC-20, No. 1, February 1985, at pg. 399). Fusible links or antifuses can be employed and offer permanent (non-volatile) programming (see, for example, Millman, "MICROELECTRONICS," McGraw-Hill, Inc., 1979, at pg. 196; and U.S. Pat. No. 4,758,745 to Elgamal et al. entitled "USER PROGRAMMABLE INTEGRATED CIRCUIT INTERCONNECT ARCHITECTURE AND TEST METHOD," Jul. 19, 1988). Erasable Programmable Read Only Memory ("EPROM") and Electrically Erasable Programmable Read Only Memory ("EEPROM") devices can be used and offer semi-permanent programming. EPROMS and EEPROMS are both electrically programmable and hold their states, even if power is removed. Special erase procedures can be used, however, to reconfigure the devices (see, for example, Wood et al., "AN ELECTRICALLY ALTERABLE PLA FOR FAST TURN-AROUND TIME VLSI DEVELOPMENT HARDWARE," IEEE Journal of Solid-State Circuits, Vol. SC-16, No. 5, October 1981, at pg. 570). Finally, volatile random access memory ("RAM") devices are also available which are fully programmable and reprogrammable, but which lose their programmed state if power is removed (see, for example, U.S. Pat. No. 4,177,452 to Balasubramanian et al., entitled "ELECTRICALLY PROGRAMMABLE LOGIC ARRAY," Dec. 4, 1979, assigned to the same assignee as the present application). These and other techniques for programming arrays are know to those in the art and are also generally described in the publication entitled "FIELD-PROGRAMMABLE GATE ARRAYS" by S. Brown, R. Francis, J. Rose and Z. Vranesic, Kluwer Academic Publishers, 1992. Each of the above-named sources is hereby incorporated herein by reference in its entirety The preferred approach for programming or configuring programmable resources of the present invention involves SRAM memory cells, programmed by a user. The terms "configuration bits" or "configuration data" are used herein to refer to the underlying configuration information used to configure the numerous configurable resources disclosed. In the Figures, a circle with an X therethrough represents configuration information. The FPMA of the present invention is preferably configured in accordance with techniques similar to those used in configuring a known FPGA, as disclosed in the publication entitled "APPLICATION NOTE AT6000 SERIES CONFIGURATION", May 1993, Revision 1B, Atmel Corporation, which is hereby incorporated by reference in its entirety.

Each memory sub-array $12_1, 12_2 \ldots 12_z$, of FPMA 10, with reference to FIGS. 1A–1D, comprises a plurality of memory cells arranged in an array of M rows and N columns. Each memory sub-array provides M storage words with each word being N-bits wide. Data access to the FPMA is provided, in one operating mode, via primary I/O bus 26; and, in a second operating mode, via state machine access port 24. Configuration of FPMA 10 determines the data access path into and associated length/width of the memory cells thereof. Address bus 28 (hierarchical in design) propagates address data to address decoder units $20_1, 20_2, \ldots 20_z$ which address decoder units addressably select word rows of the memory sub-arrays for receiving/providing data.

Various bit line structures of the FPMA 10 propagate data toward the FPMA, or away from the FPMA. Read bit line structure 30 propagates data from given memory sub-arrays of the FPMA toward either primary I/O bus 26, or state machine access port 24, in accordance with the selected configuration of the FPMA. Write bit line structure 32 propagates data to select memory sub-arrays words of FPMA 10 in accordance with write addressing data and associated bit line configuration.

LIFO/FIFO data bit lines 34 provide data intercoupling between vertically adjacent memory sub-arrays. The LIFO/FIFO bit line structures propagate data in one of two directions in accordance with associated LIFO/FIFO control signals.

Programming (initialization) bit line structure 36 provides direct coupling from state machine port 24 into the FPMA for sending data, for example initialization data, into the FPMA as addressed via associated programming word line addressing.

Bit line routing matrix units $14_1, 14_2, \ldots 14_{z+1}$, wherein z is equal to the number of memory sub-arrays 12 of the FPMA 10, provide selective interfacing from select lines of the various data bit line structures toward secondary I/O bus 38. For example, in bit line routing matrix $14_{z+1}$, with reference to FIGS. 1A, 1B and 1C, select read bit lines of the read bit line structure 30 are routed to the I/O routing matrix $16_{z+1}$ via the intercoupling read data lines 40. Likewise, select lines of write bit line structure 32 are intercoupled to I/O routing matrix $16_{z+1}$ per the intercoupling write data lines 42. The intercoupling lines, 44 and 46, between bit line routing matrix $14_{z+1}$ and I/O routing matrix $16_{z+1}$ propagate select signals of associated LIFO/FIFO bit line structures 34. Each of the data line intercouplings 40,42,44,46 between bit line routing matrix $14_{z+1}$ and I/O routing matrix $16_{z+1}$ are N bits wide, wherein N represents the data word width of each memory sub-array.

Figure 1B:
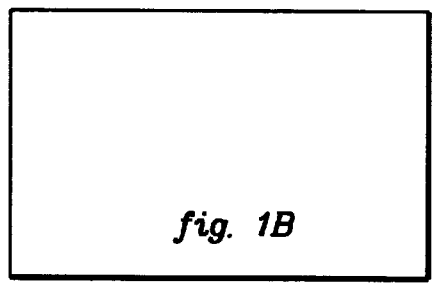
Figure 1C:
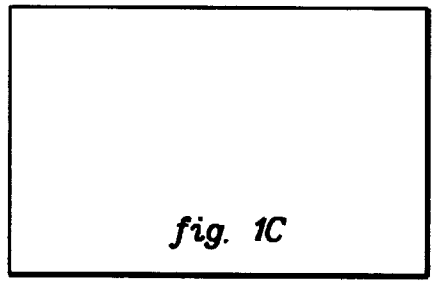
Figure 1D:
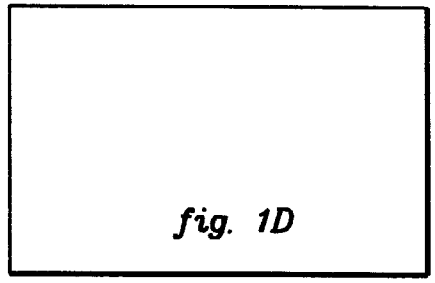
Figure 1E:
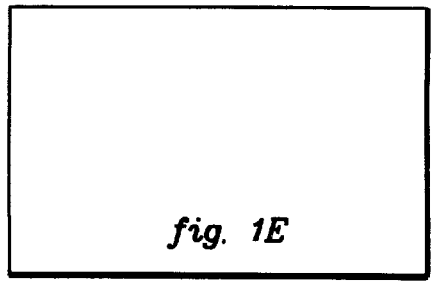
Figure 1A:
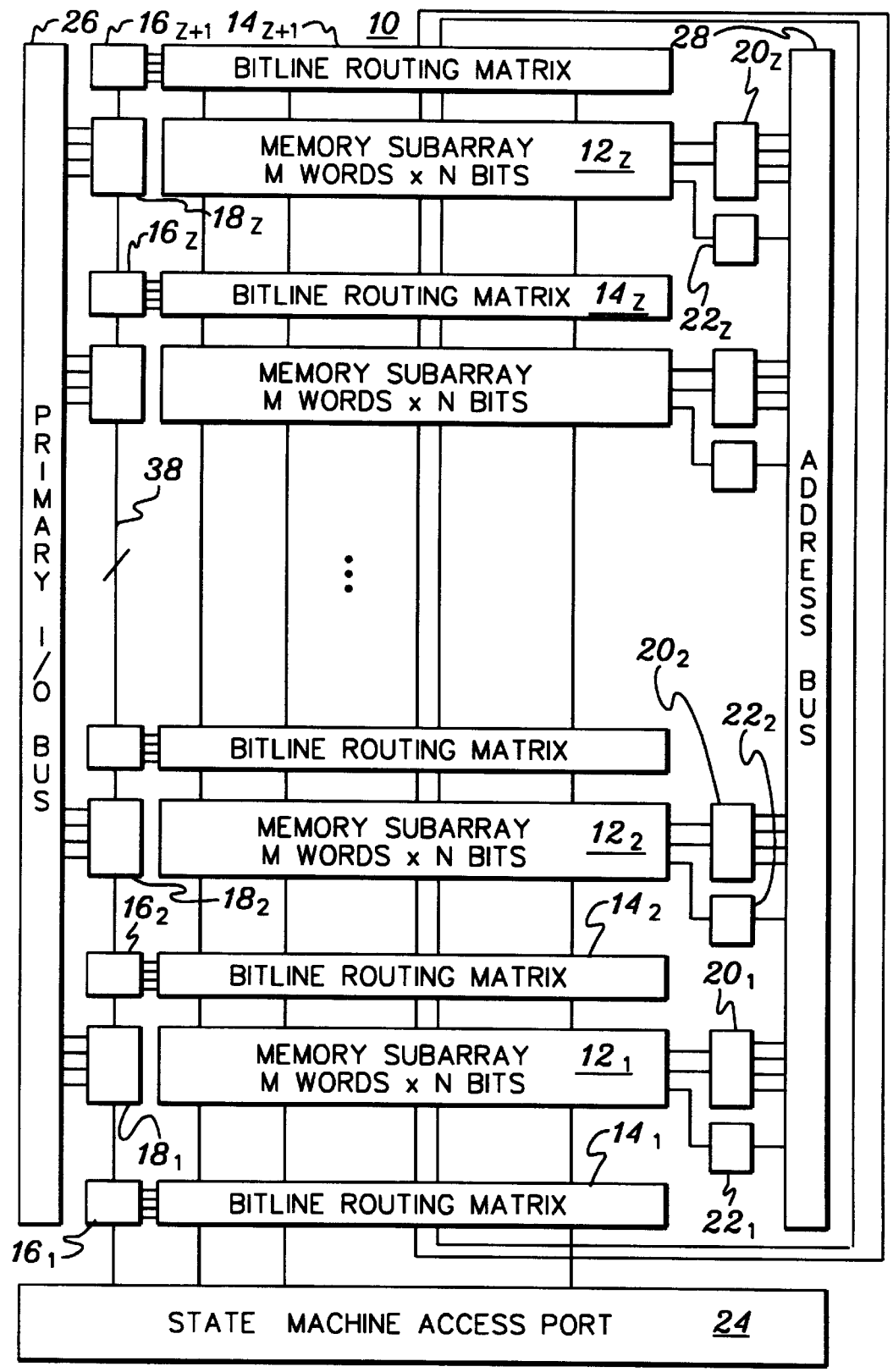
Figure 1B:
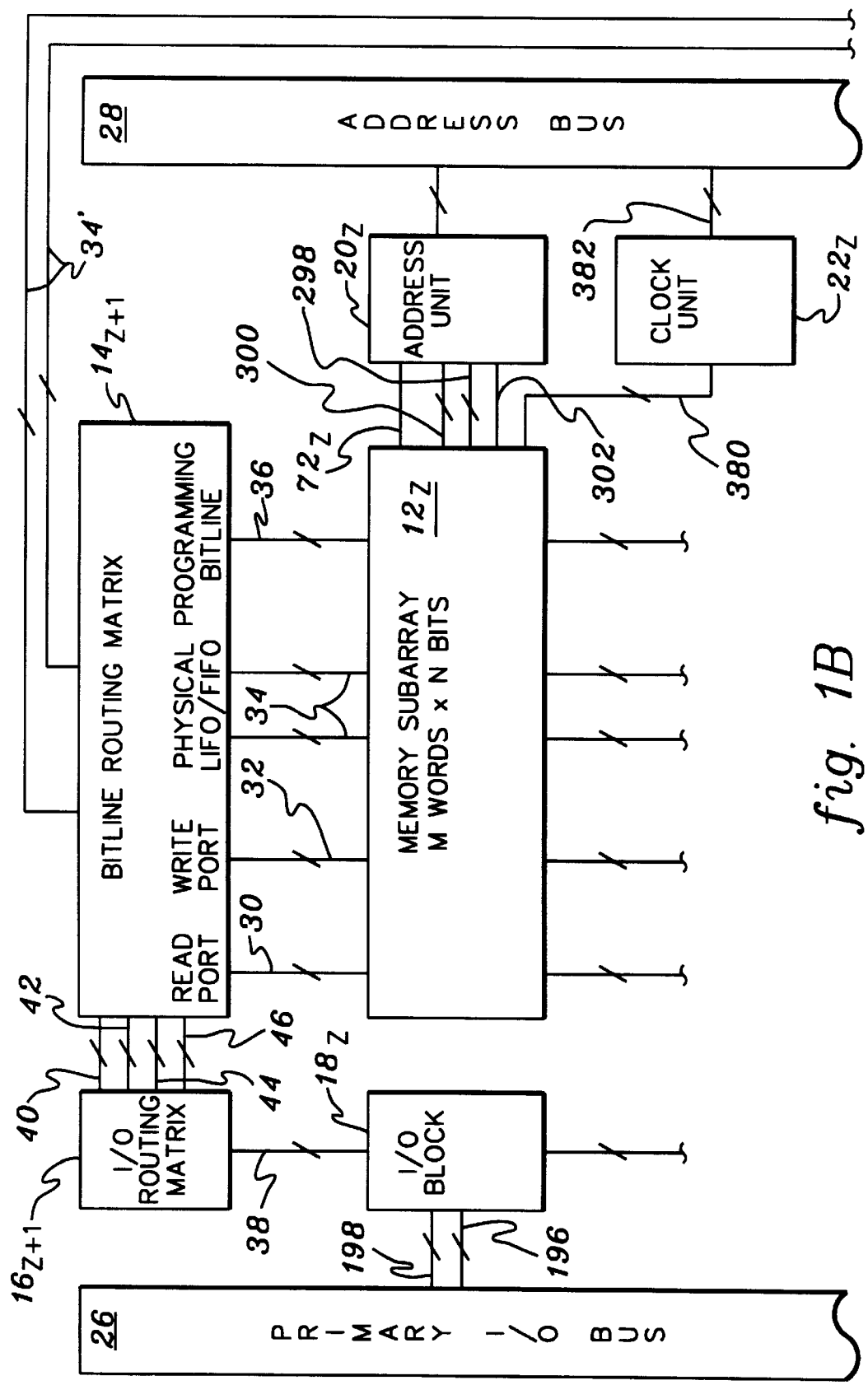
Figure 1C:
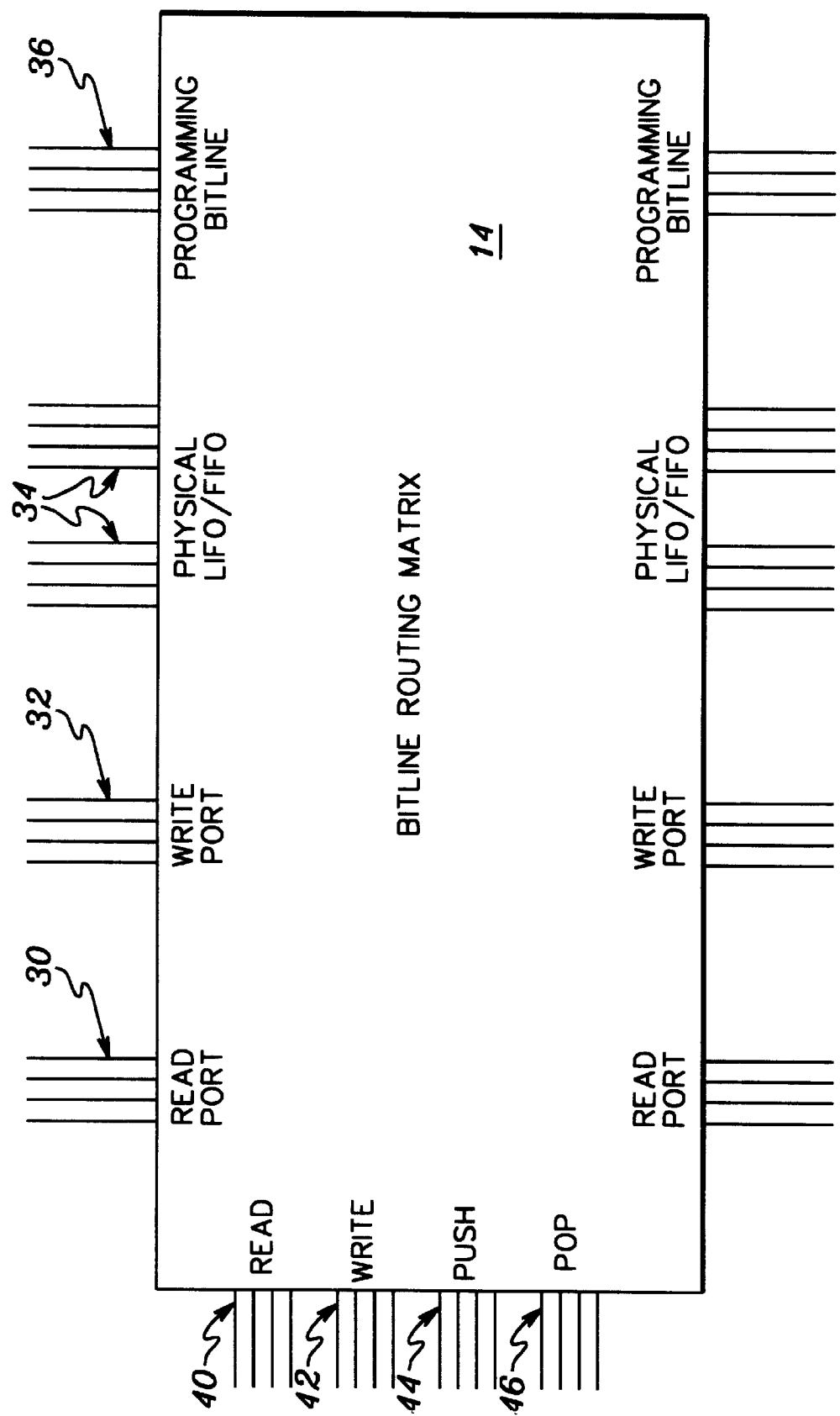
Figure 1D:
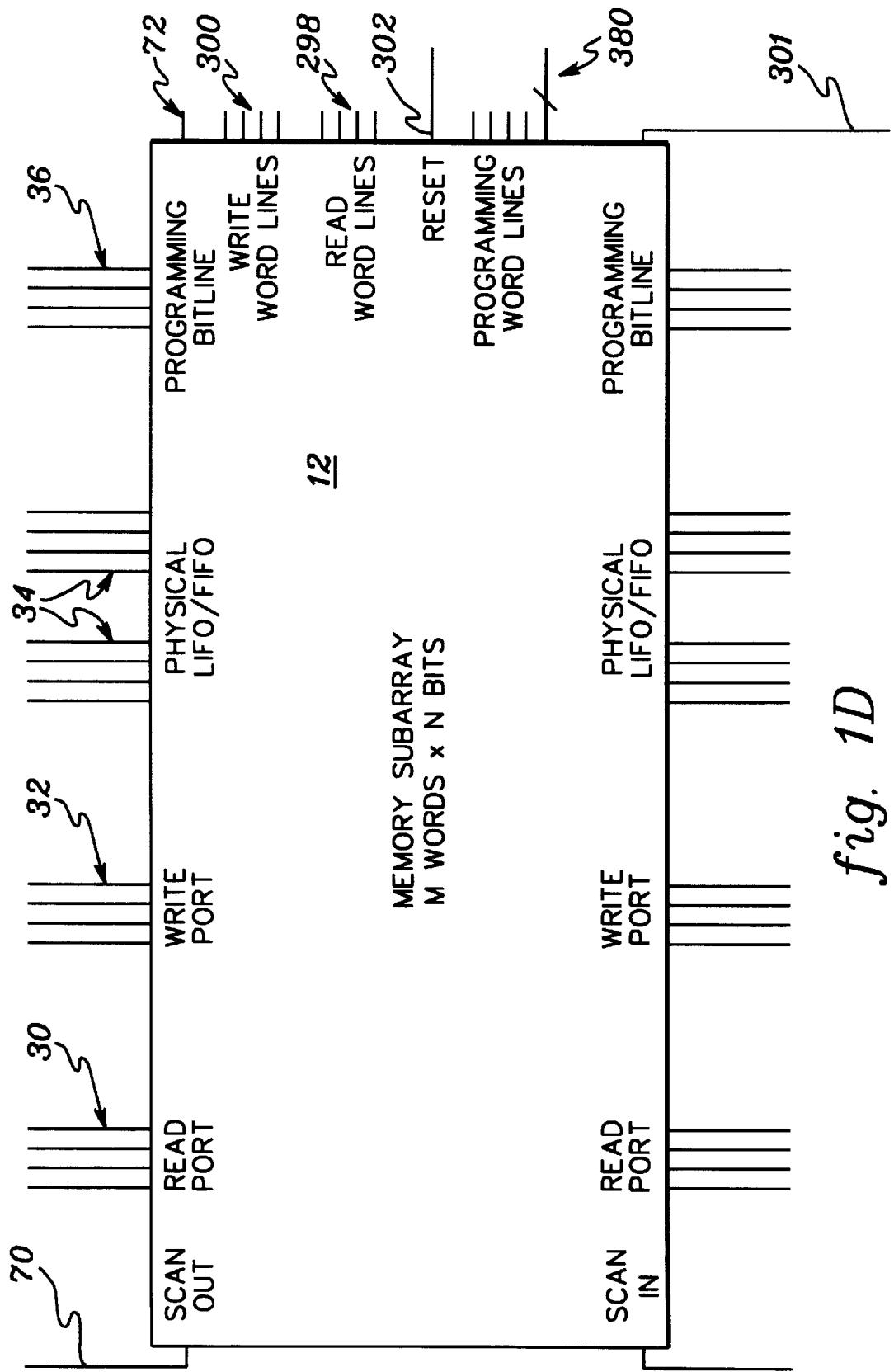
Figure 1E:
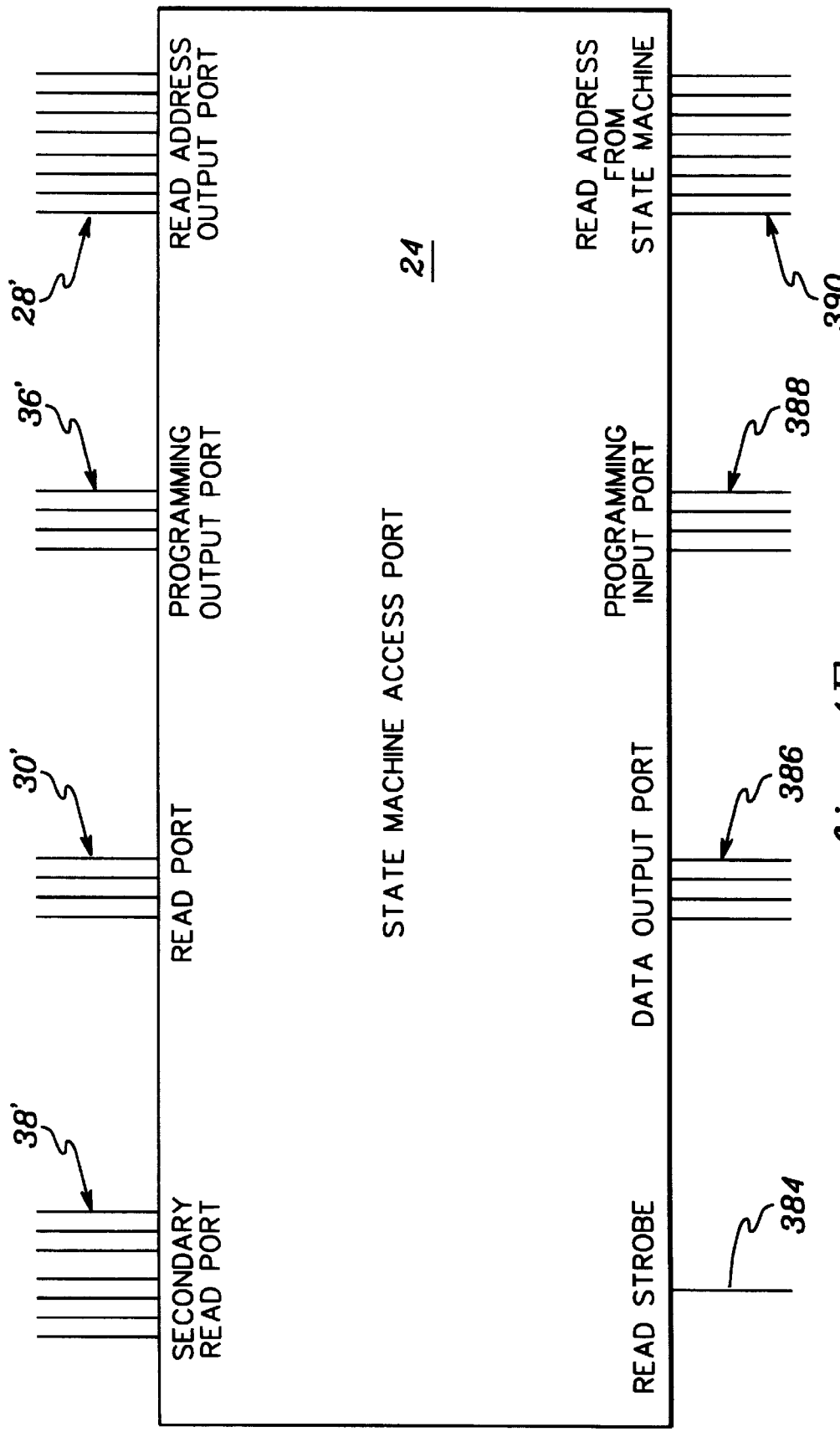

The bottom bit line routing matrix $14_1$, with reference to FIGS. 1A, 1C and 1E, also provides selective interfacing of read bit line structure 30 to the state machine access port 24 via read bit line intercoupling 30'. Secondary read port 38' provides an alternative read interface of the FPMA to state machine access port 24, by way of secondary I/O bus 38. Programming bit line intercoupling 36' provides programming data coupling from state machine access port 24 into the programming bit line structure 36 via bit line routing matrix $14_1$. The LIFO/FIFO wrap-around intercoupling data lines 34' (as shown in FIG. 1B) wrap from the bottom bit line routing matrix $14_1$ to the top bit line routing matrix $14_{z+1}$. The wrap around data lines 34 provide top to bottom or alternatively bottom to top, data flow between respective ends of the FPMA.

I/O routing matrix units, $16_1, 16_2 \ldots 16_{z+1}$, with reference to FIGS. 1A and 1B, are associated with respective bit line routing matrixes $14_1, 14_2, \ldots 14_{z+1}$, and provide selective intercoupling between associated intercoupling data lines 40,42,44,46 and select lines of secondary I/O bus 38. The I/O routing matrices also include features for implementing a segmented hierarchy structure for the secondary I/O bus 38, which hierarchy structure will be described more fully hereinafter. I/O blocks $18_1, 18_2, \ldots 18_z$ provide selective intercoupling between primary I/O bus 26 and secondary I/O bus 38. The I/O blocks may also include selective polarity inversion for certain intercoupling embodiments.

Primary I/O bus 26 serves as the primary interface to the memory cells of the FPMA. In an exemplary application, the FPMA is configured together with another programmable array, such as, for example, a field programmable gate array, wherein the primary I/O bus is part of an overall interface to the field programmable gate array.

Clock units $22_1, 22_2 \ldots 22_z$, are associated with respective memory sub-arrays $12_1, 12_2 \ldots 12_z$, and control various memory functionalities thereof. The clock units are programmable for providing transfer control signals for transferring data in accordance with various memory functionalities selected, e.g. read, write, pop, push, clear etc.

Address bus 28 (FIGS. 1A and 1B) routes address data to the various address units $20_1, 20_2 \ldots 20_z$ and sends appropriate control data to the associated clock units $22_1, 22_2 \ldots 22_z$. Selective lines of the address bus are routed to the address units and clock units in accordance with associated configuration data thereof. Address bus 28 can be hierarchical in design, as discussed farther below.

In the aforementioned exemplary application, wherein FPMA 10 is incorporated together with a field programmable gate array (FPGA), state machine access port 24 (FIGS. 1A and 1E) provides a direct data interface between a state machine associated with configuration logic of the FPGA (not shown) and the memory cells of the FPMA. U.S. Pat. No. 5,298,805 issued to Garverick et al. on Mar. 29, 1995, entitled "VERSATILE AND EFFICIENT CELL-TO-LOCAL BUS INTERFACE IN A CONFIGURABLE LOGIC ARRAY", hereby incorporated by reference in its entirety, provides disclosure of such a FPGA and associated configuration logic. The state machine access port 24 has a read address port 390 for receiving address data from the state machine. Programming bit line port 388 receives programming data from the state machine, while data port 386 sends out data as retrieved from the FPMA to the state machine. Strobe port 384 is coupled for receiving a read strobe from the state machine, which strobe is associated with effecting a read operation of the FPMA. Address information is directed from the state machine onto select address lines of address bus 28 by way of address intercoupling 28', as selected in accordance with the programmed configuration of state machine access port 24. Programming (initialization) data, as received at programming bit line port 388, is selectively coupled to programming bit line structure 36 of the FPMA 10, via intercoupling 36' and bit line routing matrix $14_1$, in accordance with the associated configuration states of state machine access port 24 and bit line routing matrix $14_1$. Data as read from FPMA 10 can be sent to the state machine by two different alternative paths, via read bit line intercoupling 30' or alternatively by way of secondary I/O bus 38 and secondary read port intercoupling 38', in accordance with the programmed configuration of the state machine access port 24. Accordingly, the state machine access port 24 can provide on board "cache" operation for down-loading new configuration data into configuration memory of an associated FPGA directly from the cells of the associated FPMA.

As discussed hereinafter, an embodiment of the FPMA is discussed, and depicted in the figures, which contains what is referred to herein as "physical" LIFO/FIFO capability, and "physical" scan in/out capabilities. These capabilities involve the inclusion in the array of L1/L2 latches (master/slave) and transfer cells between memory cells. The preferred embodiment of the invention does not include such master/slave latches and transfer cells. The LIFO/FIFO capability is provided "logically" without the transfer cells, in the preferred embodiment. The exclusion of these and related circuits from the preferred embodiment is discussed below where applicable For example, it is noted that the LIFO/FIFO wrap-around bit line structures 34' are optional structures for interfacing between the first bit line routing matrix $14_1$ and the last bit line routing matrix $14_{z+1}$. In certain embodiments of the present invention, the LIFO/FIFO wrap-around bit line structures 34' are not included nor is bit line routing matrix $14_{z+1}$.

The disclosure hereinafter provides more detailed descriptions of the various elements of the FPMA.

The FPMA disclosed herein not only provides capability for a single wide, deep, or in-between logical ram within the FPMA at any one time, but can provide multiple logical arrays of the same or different modes simultaneously to the limits of the FPMA's logical capability. If the FPMA contained 8 sub-arrays of M words by N bits, we would expect the FPMA to be capable of implementing 8 logical memories, each of which were M words × N bits or alternatively, any combination of arrays each of which are a multiple of M words and a multiple of N bits which together use a number of sub-arrays and clock unit resources not to exceed those present within the FPMA. We would also allow each array to have different mode (1 port RAM, 2 port RAM, ROM, FIFO, LIFO, etc.) to the capability limit of FPMA. In one physical design, 8 sub-arrays, but only 2 clock units are provided (limiting the number of simultaneous LIFOs and/or FIFOs to 2).

Memory Sub-arrays

Figure 2A:
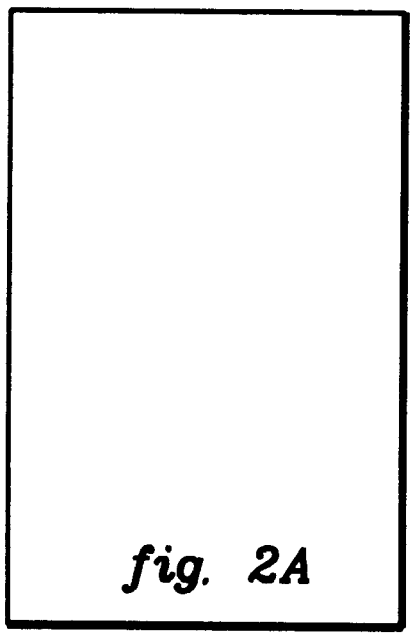
FIG. 2, comprising FIGS. 2A–2B provide a partial schematic diagram of a memory sub-array.
Figure 2B:
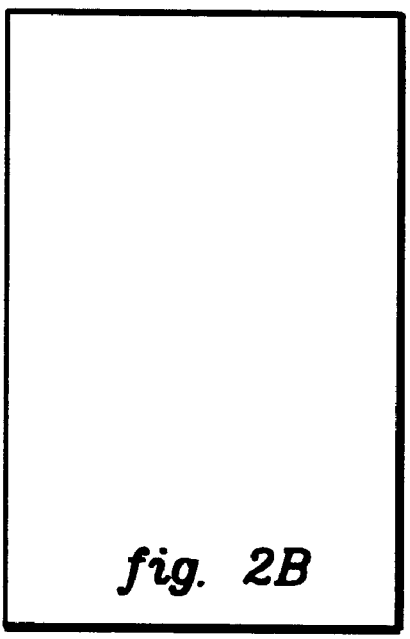
Figure 2A:
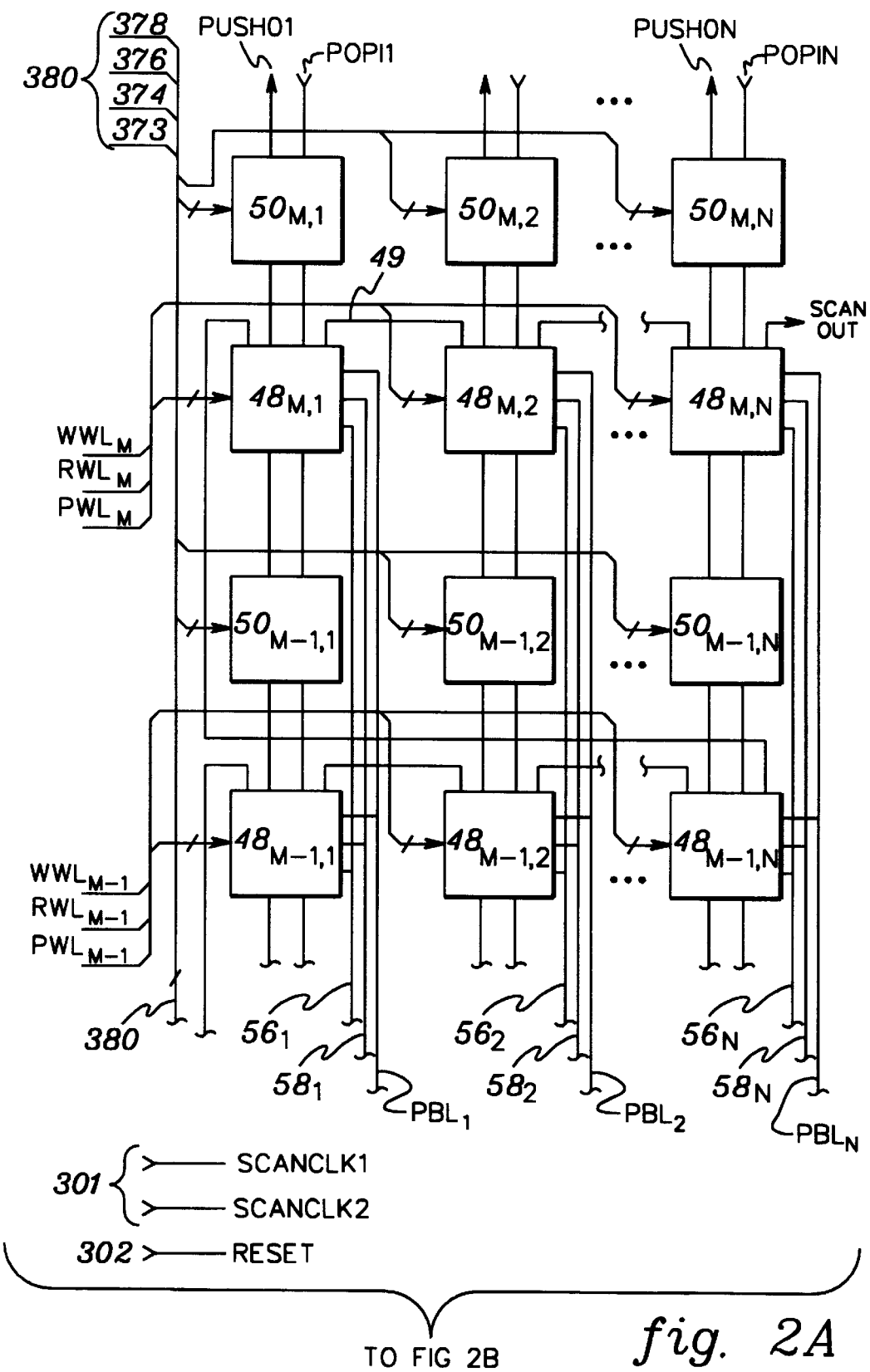
Figure 2B:
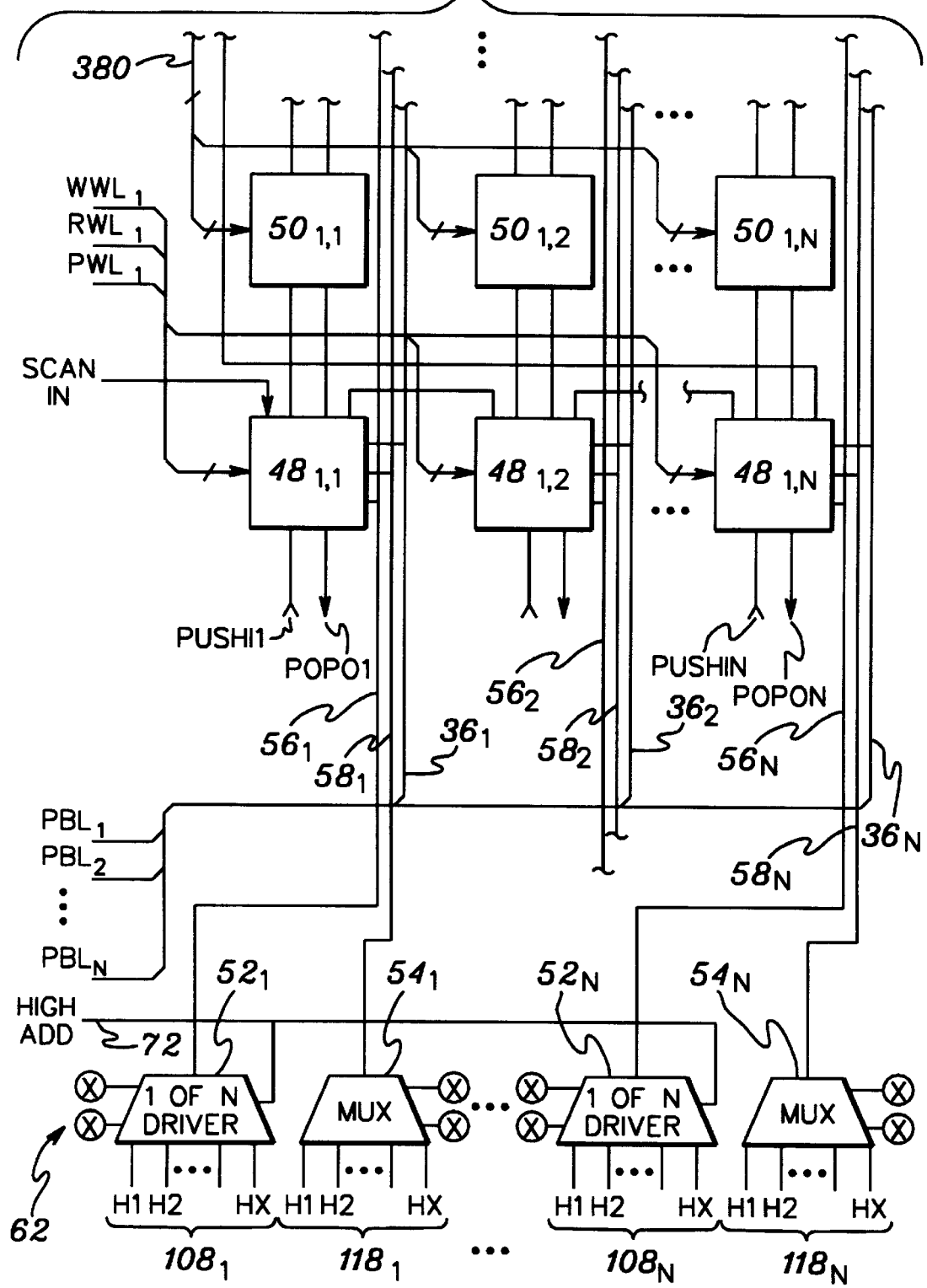

With reference to FIGS. 2A and 2B, each memory sub-array 12 comprises a plurality of memory cells 48 arranged in an array of M rows and N columns. The M rows provide M storage words for the memory sub-array. The storage words are each N bits wide, corresponding to the number of columns within the memory sub-array. Each row of memory cells 48 may have an associated row of transfer cells 50 for enabling movement of data vertically from word to word. For example, memory cell $48_{1,1}$, of the first row and first column, would have an associated transfer cell $50_{1,1}$ that enables shifting of data to, or from, memory cell $48_{2,1}$ of the second row and first column. In particular embodiments of the present invention, there is no need to provide physical movement of data from word to word, and, accordingly, the transfer cells 50 are not provided vertically therebetween.

A number of different techniques are available for accessing memory cells of FPMA 10 per a variety of data transfer operations including: read, write, push, pop, serial scan, and programming (initialization). Regarding the read and write operations of memory sub-array 12, each row of memory cells 48 within the memory sub-array 12 has an associated read word line, $RWL_1, RWL_2 \ldots RWL_M$ respectively, addressable for selecting the associated row of memory cells as the row from which to read data. When a given row word line is selected, data of the selected row memory cells is output onto associated internal column read bit lines, $56_1, 56_2 \ldots 56_N$. Each memory cell of a given column has a gated output coupled to its associated internal read bit line 56, the gated outputs being enabled per corresponding read word lines. For example, the read bit line of the first column, $56_1$ is coupled to a gated output of each memory cell of the first column, $48_{1,1}, 48_{2,1} \ldots 48_{N,1}$.

Each internal read bit line, $56_1, 56_2, \ldots 56_N$, is coupled to an input of an associated selective tri-state driver, $52_1, 52_2, \ldots 52_N$ respectively. The selective tri-state driver propagates data of respective internal read bit lines 56 to select bit lines of an associated read bit line hierarchy structure 108 (of the respective read bit line structure 30). For example, selective tri-state driver $52_1$ receives data at its input from internal read bit line $56_1$. Selective tri-state driver $52_1$, a 1-of-n selective driver (note, this "n" is not to be associated with the width "N" of the memory array), drives a select output of its plurality of outputs $108_1$, in accordance with associated configuration data 62. The configuration data for programming the tri-state driver $52_1$ is provided by, for example an SRAM (not shown), as described hereinbefore with regard to programming of programmable resources. Accordingly, selective tri-state driver $52_1$ forwards data of internal read bit line $56_1$ to one bit line of the hierarchy structure $108_1$, in accordance with its associated configuration data 62 when appropriately enabled as described below.

Each selective tri-state driver, $52_1, 52_2 \ldots 52_N$, has an enable input driven by a high address enable signal as received at high address input 72. When the high address enable signal disables the tri-state drivers, then all of the outputs of the drivers provide a high output impedance, in a tri-state condition. Alternatively, when the high address enable signal enables the selective tri-state drivers, the drivers propagate data to select lines of hierarchy structure 108 in accordance with associated configurations. With reference to FIGS. 1A and 1B, the high address inputs of memory sub-arrays $12_1, 12_2, \ldots 12_M$ are coupled to associated address units $20_1, 20_2 \ldots 20_M$ via respective interconnects $72_1, 72_1 \ldots 72_Z$. Accordingly, FPMA 10, per appropriate addressing data, can select which memory sub-arrays 12 will propagate data onto associated read bit line hierarchy structures 108. Alternate embodiments of read circuitry 52 are discussed below.

The circuitry associated with writing data into memory sub-array 12 is similar to the read circuitry as described above. Each column of memory cells has an associated internal write bit line, $58_1, 58_2 \ldots 58_n$. Each internal write bit line is coupled to gated inputs of the respective memory cells of its associated column. For example, internal write bit line $58_1$ of the first column is coupled to the gated inputs of the respective memory cells, $48_{1,1}, 48_{2,1} \ldots 48_{M,1}$. When data is written into memory sub-array 12, it is transferred into a given word thereof in accordance with the addressably selected word line of $WWL_1, WWL_2, \ldots WWL_M$. For example, assuming field programmable memory array 10 receives an address for driving the second row word line $WWL_2$, the second row of memory cells is accordingly selected to receive data of the associated write bit lines $58_1, 58_2 \ldots 58_N$. Each bit line 58 is driven from an associated hierarchy structure 118 using multiplexers 54.

An alternative memory load operation includes programming. The term "programming" is used herein to refer to both an "initialization" of the memory cells 48 of the array, and when referring to configuring the configuration bits of the FPGA/FPMA. Those skilled in the art will recognize from the current context how the term "programming" is employed. Select rows of a given memory sub-array 12 are loaded with program data of associated program bit lines 36, i.e. $PBL_1, PBL_2 \ldots PBL_N$. The select row of memory cells is selected per associated program word lines, $PWL_1, PWL_2 \ldots PWL_N$. Referring to FIG. 1, a state machine (not shown), for example, of an FPGA, sends programming (initialization) data to the FPMA via state machine access port 24 and programming bit lines 36, i.e.

$PBL_1, PBL_2 \ldots PBL_N$, which data path provides a more direct route for writing program data into the FPMA.

To enable LIFO, FIFO or data rollover functionality within the FPMA, a memory stack is configured within the FPMA and vertical shifting of data provided onto, within, or off the stack. As will be developed in greater detail hereinafter, two types of LIFO/FIFO operation are disclosed: Physical and Logical. In physical LIFO/FIFO operation, data is actually transferred vertically within an associated memory stack. In logical LIFO/FIFO operation, data of respective memory cells remains fixed, and address pointers/counters are employed for keeping track of write and read memory locations for implementing effective PUSH/POP stack functionality. Continuing with the description of the physical LIFO/FIFO embodiment, push inputs PUSHI1, PUSHI2 . . . PUSHIN are coupled to the bottom memory cell of each respective column of memory sub-array 12. For example, memory cell $48_{1,1}$ is tied to a push input of column 1 (PUSHI1) for receiving a given data bit to be pushed onto the associated stack. If the associated memory sub-array 12 is within (i.e., an intermediate sub-array) of a configured FIFO/LIFO stack, then it receives push data from an adjacent memory sub-array (via its associated bit line routing matrix). Alternatively, if the given memory sub-array is the first memory sub-array of the configured stack, then it receives push data from either the top of the configured stack, via associated wraparound intercoupling 34', or alternatively from an external source via primary I/O bus 26.

As data is pushed into a given memory sub-array, overflow data is shifted out of the memory sub-array by transfer cells $50_{M,1}, 50_{M,2} \ldots 50_{M,N}$, and onto associated push outputs PUSHO1, PUSHO2 . . . PUSHON. If the given memory sub-array is within (intermediate) the configured stack of the FPMA 10, then the overflow data as pushed out of the given memory sub-array is propagated to the next adjacent memory sub-array within the configured stack, via an intermediate routing bit line matrix 14. Alternatively, if the memory sub-array is at the top of the configured stack, then the overflow data is propagated either to the bottom memory sub-array via wrap-around interconnects 34', per roll-over functionality, or out of the stack per FIFO functionality.

Shifting data down the vertical stack of the FPMA is similar to pushing data up the vertical stack, except that the memory sub-arrays 12 receive data at the tops of the various columns via associated pop inputs, POPI1, POPI2 . . . POPIN. In further propagating data down the stack, overflow data leaves the bottom of a given memory sub-array via associated pop outputs, POPO1, POPO2 . . . POPON of the respective columns. The pop outputs are coupled to associated pop inputs of adjacent memory sub-arrays within an appropriately configured stack via intermediate routing bit line matrices. For the bottom memory sub-array, data popped out of the configured memory stack is passed to the top of the stack via associated wrap-around intercoupling 34' per roll-over functionality, or alternatively onto the primary I/O bus 26. In facilitating movement of data vertically within the various columns of the memory sub-arrays 12, each transfer cell 50 receives first and second phase pop clocks, POPCLK1, POPCLK2, at inputs 373,374 respectively, and first and second phase push clocks, PUSCLK1, PUSCLK2, at inputs 376,378 respectively (together referred to as clocks 380 in FIGS. 2A and 1D). As mentioned hereinbefore, in one embodiment of the present invention, transfer of data vertically within the FPMA memory stack is not provided; accordingly, the various push/pop interconnects, transfer cells, and associated push/pop clocks are not required.

Another method (per a particular alternate embodiment of the present invention) of transferring data within memory sub-arrays 12 includes shifting of data serially through a chain of serially connected memory cells 48. The memory cell of the first row and first column, $48_{1,1}$, has a serial input providing scan input, SCANIN, for the associated memory sub-array 12. The memory cell associated with the last row M and last column N, $48_{M,N}$, has a serial output providing a scan output, SCANOUT, for memory sub-array 12. Intermediate serial data links are provided between the remaining serially connected memory cells, wherein serial outputs are coupled to respective serial inputs of adjacent down stream memory cells. For example, memory cell $48_{1,1}$ has its serial output coupled to the serial input of memory cell $48_{1,2}$, and likewise memory cell $48_{1,N}$ has its serial output coupled to the serial input of memory cell $48_{2,1}$. In this particular illustrated embodiment of the present invention, the memory cells are coupled serially within each row, with a last memory cell of one row coupled to a first memory cell of an adjacent row. Alternatively, the memory cells could be coupled serially via respective columns. In continuing the serial string of memory cells within the FPMA, with reference to FIGS. 1A and 1D, the scan output SCANOUT and scan input SCANIN of adjacent memory sub-arrays are intercoupled to provide a single, continuous, serial scan chain within the overall FPMA. For example, memory sub-array $12_1$ has its scan output coupled to the scan input of memory sub-array $12_2$, via serial interconnect 70. Serial scan shifting of data is provided by appropriate clock pulse sequencing of first and second phase scan clocks SCANCLK1, SCANCLK2, respectively as received at input 301. These clocks are coupled (not shown) for driving each of the memory cells. Again, the scan chain implementation is merely an alternate, optional embodiment of the FPMA disclosed herein.

Returning to FIG. 2A, each memory sub-array 12 also has a reset input 302 for receiving a reset signal RESET. The reset input is coupled (not shown) to a reset of each memory cell within the sub-array for enabling a reset of all memory cells per an appropriate pulse of the reset signal.

A more detailed description of the memory cells and optional transfer cells follows hereinbelow.

Memory Cell

Figure 3:
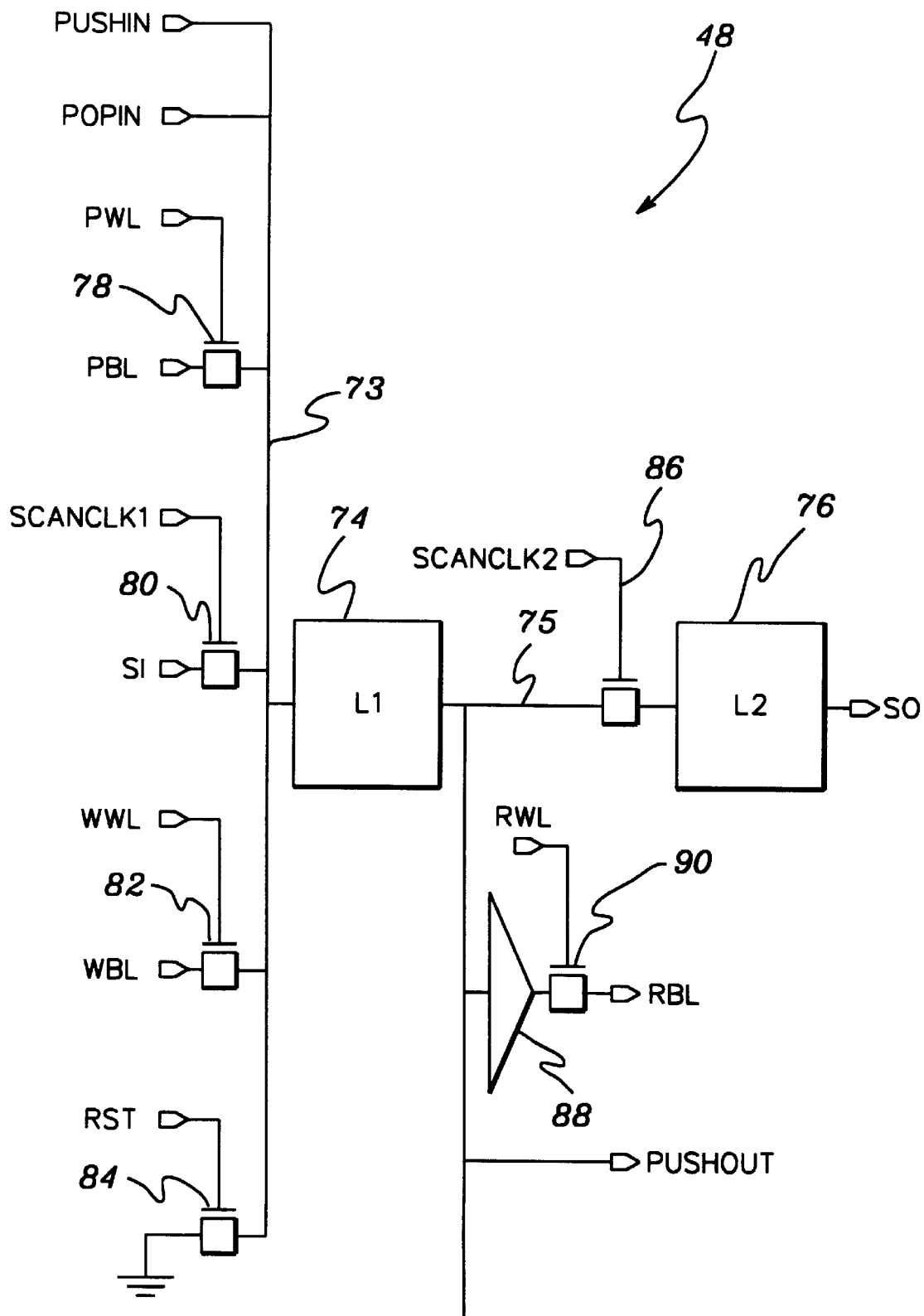
FIG. 3 is a schematic diagram of a memory cell.

With reference to FIG. 3, exemplary memory cell 48 is depicted. (Another embodiment of cell 48 is disclosed in the incorporated Application entitled "A SYSTEM FOR IMPLEMENTING WRITE, INITIALIZATION, AND RESET IN A MEMORY ARRAY USING A SINGLE CELL WRITE PORT.") Cell 48 has a primary latch 74 for retaining data therein. Primary latch 74 comprises, for example, two appropriately cross-coupled inverting elements providing a static memory unit. Primary latch 74 has a weak side, 73, and a strong side 75. When the weak side 73 of a first latch 74 is driven by a strong side 75 of a second similar latch, the first latch will have its weak side aligned to correspond to the strong side of the second latch. Hereinafter, the weak side will be referred to as the input, and the strong side as the output. (Other memory cell configurations may be provided without departing from the scope of the present invention, including RAM, DRAM, PROM, etc.)

The input 73 (weak side) of primary latch 74 is tied to a variety of gated inputs for receiving data selectively from respective sources. For physical LIFO/FIFO embodiments of the present invention wherein data shifts are provided vertically from word-to-word within the field programmable memory array, a push input and pop input, PUSHIN and POPIN respectively, are coupled to input 73 of primary latch 74. These push and pop inputs are driven by associated lower and upper transfer cells 50 respectively (which transfer cells include gated outputs that are selectively enabled by appropriate push/pop clocking as will be described more fully hereinafter). For example, the push input PUSHIN of memory cell 48 receives push data from a strong sided push output of a transfer cell located in the same column therebelow. On the other hand, pop input POPIN of memory cell 48 is driven by the pop output from a strong side of transfer cell located in the same column thereabove.

Output 75 from the strong side of primary latch 74 provides direct push and pop outputs. PUSHOUT and POPOUT respectively, for driving respective upper and lower transfer cells of the same column. The push output of memory cell 48 drives the weak side of an adjacent transfer cell up the stack; whereas, the pop output of memory cell 48 drives the weak side of an adjacent transfer cell down the stack. Again, as noted hereinbefore, in a particular embodiment of the present invention, wherein vertical shifting of data is not provided within the memory array, the push/pop inputs and push/pop outputs are not provided for memory cell 48.

MOSFET 78 serves as a passgate between input 73 of primary latch 74 and a program bit line PBL of programming bit lines 36 (FIG. 1B). MOSFET 78 selectively intercouples the programming bit line PBL to input 73 for loading programming data into latch 74, when enabled at its gate via programming word line PWL. (Again, in this context, programming is referring to as initialization of cells 48, rather than configuration of FPMA 10.)

MOSFET 80 is coupled at a pass gate between series input SI and input 73 of primary latch 74. The gate of MOSFET 80 is driven by a first phase scan clock SCANCLK1 that selectively enables MOSFET 80 for coupling the scan input SI to input 73, and propagating serial data into primary latch 74.

Continuing with the elements associated with optional serial scan operation, the channel of MOSFET 86 is coupled between output 75 of primary latch 74 and a weak sided input of secondary latch 76. (The term "latch," as used herein, generally broadly denotes a circuit having, a data storage capability.) The gate of MOSFET 86 is driven by second phase scan clock SCANCLK2 for selectively propagating data between primary latch 74 and secondary latch 76. The output of secondary latch 76 provides the serial output SO of memory cell 48, which drives the serial input of the next memory cell within the associated serial chain. For example, a first memory cell, $48_{1,1}$, with reference to FIG. 2A, receives serial input data at its serial input SI. A first phase scan clock provides a pulse for transferring the serial input data into primary latch 74 thereof. At the same time, the pulse of the first phase scan clock also enables subsequent memory cells within the serial scan chain e.g. $48_{1,2}$ a to latch serial input data as received from the serial output SO of associated preceding memory cells, e.g. $48_{1,1}$. Subsequently, a second phase scan clock provides a pulse for enabling data transfer from the respective primary latches 74 of the memory cells to associated secondary latches 76. In this fashion, data moves serially through the serially connected scan chain of memory cells 48.

MOSFET 82 provides selective coupling between write bit line WBL and input 73 of primary latch 74. The gate is coupled to the write word line WWL for receiving a write enable signal. When enabled, MOSFET 82 intercouples the write bit line WBL to input 73 for writing data into primary latch 74. As described hereinbefore with reference to FIGS. 2A and 2B, write bit line WBL of memory cell 48 is tied to its associated internal column write bit line 58, while the write word line WWL is addressably driven by an associated address unit 20. Data of internal write bit line 58 is transferred into primary latch 74 via MOSFET 82 when the associated write word line WWL is addressably selected per its associated address unit 20 (FIGS. 1A, 1B and 1D).

MOSFET 84 has its channel coupled serially between ground and input 73 of primary latch 74. The gate of MOSFET 84 is driven by a reset signal RST which selectively couples input 73 to ground. During this reset condition, the data of primary latch 74 is cleared. Alternatively, although not shown, MOSFET 84 selectively couples input 73 to a positive supply 73 for setting primary latch 74 to an opposite state during a reset condition.

Buffer 88 (possibly an inverter) has its input coupled to output 75 of primary latch 74 and drives selectively gated MOSFET 90. MOSFET 90 has its channel disposed between the output of buffer 88 and an internal read bit line RBL of its associated column, e.g. internal read bit line $56_1$, of FIGS. 2A and 2B, the gate of MOSFET 90 is coupled to read word line RWL for receiving a read enable signal for selectively coupling the output of buffer 88 to read bit line RBL, for propagating data from memory cell 48 onto its associated internal read bit line 56. With reference to FIGS. 1A, 1B, 1D, 2A, 2B and 3, an associated address unit 20 receives a read address from address bus 28 for addressably selecting a given read word line RWL of read word lines 298. All passgates, MOSFETs 90, of an associated row memory cells 48 are enabled together for propagating data thereof onto respective internal read bit lines 56.

Accordingly, memory cell 48 has a plurality of input ports, i.e. PUSHIN, POPIN, PBL, SI, WBL and RST, from which to receive data for updating primary latch 74. Likewise, memory cell 48 has a plurality of output ports, i.e. SO, RBL, PUSHOUT, and POPOUT, for sending out data as stored therein. (The above incorporated Application entitled "A SYSTEM FOR IMPLEMENTING WRITE, INITIALIZATION, AND RESET IN A MEMORY ARRAY USING A SINGLE CELL WRITE PORT" discloses a single write port cell with selection circuitry to maintain many of these functions using only a single write port.)

Figure 4:
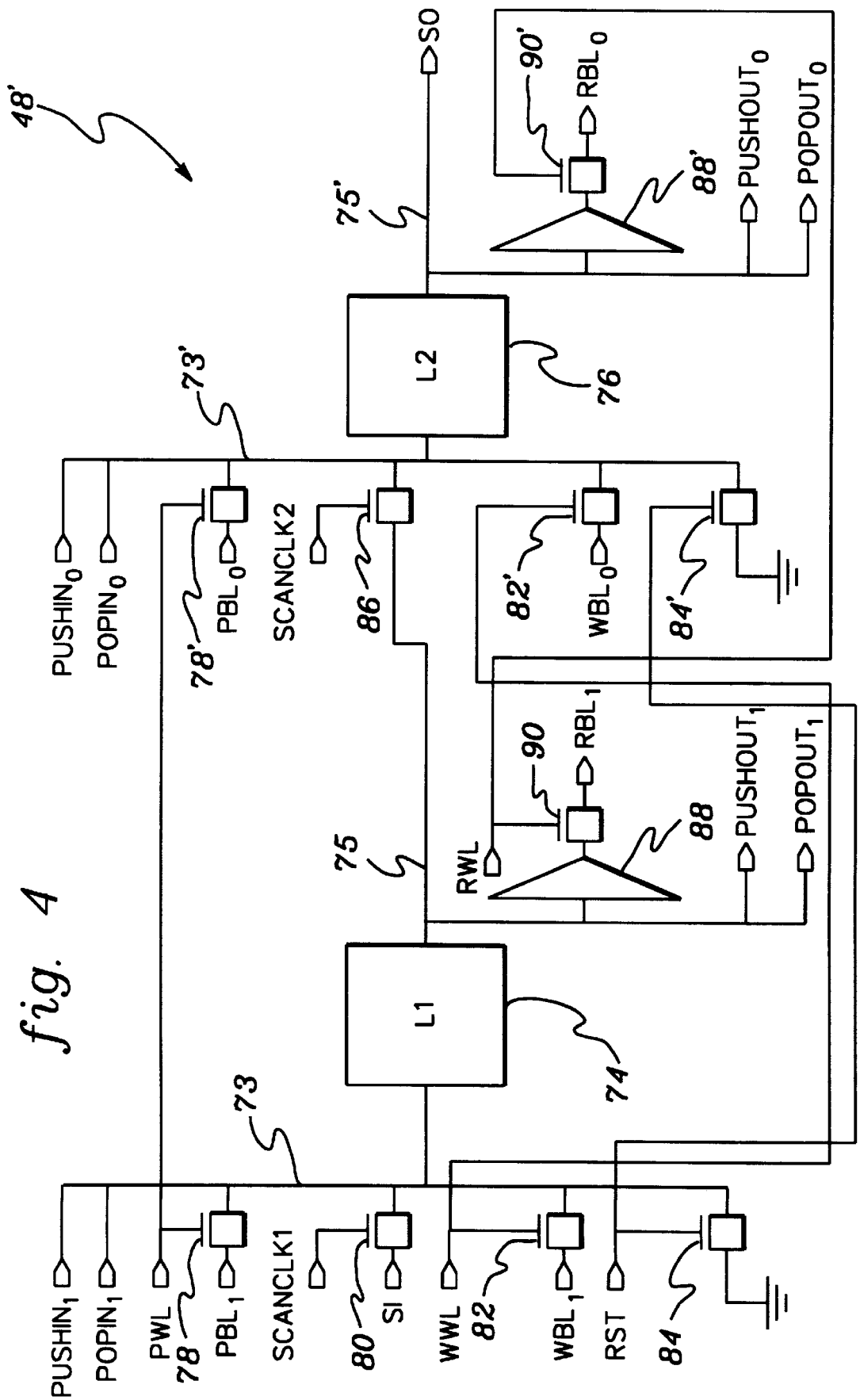
FIG. 4 is a schematic diagram of an alternative memory cell.

In the memory cell embodiment described above, secondary latch 76 was associated solely with LSSD serial scan operation. In an alternative configuration, with reference to FIG. 4, memory cell 48' permits storage of two data bits therein for providing an improved memory density. However, this alternative memory cell configuration 48' compromises serial scan functionality. Because of the dual phase clocking requirements associated with serial scan operation, only one data bit per memory cell 48' can be associated with the serial scan functionality.

In this alternative memory cell configuration, secondary latch 76 includes secondary push, pop, program, write, reset inputs that are selectively coupled to input 73' of secondary latch 76 in accordance with associated push, pop, program, write and reset enable signals. Note, that the push/pop enable signals (not shown in FIG. 4) are actually present in respective adjacent transfer cells. The output 75' of secondary latch 76 similarly drives secondary read, push and pop outputs per common respective read, push/pop enable output signals. Accordingly, the alternatively configured memory cell 48' operates the same as described before during serial scan operation, but provides additional storage density for the other memory functionalities.

Transfer Cell

Figure 5:
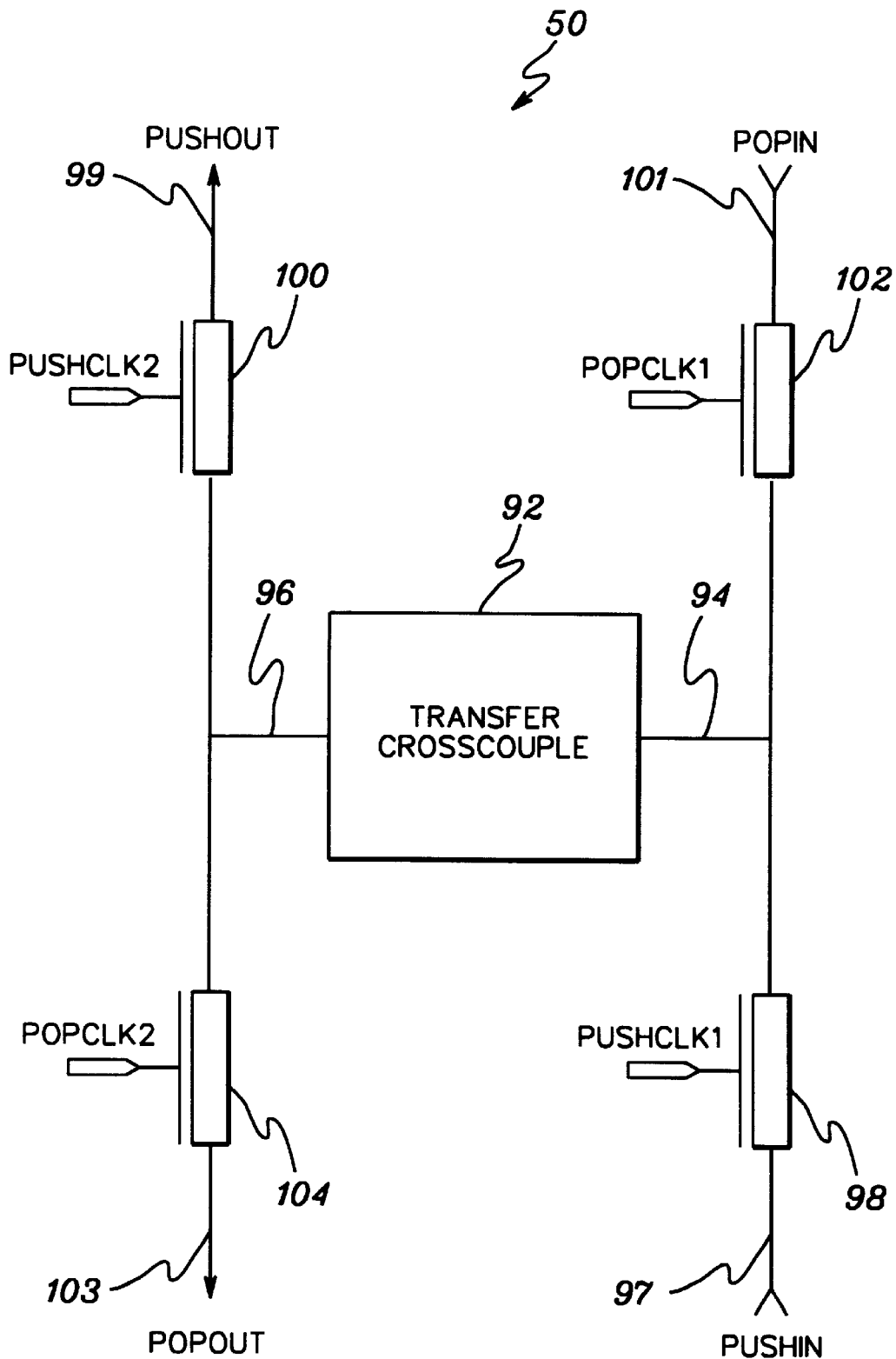
FIG. 5 is a schematic diagram of a transfer cell.

As discussed hereinbefore with reference to FIGS. 2A and 2B, transfer cells 50 shift data vertically up, or down, respective columns of memory cells. With reference to FIG. 5, transfer cell 50 includes a transfer latch 92 which has a strong sided output 96 and weak sided input 94. When the weak sided input 94 receives data from a strong output source, for example, output 75 of primary latch 74 of a given memory cell 48 (FIG. 3), the transfer latch 92 updates its strong sided output 96 in accordance with the data received at its weak sided input 94. MOSFETS 98 and 100 in combination with transfer latch 92 enable shifting of data upward, between two vertically adjacent memory cells. MOSFET 98 has its channel disposed between input 94 of transfer latch 92 and push input node 97. The gate of MOSFET 98 is driven by a first phase push clock PUSHCLK1 that selectively couples push input 97 to the weak sided input 94 of transfer latch 92. Accordingly, data provided by the push output of a memory cell 48 therebelow, for example memory cell $48_{1,1}$, is then transferred to transfer latch 92 when MOSFET 98 is enabled per the first phase push clock PUSHCLK1. In a second step, a second phase push clock PUSHCLK2 enables MOSFET 100 for propagating data from the strong sided output 96 of transfer latch 92 to the push output PUSHOUT 99 which drives the push input of the associated adjacent memory cell thereabove within the same column, for example, memory cell $48_{2,1}$.

In a similar fashion, MOSFETS 102 and 104 enable downwardly transfer of data from one memory cell to a vertically adjacent memory cell therebelow when driven by respective first and second phase pop clocks, POPCLK1 and POPCLK2 respectively. MOSFET 102 is disposed with its channel between the weak sided input 94 of transfer latch 92 and a pop input node 101 which is coupled to the pop output of a vertically adjacent memory cell of the same column thereabove. The gate of MOSFET 102 is driven by the first phase pop clock, POPCLK1, for selectively coupling node 101 to input 94 of transfer latch 92 so as to enable transfer of pop data from the vertically adjacent memory cell thereabove into latch 92. MOSFET 104 has its gate driven by the second phase pop clock, POPCLK2, for selectively coupling the strong sided output 96 of transfer latch 92 to the pop output node 103 so as to enable propagation of data from transfer latch 92 to a vertically adjacent memory cell therebelow. For example, transfer cell $50_{1,1}$ (FIG. 2B) receives data from the pop output of memory cell $48_{2,1}$ (not shown) when first phase pop clock enables its associated MOSFET 102. Transfer cell $50_{1,1}$ subsequently transfers this data to the pop input of memory cell $48_{1,1}$ by enabling its associated MOSFET 104 per a second phase pop clock. When neither the push clock nor the pop clocks are asserted, each of the MOSFET devices of the transfer cell provides an open circuit, high impedance, tri-state output condition. As noted hereinbefore, in a particular embodiment of the present invention, shifting of data vertically within the respective memory sub-arrays is not provided and, accordingly, the transfer cells 50 are not included within FPMA 10.

Having disclosed the various elements of memory sub-array 12, the next portion of this disclosure describes other programmable resources associated with routing data to and from the various memory sub-arrays of FPMA 10.

Bit Line Routing Matrix

Figure 6A:
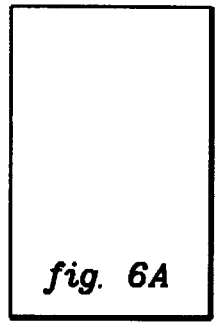
FIGS. 6A–6E are partial schematic diagrams of a bit line routing matrix.
Figure 6B:
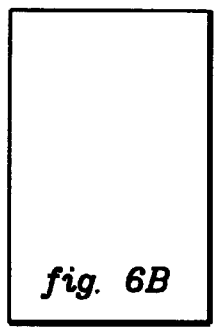
Figure 6C:
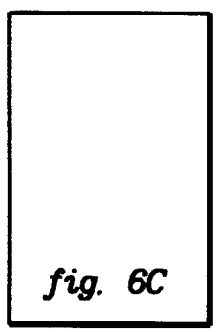
Figure 6D:
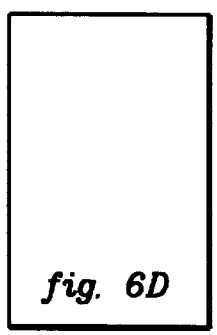
Figure 6E:
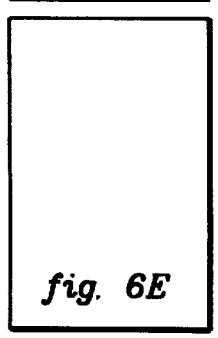
Figure 6A:
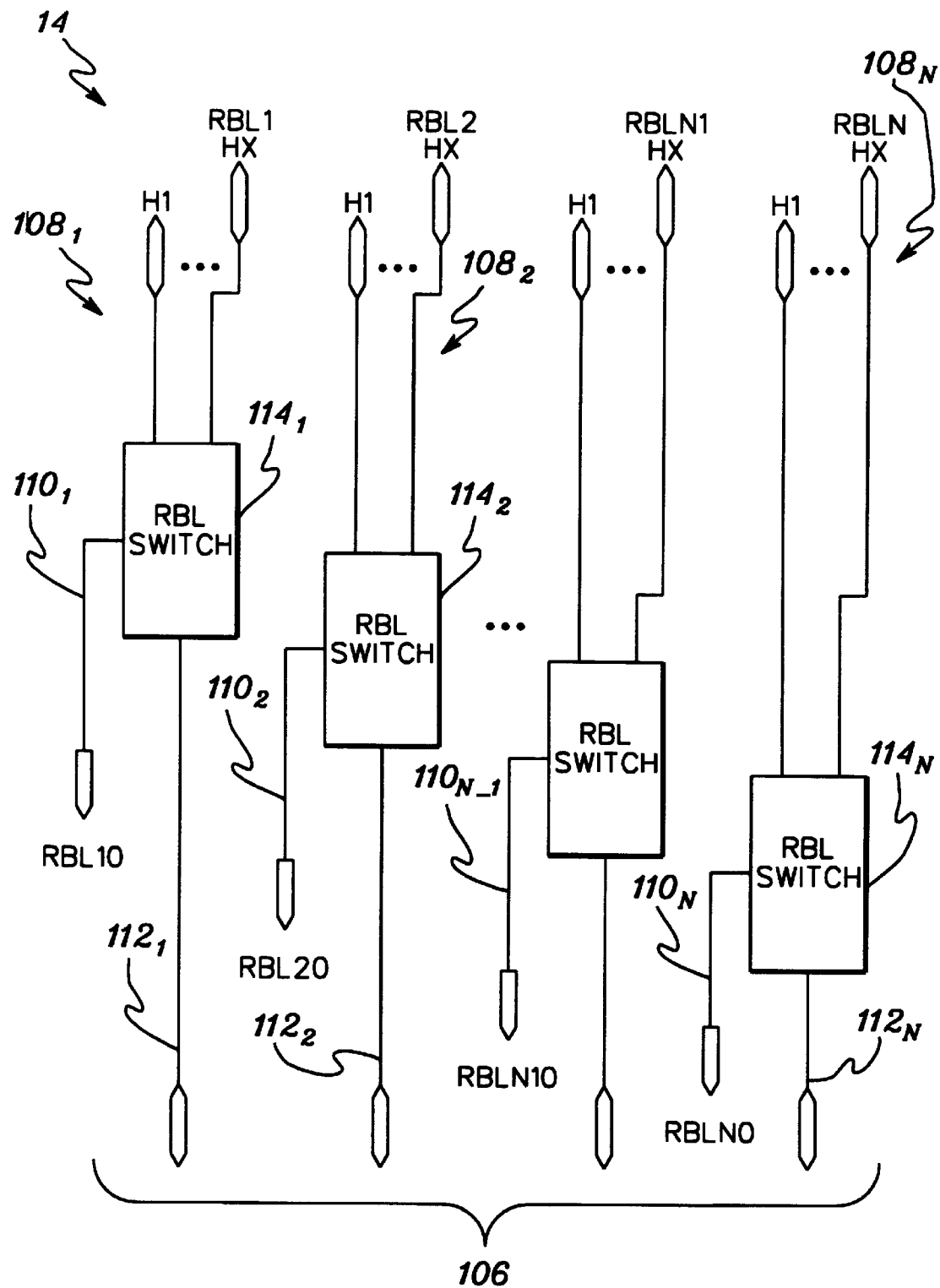
Figure 6B:
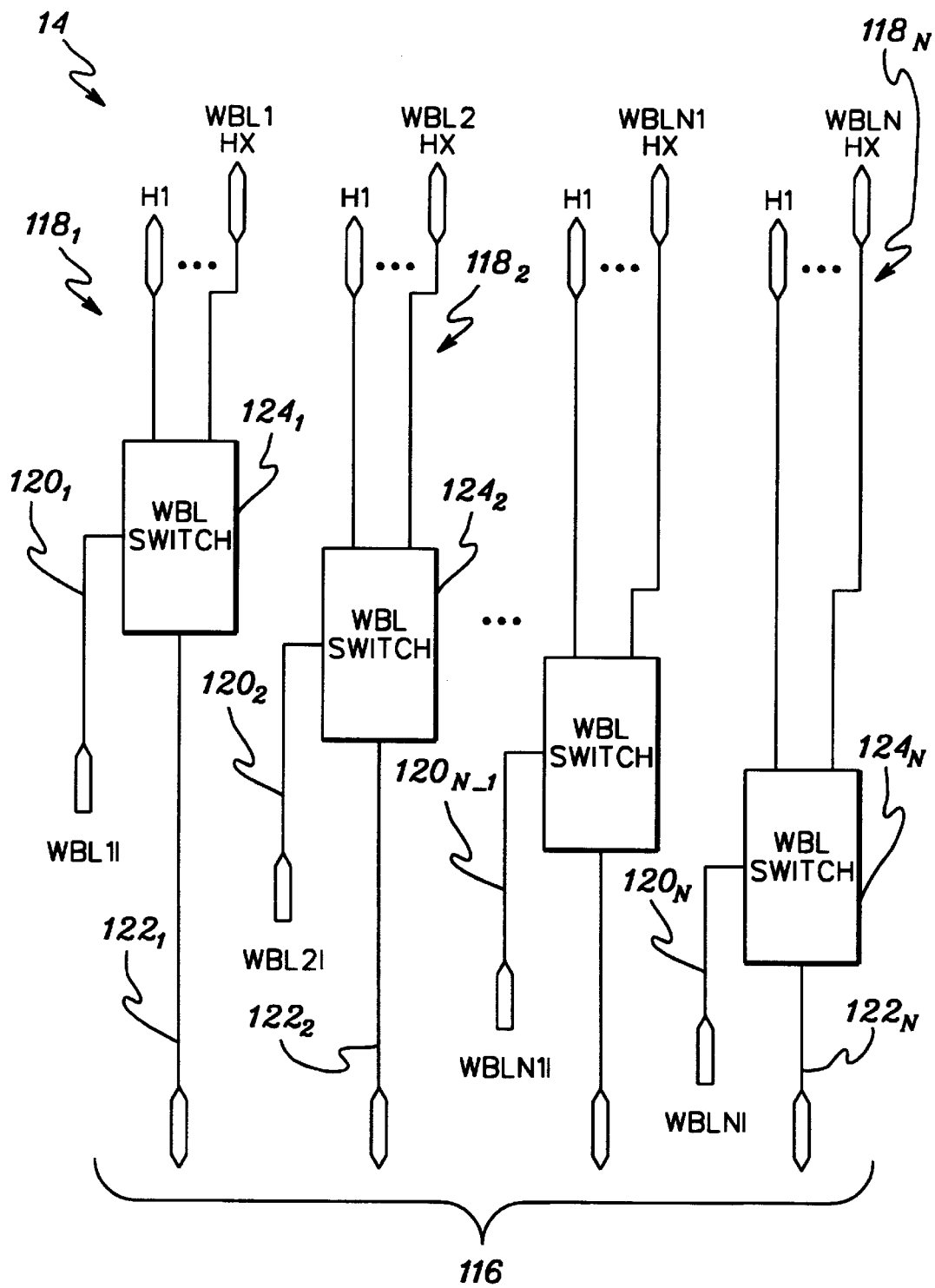
Figure 6C:
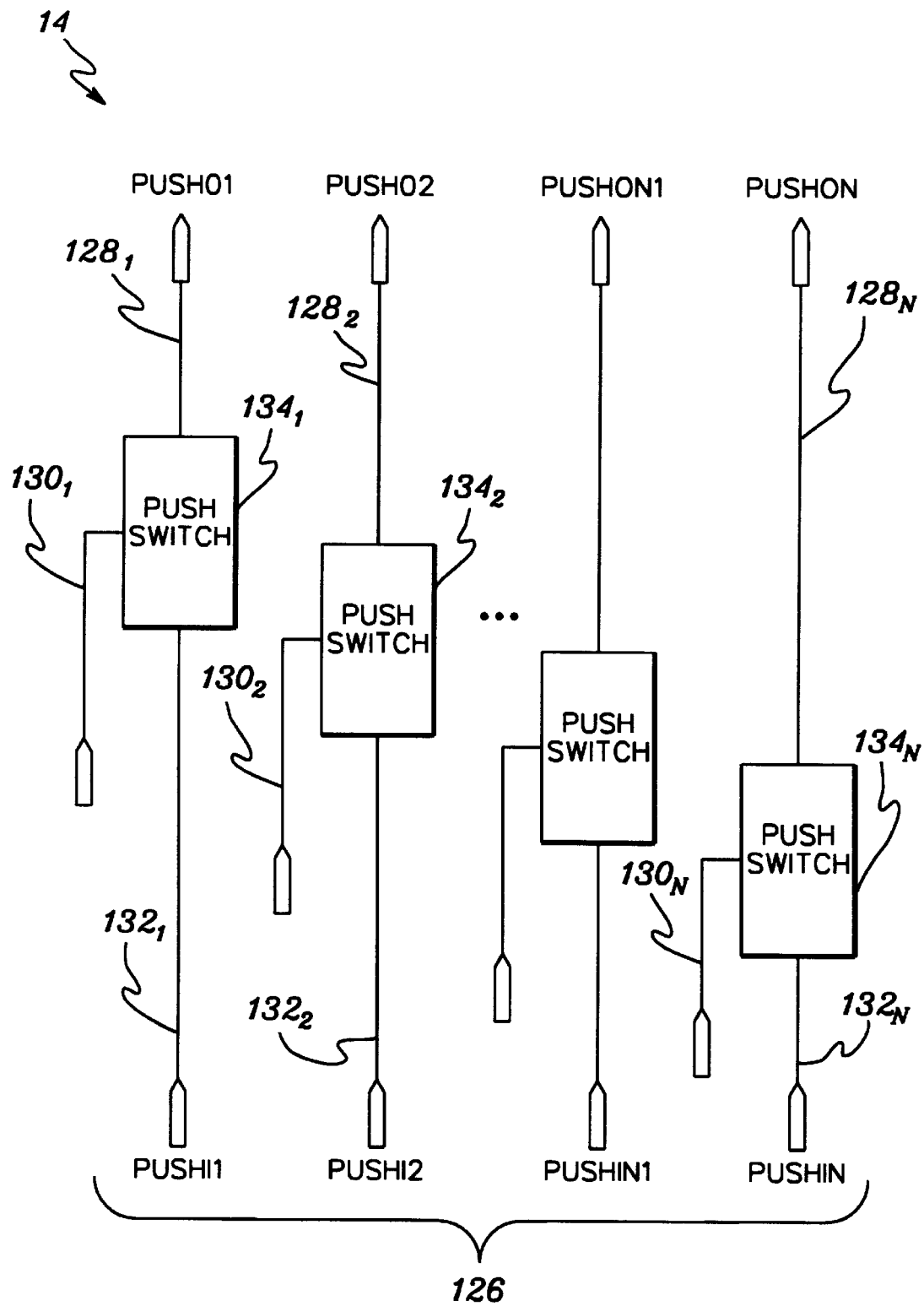
Figure 6D:
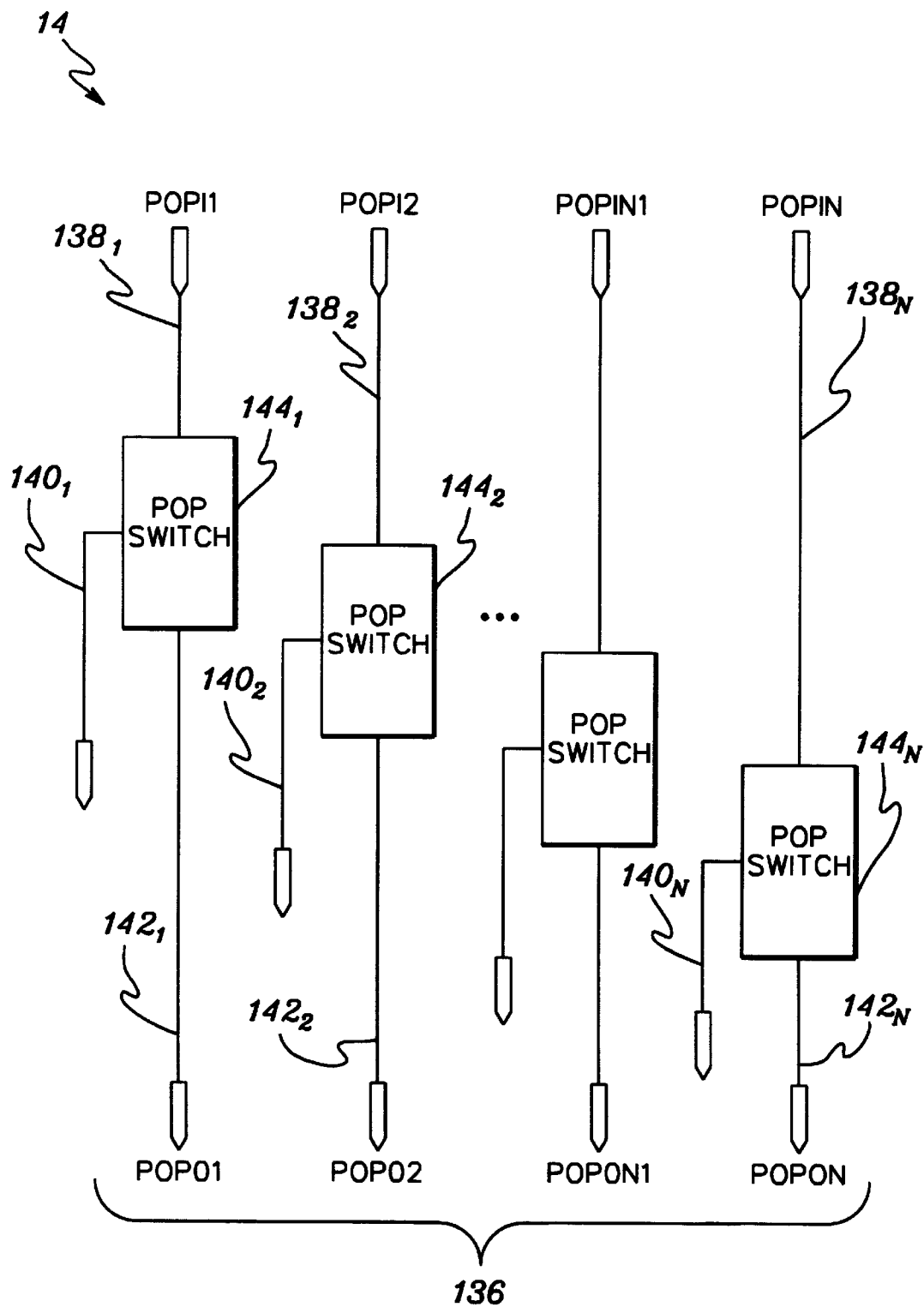
Figure 6E:
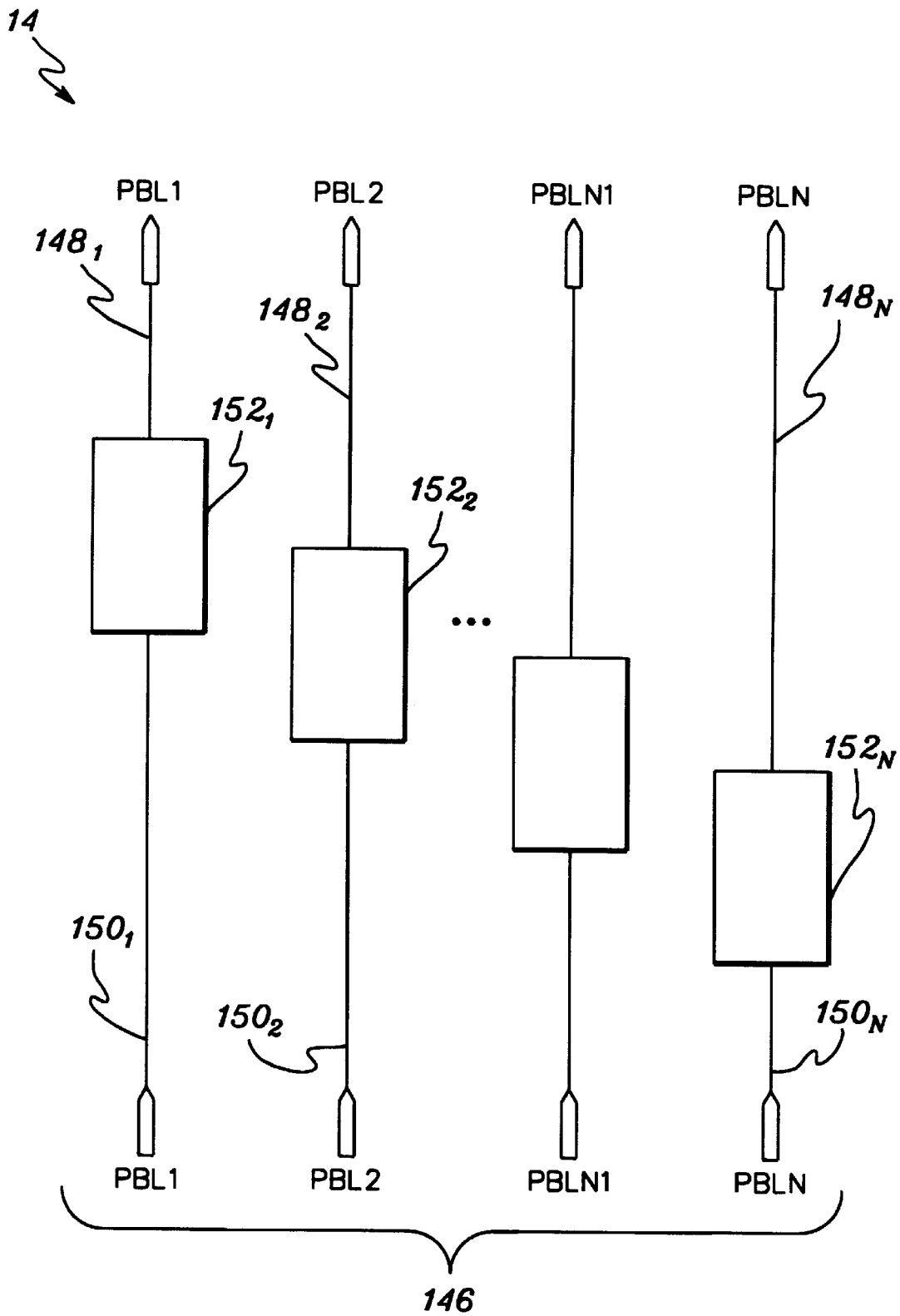

With reference to FIGS. 1A–1C and 6A–6E, each bit line routing matrix 14 of FPMA 10 selects specific data lines of the various bit line structures 30,32,34,36 for propagating data toward secondary I/O bus 38. The bit line routing matrix 14 includes a read bit line switching matrix portion 106 (FIG. 6A), a write bit line switching matrix portion 116 (FIG. 6B), a push switching matrix portion 126 (FIG. 6C), a pop switching matrix portion 136 (FIG. 6D), and a programming bit line switching matrix portion 146 (FIG. 6E). Each of these switching matrix portions route data of the respective read, write, push, pop and programming data line structures 30,32,34, and 36 respectively of an associated memory sub-array, to the secondary I/O bus 38 or to corresponding data line structures of a vertically adjacent memory sub-array.

Read bit line switching matrix portion 106, in FIG. 6A, comprises N switching matrix elements $114_1$–$114_N$, wherein N is equal to a number of bits within the width of a data word associated with memory sub-array 12. The switching matrix elements 114 each selectively couple a particular hierarchy level of read bit lines of associated read bit line hierarchy structures, $108_1$–$108_N$, to associated read bit line interconnects $110_1$–$110_N$ (e.g., providing intercoupling to read lines 40 toward I/O routing matrix $16_{z+1}$ with reference to FIG. 1B) for propagating associated read data to a corresponding I/O routing matrix 16. In addition, each switching matrix element 114 is programmable for selectively coupling a first hierarchy read bit line H1 of its associated read bit line hierarchy structure 108 to a corresponding first hierarchy read bit line $112_1$–$112_N$ of an associated adjacent memory sub-array.

Similarly, write bit line switching matrix portion 116, as shown in FIG. 6B, has N write bit line switching elements $124_1$–$124_N$ for selectively routing data from secondary I/O bus 38 to select lines of associated write bit line hierarchy structures $118_1$–$118_N$ via an associated I/O routing matrix 16. Write bit line switching elements $124_1$–$124_N$ selectively couple interconnects $120_1$–$120_N$ (e.g., intercoupling from write lines 42 from I/O routing matrix $16_{z+1}$ with reference to FIG. 1B) to select hierarchy write bit lines of associated write bit line hierarchy structures $118_1$–$118_N$. In addition, each write switching matrix element 124 selectively intercouples the first hierarchy write bit line of the write bit line hierarchy structure 118 proximate its associated memory sub-array 12 to its corresponding first hierarchy write bit line, $122_1$–$122_N$, of its vertically adjacent memory sub-array 12.

Moving to FIG. 6C, the push switching matrix portion 126 has N push switching matrix elements $134_1$–$134_N$ for selectively intercoupling the push data lines of a given memory sub-array 12 to associated interconnects $130_1$–$130_N$ (i.e. intercoupling push lines 44 with reference to FIG. 1B) for propagating data via I/O routing matrix 16 from secondary I/O bus 38 into the stack associated with the given memory sub-array 12. The push switching matrix elements 134 are alternatively programmable for intercoupling push outputs $128_1$–$128_N$ to push inputs $132_1$–$132_N$ respectively, enabling propagation of push data into the given memory sub-array as received from a vertically adjacent memory sub-array therebelow. Accordingly, each memory sub-array 12 may selectively receive push data from either the secondary I/O bus 38 via I/O routing matrix 16 and interconnects 130, or from a vertically adjacent memory sub-array therebelow via associated interconnects 132.

Pop switching matrix portion 136 of FIG. 6D, is similar to the push switching matrix portion 126, but operates in a reverse manner for popping data off, in contrast for pushing data into, an associated memory sub-array 12. Pop outputs $140_1$–$140_N$ enable propagation of pop data (along corresponding intercoupling pop lines 46 with reference to FIG. 1B) to secondary I/O bus 38 via an associated I/O routing matrix 16. Secondary pop outputs $142_1$–$142_N$ enable coupling to associated pop inputs of a vertically adjacent memory sub-array therebelow. Pop inputs $138_1$–$138_N$ are coupled to the pop outputs of its associated memory sub-array for receiving data as popped off the stack thereof. Each switching matrix element 144 is operative in accordance with its associated configuration data to selectively couple the associated pop input 138 either to pop outputs 140 for sending pop data toward secondary I/O bus 38, or to secondary pop output 142.

The programming bit line switching matrix portion 146, with reference to FIG. 6E, comprises primarily selective interconnects $152_1$–$152_N$, or simply hardwired connections in one preferable embodiment, between the programming bit lines $150_1$–$150_N$ of one memory sub-array and respective programming bit lines $148_1$–$148_N$ of an adjacent memory sub-array. Alternatively, for the first bit line routing matrix $14_1$, of the vertical stack, the programming bit line switching matrix portion 146 provides selective intercoupling between the programming bit lines of the state machine access port 24 and memory sub-array $12_1$. Inputs $150_1$–$150_N$ of the matrix portion 146 are coupled for receiving data from the adjacent memory sub-array there below, or alternatively, from state machine access port 24. Outputs $148_1$–$148_N$ of the bit line routing matrix 14 are coupled to respective lines of programming bit line structure 36 (FIG. 1B) for sending data to its associated memory sub-array 12. Selective interconnects $152_1$–$152_N$ provide selective coupling between inputs 150 and associated outputs 148 in accordance with associated configuration data. Alternatively, those selective interconnects are simply hard wired interconnects.

Having broadly characterized the bit line routing matrix 14, the next portion describes in more detail the various switching matrix elements of the bit line routing matrix.

Read Bit Line Switching Element

Figure 7:
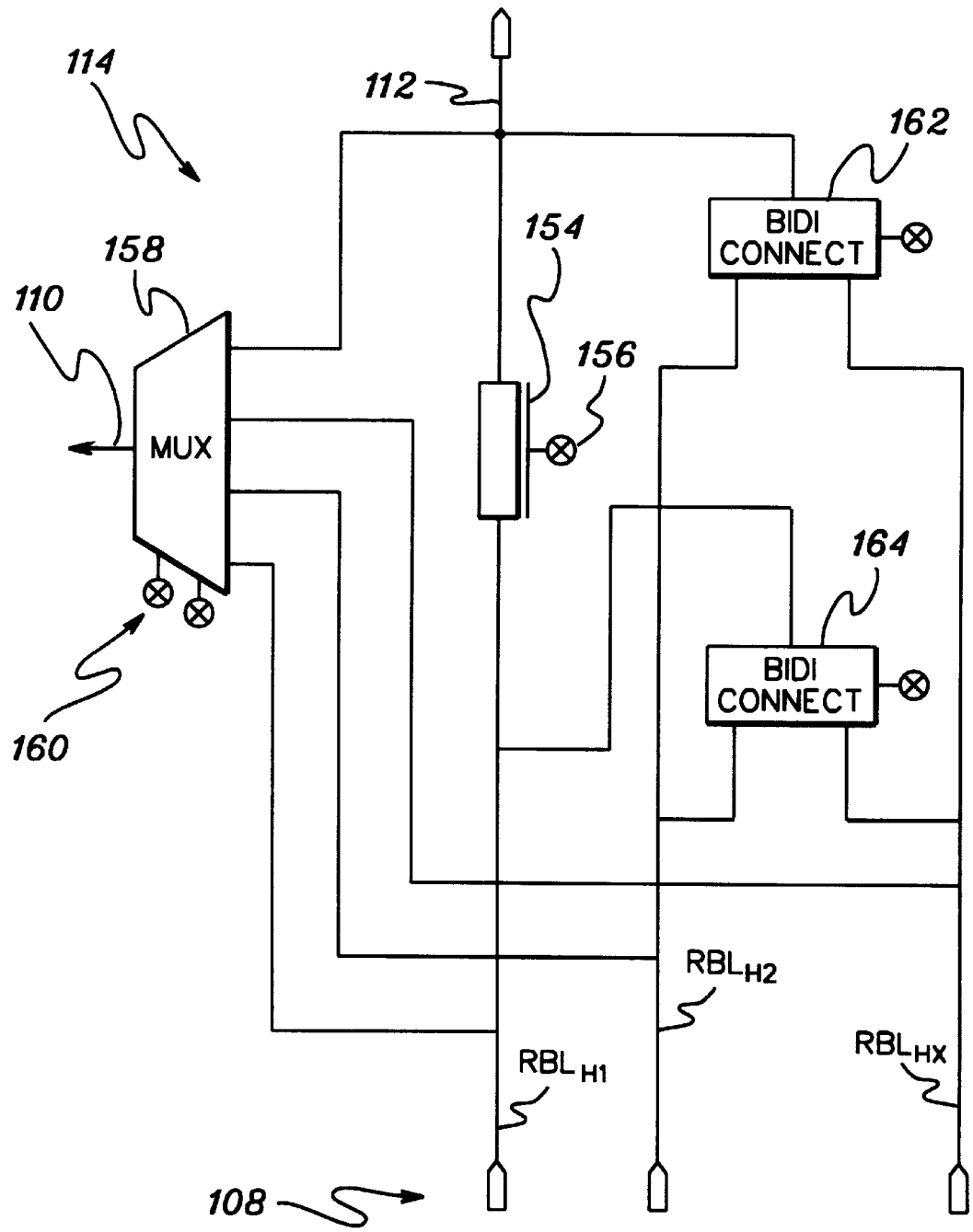
FIG. 7 is a schematic diagram of a switching matrix element associated with the bit line routing matrix of FIG. 6A and a read bit line hierarchy structure.

With reference to FIG. 7, read bit line switching matrix element 114 has a plurality of inputs coupled to various hierarchy read bit lines, $RBL_{H1}$, $RBL_{H2}$ . . . $RBL_{HX}$, of an associated read bit line hierarchy structure 108 for a given column of memory cells of a memory sub-array. The switching matrix 114 selects a particular hierarchy bit line for receiving data to be forwarded to the secondary I/O bus. The read bit line hierarchy structure 108 for a given column of memory cells comprises a first hierarchy read bit line $RBL_{H1}$, a second hierarchy read bit line $RBL_{H2}$, and additional hierarchy lines up to a global hierarchy read bit line $RBL_{Hx}$. Generally, the first hierarchy read bit line $RBL_{H1}$ is associated with a column of memory cells of a single memory sub-array 12. Selective coupler 154, preferably a MOSFET, is selectively programmable for interconnecting the first hierarchy read bit line $RBL_{H1}$ of one memory sub-array to output 112, which is coupled to a corresponding first hierarchy read bit line of a vertically adjacent memory sub-array. MOSFET 154 has its gate driven in accordance with configuration data 156. Selective interconnect 158, e.g. a multiplexer, selectively couples one of its inputs to output 110 for propagating read data toward associated I/O routing matrix 16 and secondary I/O bus 38, in accordance with its configuration data 160. The inputs of multiplexer 158 are coupled to the respective hierarchy bit lines of the read bit line hierarchy structure 108, inclusive of the associated first hierarchy read bit line 112 of the vertically adjacent memory sub-array. Again, within the Figures of this disclosure, the circles with crosses therein, for example 156 and 160, are representative of configuration data providing associated drive signals to their configurable devices.

To assist configuration of the read bit line structure, bidirectional multiplexers 162 and 164 provide selective bidirectional intercoupling between the various hierarchy read bit lines. For example, the upper hierarchy read bit lines $RBL_{H2}$, $RBL_{HX}$, may be selectively coupled to the first hierarchy read bit line $RBL_{H1}$ of a given memory sub-array 12 via multiplexer 164 per its configuration data, or to the first hierarchy read bit line 112 of the vertically adjacent memory sub-array via multiplexer 162 per its configuration data. It will be understood that each of the above multiplexers also include configurations of selecting no inputs, wherein the respective inputs and outputs are placed in high impedance open circuit conditions.

Write Bit Line Switching Element

Figure 8:
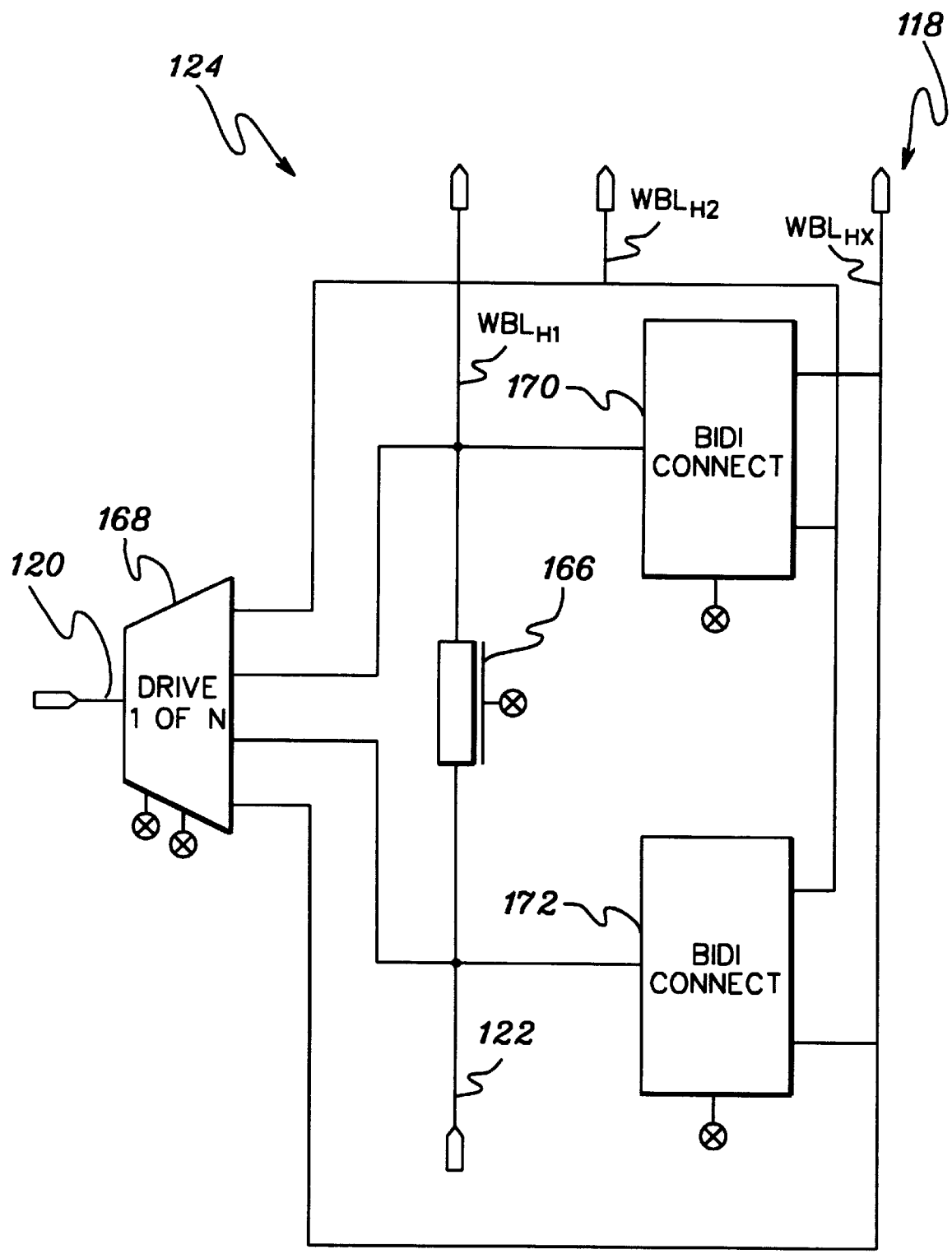
FIG. 8 is a schematic diagram of a switching matrix element associated with the bit line routing matrix of FIG. 6B and a write bit line hierarchy structure.

With reference to FIG. 8, the write bit line switching matrix element 124, similar to the read bit line switch matrix element 114, provides selective intercoupling between the write bit line hierarchy structure 118 of a given column of memory cells of a memory sub-array and an associated interconnect 120 of intercoupling write lines 42 (FIG. 1B), for routing write data as received from secondary I/O bus 38 via associated I/O routing matrix 16. The write bit line hierarchy structure 118 includes a first hierarchy write bit line $WL_{H1}$, which is associated with a given column of memory cells within a single memory sub-array 12. The first hierarchy write bit line $WBL_{H1}$, can be coupled per selective coupler 166 to a corresponding first hierarchy write bit line 122 of a vertically adjacent memory sub-array.

Input 120 receives write data from the secondary I/O bus via an associated I/O routing matrix 16. Selective coupler 168, e.g. a 1-of-N driver, forwards this write data selectively to one of its outputs, which outputs are coupled to respective write bit lines of the write bit line hierarchy structure 118, inclusive of the first hierarchy write bit line 122 of the vertically adjacent memory sub-array. Selective bidirectional multiplexers 170 and 172 provide selective bidirectional intercoupling between the various hierarchies of write bit lines. For example, the first hierarchy write bit lines, $WBL_{H1}$ and 122 respectively, may be selectively intercoupled for driving other greater hierarchy write bit lines $WBL_{H2}$, $WBL_{HX}$ via 170 and 172 respectively. Each of the se multiplexers provides its respective coupling configuration in accordance with its associated configuration data. As with the multiplexers of the read bit line switching matrix elements, the above 1-of-N driver and multiplexers include configuration states of selecting none.

Regarding the data bit line hierarchy structures, the first hierarchy bit lines of the hierarchy structures of a given column of memory cells of the overall FPMA are split at each memory sub-array boundary. The bit lines of higher hierarchy, e.g. H2 and HX, span multiple sub-arrays. For example, the second hierarchy write bit line $WBL_{H2}$ preferably services two memory sub-arrays $112_1$ and $112_2$. A selective coupler (not shown), comparable to MOSFET 166, might similarly be provided for selectively intercoupling a second hierarchy write bit line $WBL_{H2}$ associated with the first two memory sub-arrays, e.g. $12_1$ and $12_2$, with a corresponding second hierarchy write bit line associated with two subsequent memory sub-arrays, e.g. $12_3$ and $12_4$. Finally, the highest hierarchy write bit line, for example $WBL_{HX}$ preferably services all memory sub-arrays as a global bit line. Such hierarchy bit line structures, 108 and 118, are provided for each of the one through N columns of the memory sub-arrays of the field programmable memory array 10; the hierarchy structure for the read bit lines extend across the FPMA similarly as do the write bit lines. Alternate hierarchy structures are discussed hereinbelow.

Push/Pop Switching Matrix Elements

Figure 9:
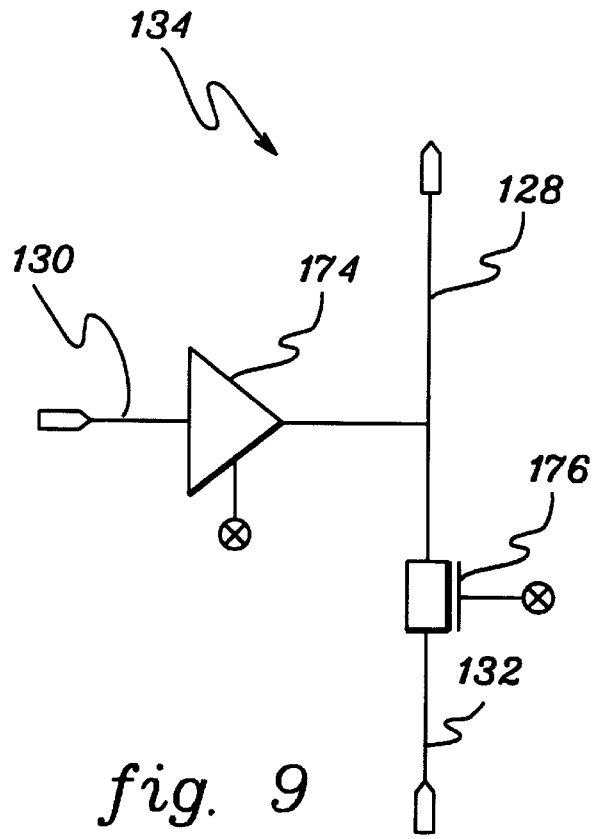
FIG. 9 is a schematic diagram of a switching matrix element associated with the bit line routing matrix of FIG. 6C and a push bit line.

The push switching matrix elements 134, with reference to FIGS. 6C and 9, each comprise two selective couplers, tri-state buffer 174 and MOSFET 176. Tri-state buffer 174 is disposed between input 130 and output 128. Input 130 is coupled to intercoupling push lines 44 for receiving push data from secondary I/O bus 38 via associated I/O routing matrix 16. Tri-state buffer 174 selectively propagates, in accordance with its configuration data, this received push data to output 128, which drives a push input of a column an associated memory sub-array. MOSFET 176 selectively couples output 128 and input 132, for channelling, within a given column, push data into the push input of the associated memory sub-array as received from the push output of a vertically adjacent memory sub-array therebelow.

Figure 10:
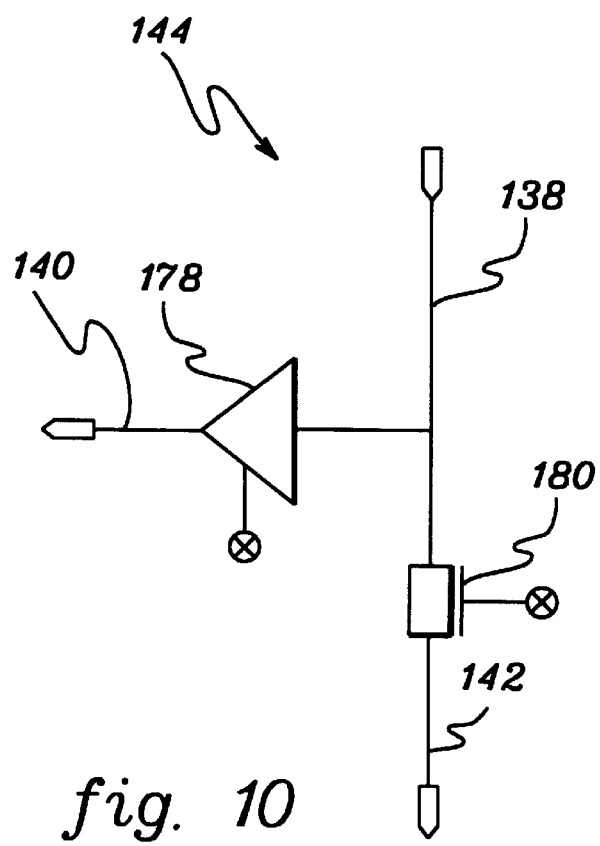
FIG. 10 is a schematic diagram of a switching matrix element associated with the bit line routing matrix of FIG. 6D and a pop bit line.

The pop data switching matrix element 144, as shown in FIGS. 6D and 10, is similar to the push switching matrix element 134 of FIG. 9, except that data flows in an opposite direction. Pop input 138 receives data from the pop output of its associated memory sub-array. This received data is selectively coupled to the corresponding pop input of a vertically adjacent memory sub-array therebelow, or may be alternatively selectively driven out output 140 toward the secondary I/O bus 38 (FIG. 1B). Tri-state buffer 178 selectively couples input 138 and output 140, which is coupled to a select line of intercoupling pop lines 46, for propagating the received data toward secondary I/O bus 38 associated I/O routing matrix 16. MOSFET 180 provides selective coupling between input 138 and output 142, in accordance with its associated configuration data, for propagating, within a given column, the received data as received from the pop output of the associated memory sub-array, to the pop input of the vertically adjacent sub-array therebelow.

In the embodiment of the present invention wherein push/pop vertical shifting of data is not provided within FPMA 10, the push switching matrix portion 126 and pop switching matrix portion 136 of bit line routing matrix 14 are not provided.

Programming Switching Matrix Interconnects

Preferably, the selective interconnects 152 of FIG. 6E may alternatively be simple connection "wires" between respective programming bit lines of adjacent memory sub-arrays. In a particular application of the present invention, wherein the FPMA is employed together with a Field Programmable Gate Array, FPGA, the programming bit lines are intercoupled to extend a memory space of the FPMA consistent with an addressing capability of a state machine associated with configuration logic of the FPGA. In other words, intercoupling of these programming (initialization) bit lines is provided between respective memory sub-arrays to enable programming data access to regions of the FPMA which can be addressed within the addressable space of the state machine of the FPGA. External the FPMA, the programming bit lines are associated with transferring configuration data into configuration memory, e.g. SRAM, of the FPGA, for configuring programmable resources of the FPGA. Accordingly, the state machine of the FPGA, during programming configuration thereof, can access a depth of memory of the FPMA, via state machine access port 24 and associated programming bit lines, as enabled per associated intercouplings 152.

Having described the selective coupling of bit lines of the sub-array bit line structures to respective I/O routing matrices, the next portion of this description describes how the I/O routing matrices selectively intercouple the selected bit lines to the secondary I/O bus 38.

I/O Routing Matrix

As shown in FIGS. 1A and 1B, the I/O routing matrices $16_1$–$16_{z+1}$ interconnect the intercoupling lines 40,42,44,46 for routing signals as selected by the associated bit line routing matrices, $14_1$–$14_{z+1}$ respectively, to select lines of the secondary I/O bus 38. Each I/O routing matrix 16, with reference to FIG. 11, has write switches 182 and read switches 184 providing cross-coupling between the secondary I/O bus 38 to the intercoupling lines 40,42,44,46 for propagating signals to/from associated bit line routing matrices. Write data is sent out of the I/O routing matrix 16 to its associated bit line routing matrix 14 by way of write line intercoupling 42. Similarly, read data intercoupling 40 interfaces data as read from a select memory sub-array to I/O routing matrix 16. For embodiments of the present invention, wherein shifting of data is provided vertically within respective memory sub-arrays, push data is sent from I/O routing matrix 16 to an associated memory sub-array via push intercoupling 44 and its associated bit line routing matrix 14. A similar pop data interface is provided by way of pop intercoupling 46.

Figure 11:
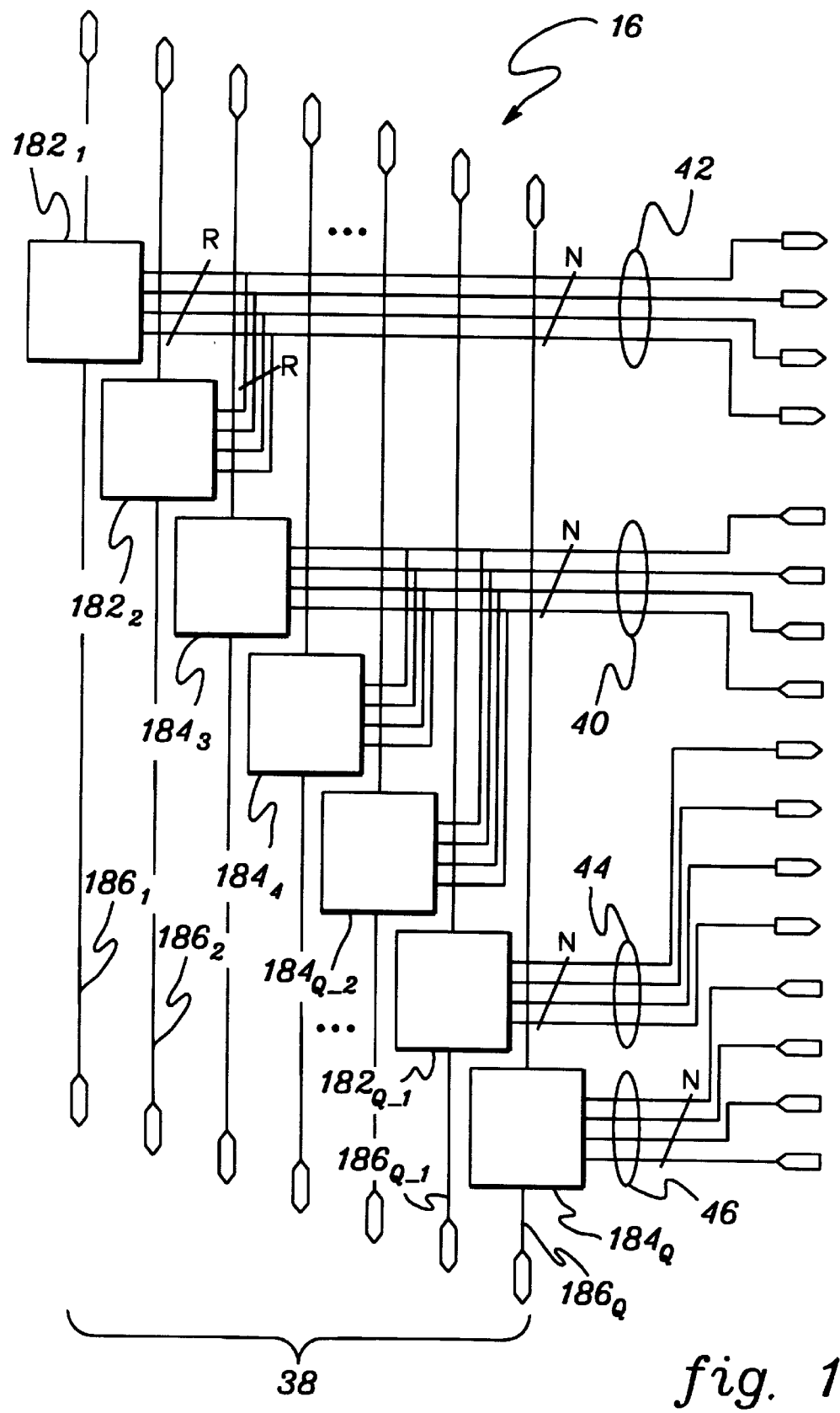
FIG. 11 is a block diagram of an I/O routing matrix.

Write switches 182 of the I/O routing matrices are employed for directing data from the secondary I/O bus toward the associated bit line routing matrix during functional write and push operations. In FIG. 11, only two write I/O routing matrix switches $182_1$, $182_2$ are shown coupling data from respective hierarchy data line structures $186_1$, $186_2$ respectively, of the secondary I/O bus 38, to respective write data lines of write line intercoupling 42. However, it will be understood that N such write I/O routing matrix switches 182 are employed so that each of the N lines of the write line intercoupling 42 can be selectively coupled to a corresponding hierarchy data line structures 186 of the secondary I/O bus 38. Similarly, although only one write I/O routing matrix switch $182_{q-1}$, is shown for directing data from hierarchy data line structure $186_{q-1}$ to a select line of the push intercoupling 44, it will be understood that N such write I/O routing matrix switches 182 are employed for coupling each of the N push lines of intercoupling 44 to associated N hierarchy data line structures 186 of secondary I/O bus 38. Similar pluralities of switches are provided for intercoupling respective signal lines of read intercoupling 40 and pop intercoupling 46 to secondary I/O bus 38.

Figure 12:
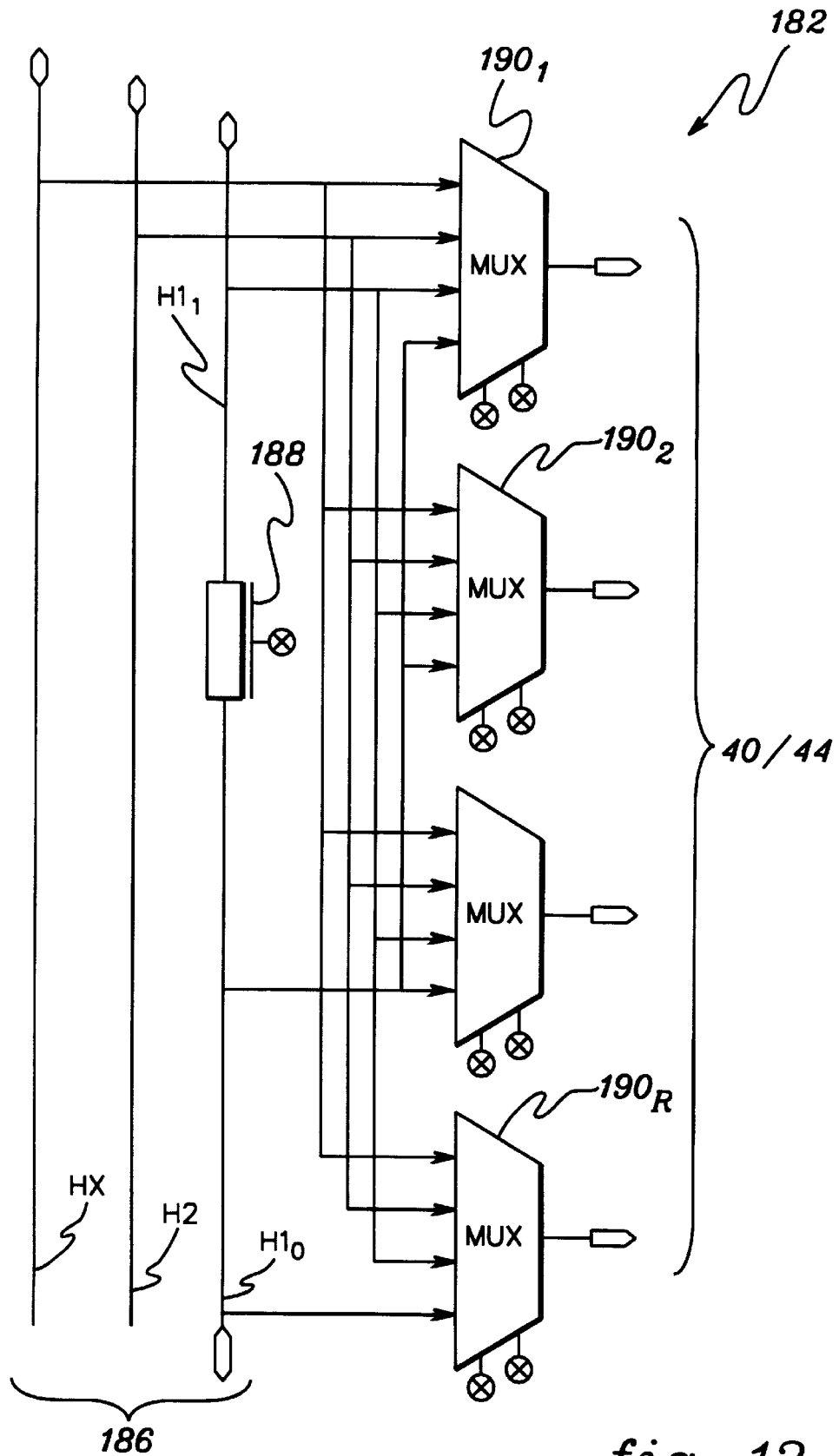
FIG. 12 is a partial schematic diagram of a write matrix switch of the I/O routing matrix of FIG. 11.

The secondary I/O bus 38 has Q hierarchy data line structures $186_1, 186_2 \ldots 186_Q$. Each hierarchy data line structure 186 comprises a plurality of hierarchical signal lines $H1_1$, $H1_2$, H2 ... Hx as shown in FIG. 12. The first hierarchy data line segments, for example, $H1_0$, $H1_1$, extend along respective memory sub-arrays and have boundaries per each memory sub-array. Pass gate 188, preferably a MOSFET, provides selective coupling between adjacent first hierarchy data lines, for example $H1_0$ and $H1_1$, in accordance with its associated configuration data. The second hierarchy line H2 of the given hierarchy structure 186 extends along a plurality of associated first hierarchy lines H1. The highest hierarchy I/O line Hx of the hierarchy structure 186 provides a global I/O line that spans all of its associated lower hierarchy I/O lines, and accordingly all of the associated memory sub-arrays of the FPMA. Each write switch 182 of an I/O routing matrix 16 includes from 1 to R multiplexers, $190_1$, $190_2 \ldots 190_R$, which selectively couple one of R signal lines, of the associated intercoupling network, e.g. 40, 44, to the particular hierarchy I/O data line structure 186. R can take on a value between 1 and N, wherein N is equal to the number of lines of the associated intercoupling network, and corresponds to the data width N of an associated memory sub-array. Multiplexers 190 of the write switch 182 selectively couple a select hierarchy I/O line of an associated hierarchy structure 186 to a select signal line of its associated intercoupling network, e.g. 40 or 44. Each multiplexer 190 provides selective intercoupling in accordance with its associated configuration data, which may include selection of none.

The read I/O routing matrix switches 184 (FIG. 13) have a topology similar to the write I/O routing matrix switches 182 except that the selective multiplexers 190 are replaced by selective drivers 192 for selectively driving data from associated read and pop intercouplings, 40 and 46 respectively, to secondary I/O bus 38. Each selective driver $192_1, 192_2 \ldots 192_R$, has a plurality of outputs coupled to the various hierarchy lines of a given hierarchy structure 186 of secondary I/O bus 38. Selective drivers 192 provide such selective intercoupling in accordance with associated configuration data. In one configuration state, the selective drivers 192 drive no outputs, wherein all of the outputs provide open, tri-state conditions. Typically, only one of the R plurality of selective drivers 192, per read switch 184, provides coupling to its associated hierarchy structure 186. MOSFET 188', similarly as described hereinbefore with reference to MOSFET 188 of the write switch, provides selective coupling between first hierarchy signal lines, $H1_0$ and $H1_1$, in accordance with its associated configuration data.

In the one embodiment of the present invention, wherein vertical shifting of data is not required within the memory sub-arrays, the pop and push resources of the I/O routing matrix 16 are not included.

I/O Block

Figure 14:
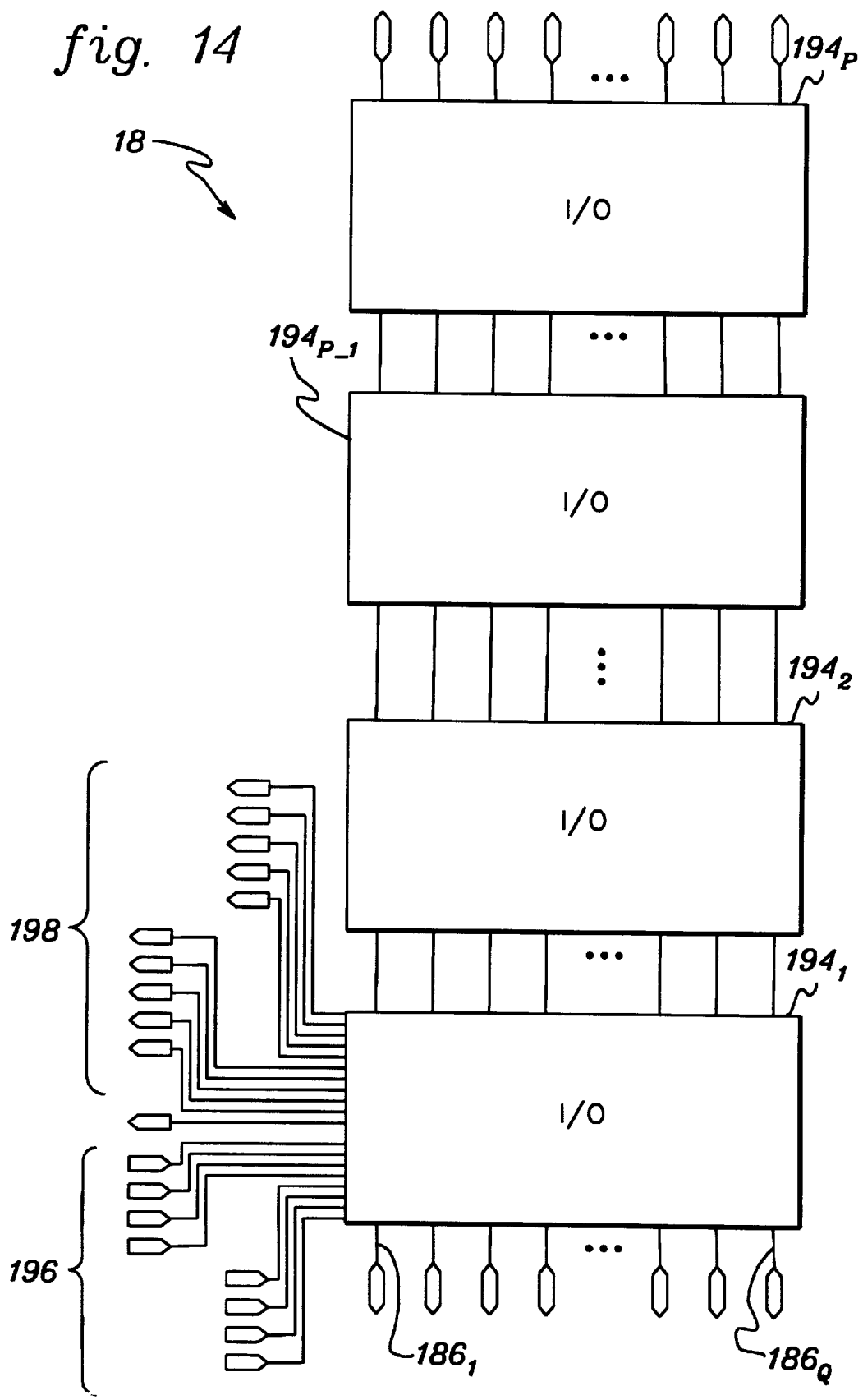
FIG. 14 is a block diagram of an I/O block.

With reference to FIGS. 1A, 1B and 14, each I/O block 18 provides selective intercoupling between primary I/O bus 26 and secondary I/O bus 38. Again, secondary I/O bus 38 comprises Q respective hierarchy I/O data line structures $186_1, 186_2 \ldots 186_Q$. Each I/O cell $194_1-194_P$, of a given I/O block 18, includes write interconnects 196 between particular data lines of primary I/O bus 26 and select I/O lines of secondary I/O bus 38. Likewise, each I/O cell 194 includes read interconnects 198 between certain lines of primary I/O bus 26 and other select I/O lines of secondary I/O bus 38.

Figure 15:
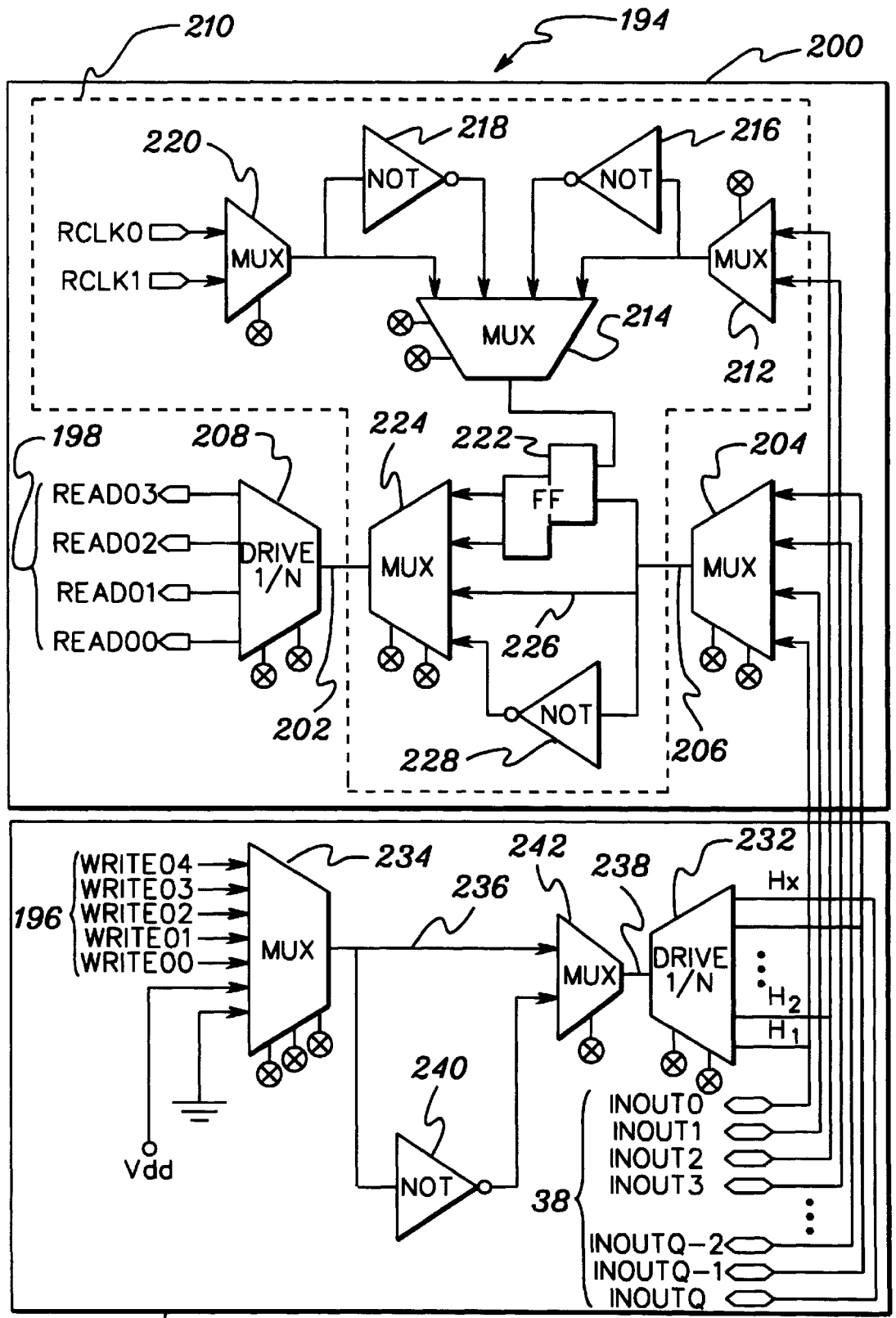
FIG. 15 is a schematic diagram of an I/O cell of the I/O block of FIG. 14.

As shown in FIG. 15, each I/O cell 194 has a read port 200 for propagating data from secondary I/O bus 38 to primary I/O bus 26 via read interconnects 198, and a write port 30 for propagating data in an opposite direction from primary I/O bus 26 to secondary I/O bus 38 via write interconnects 196. In its simplest embodiment, read port 200 includes multiplexer 204 and selective driver 208 wherein input 202 of selective driver 208 is coupled directly to output 206 of multiplexer 204. Multiplexer 204 has a plurality of inputs connected to various I/O signal lines of secondary I/O bus 38. Generally, these I/O signal lines are of a hierarchy structure 186 of the secondary I/O bus 38. Accordingly, the inputs to multiplexer 204 are coupled to the various hierarchy signal lines of respective hierarchy structures 186, and multiplexer 204 is controlled via associated configuration data to selectively connect a given line thereof. Selective driver 208 selectively drives, in accordance with its associated configuration data, one of the read interconnects 198 with data as received at its input 202. Alternatively, selective driver 208 may be programmed for driving none of the outputs, wherein the outputs are held in open, tri-state conditions.

In an alternative embodiment of read port 200, an optional latch/polarity inversion circuit 210 is disposed between output 206 of multiplexer 204 and input 202 of selective driver 208. The latch/polarity inversion circuit 210 enables latching of read data, in addition to selective polarity inversion. Output 206 of multiplexer 204 is coupled to the data input of flip/flop 222, inverter 228 and a first select input of multiplexer 224 (via 226 ). Multiplexer 224 receives the normal and inverted outputs of flip/flop 222 at its second and third select inputs respectively, and has a fourth select input driven by the output of inverter 228. Multiplexer 224 couples one of its select inputs to the input 202 of selective driver 208 in accordance with associated configuration data. Thus, the configuration of multiplexer 224 determines whether or not read port 200 provides latch and/or polarity inversion functionality.

In supporting the optional latch capability within read port 200, flip/flop 222 receives a clock input from one of a plurality of sources. Multiplexer 212 selectively intercouples a clock input from one of two I/O lines of secondary bus 38, in accordance with its associated programming bits. The output of multiplexer 212 drives two inputs of multiplexer 214, one directly and the other via inverter 216. Multiplexer 220 selectively receives a read clock from one of two lines of primary bus 26. In accordance with its programming bits, multiplexer 220 selectively couples a selected clock input for driving two additional inputs of multiplexer 214, one directly and the other inverted via inverter 218. Multiplexer 214 in turn, selectively drives the clock input of FLIP-FLOP 222 with the inverted or non-inverted clock signal as received from either the primary bus or secondary I/O bus, in accordance with its associated configuration state. Thus, in operation, read port 200 drives a select line of primary I/O bus 26 with read data as received from a select line of secondary bus 38. In alternative aspects thereof, read port 200 selectively inverts the data passing therethrough and/or latches the data per a selectively inverted/non-inverted clock from either the primary bus or the secondary bus.

Write port 230 is similar to read port 200, with the exception that data moves in a reverse direction from a select line of primary I/O bus 26 to a select line of secondary bus 38. Multiplexer 234 has a plurality of inputs coupled to select lines of primary I/O bus 26 via associated write interconnects 196. In one aspect of this embodiment of read port 200, multiplexer 234 has additional inputs hard wired to predetermined bias states, for example ground and/or $V_{dd}$. Multiplexer 234 selectively couples one of these various inputs, in accordance with its associated configuration data, to its output 236. Output 236 drives two separate inputs of a second multiplexer 242, one directly and the other via inverter 240. Multiplexer 242 provides selective polarity inversion of the write data in accordance with its associated configuration, and drives input 238 of selective driver 232 with the selectively inverted/non-inverted write data. Selective driver 232 has a plurality of outputs coupled to respective hierarchy signal lines of an associated write hierarchy structure 186 (FIG. 14) of secondary I/O bus 38. Selective driver 232 selectively drives one of the select hierarchy lines, in accordance with its associated programming bits, with the write data as received at its input 238. In one configuration state, selective driver 232 selects no outputs, and places them in open, tri-state conditions.

In operation, with reference to FIG. 14, each of the respective I/O cells $194_1, 194_2, \ldots 194_p$, of respective I/O blocks 18 are associated with corresponding write and read bit line hierarchy structures of secondary I/O bus 38, and are likewise associated with corresponding write and read routing structures of primary I/O bus 26. In accordance with associated configuration data, the I/O cells selectively interface select signal lines of the associated bit line hierarchy structures of the secondary I/O bus to select data line structures of primary I/O bus 26. The number of I/O cells, P, is equal to or greater than that of the bit width, (N), of a sub-array word. Accordingly, the additional I/O cells of an I/O block 18 can be used to assist routing of data between various sub-arrays, or for performing clock redistribution or other data management responsibilities.

Globally, with reference to FIG. 1A and 1B, each I/O block 18 may couple, for example, 8 data lines from primary I/O bus 26 to associated write signal lines of secondary bus 38, and may couple an additional 8 read data lines from secondary bus 38 to corresponding signal lines of primary I/O bus 26, accordingly providing respective read/write interfaces at the primary I/O bus for respective memory sub-arrays 14. If each memory sub-array 14 is provided (via respective bit line routing matrices 22 and I/O routing matrices 16) read/write coupling to respective first hierarchy signal lines of associated I/O data line hierarchy structures 186 of secondary bus 38, and the first hierarchy signal lines of the respective hierarchy structures are isolated from one another; then each memory sub-array may be interfaced in parallel or separately with respect to other memory sub-arrays via associated first hierarchy signal lines of the I/O bit line hierarchy structures 186 of secondary bus 38. Assuming each of the I/O blocks 18 provide read/write interconnects from the respective first hierarchy signal lines of associated I/O data line structures of secondary bus 38, to independent signal lines of primary I/O bus 26; then the read/write data interfaces of the respective memory sub-arrays are arranged at the primary I/O bus 26 in parallel with respect to one another, configuring FPMA 10 as a wide RAM functional unit. As noted elsewhere herein, multiple wide/deep RAM configurations are possible within a single FPMA.

In an alternative example, FPMA 10 is configured as a deep RAM functional unit. A single I/O block, for example, couples respective upper hierarchy read/write data lines of respective I/O data line hierarchy structures of secondary bus 38 to associated signal lines of primary bus 26. The upper hierarchy data lines provide global interfacing to all memory sub-arrays 12 of FPMA 10. Each of the memory sub-arrays 12, accordingly, have their M words (of width N) selectively interfaced, per appropriate independent addressing, to the common global signal lines of the data line hierarchy structures of secondary I/O bus 38. Again, as noted elsewhere herein, the structures of the FPMA disclosed herein support multiple wide and/or deep RAM partitions concurrently.

It will be understood that primary I/O bus 26 comprises a multiplicity of routing signal lines of varying extent, and/or hierarchy, for propagating data to, or from, associated I/O ports (not shown), and/or other circuitry within a shared integrated circuit. For example, in the particular application referred to hereinbefore, wherein FPMA 10 is incorporated together with a field programmable gate array (FPGA), primary bus 26 of FPMA 10, in one aspect, is implemented as merely an extension of an I/O bus of the FPGA (not shown). In an alternative aspect, primary bus 26 of the FPMA provides a boundary interface for merely propagating data therebetween. Accordingly, primary I/O bus 26, in such applications, is cross multiplexed (not shown) to the I/O routing resources of the FPGA.

Alternative Data Interfacing Configuration

In the disclosure provided hereinbefore, the programmable hierarchy structures 186 of the secondary I/O bus 38 and the programmable read/write bit line hierarchy structures 30,32, provided essentially two degrees of freedom for propagating data between primary I/O bus 26 and associated columns of memory cells of memory sub-array 12 of the FPMA 10. The next portion of this description describes an alternative data routing solution, of first and second aspects, wherein secondary I/O bus 38, and associated read/write bit line-structures structures 30,32, collapse upon one another, eliminating one of the two degrees of freedom for interfacing the memory cells of the FPMA.

In the description described hereinbefore, with reference to FIGS. 2A, 2B, 7 and 8, the read/write hierarchy bit line structures 108/118 each included respective MOSFETs 154/166 for providing selective intercoupling between associated lower order hierarchy signal lines, which lower hierarchy lines were segmented between sub-array boundaries. In addition, selective hierarchy intercoupling multiplexers 162, 164/170, 172, provide selective bidirectional intercoupling between the various hierarchy lines of the respective hierarchy structures. Selective drivers 52 and multiplexers 54 (FIG. 2B) provided respective write and read interfacing between select lines of the respective bit line hierarchy structures 108/118 and the corresponding internal bit lines 56/58 of the associated memory sub-array.

Figure 16:
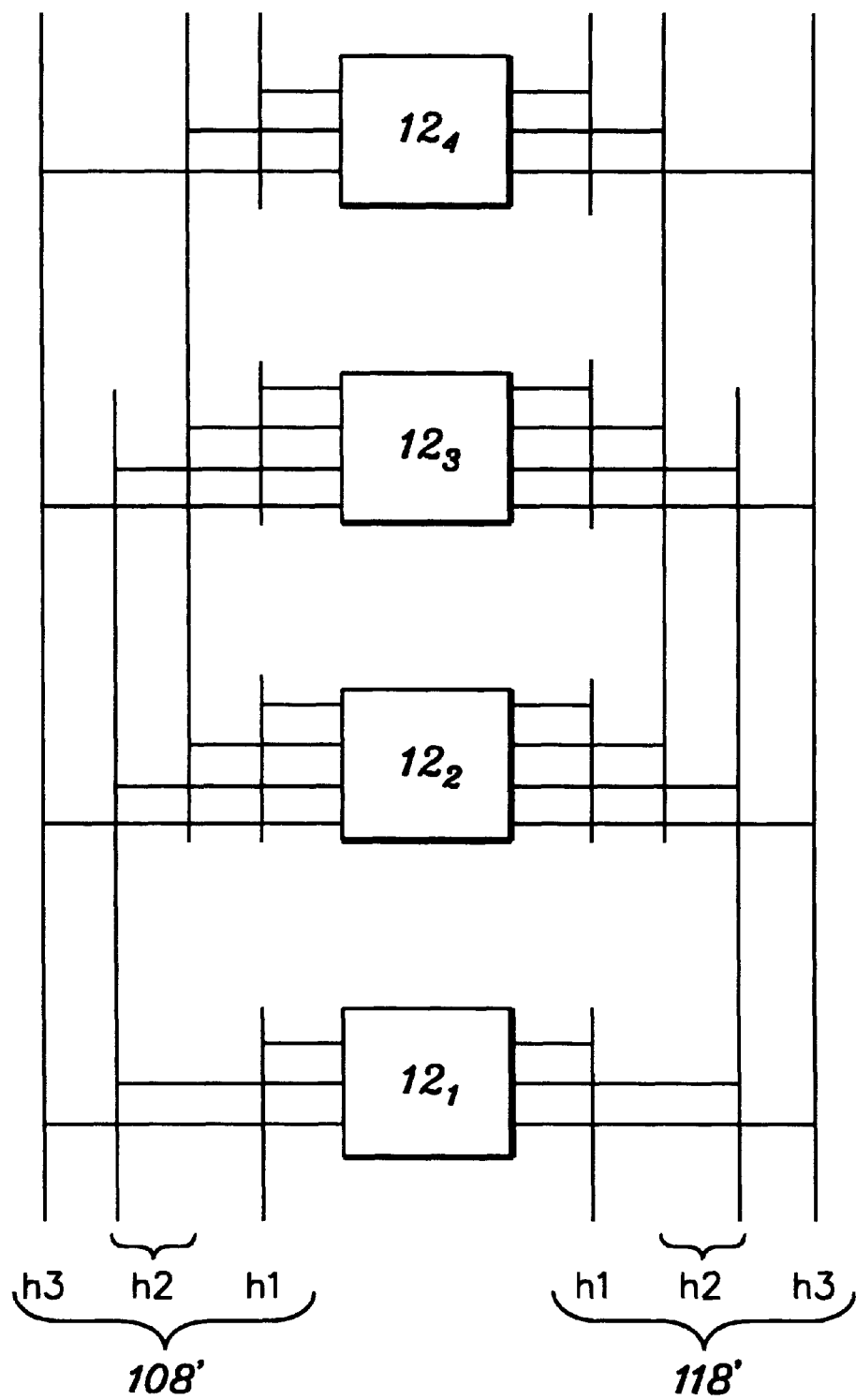
FIG. 16 is a partial schematic diagram of an alternative read/write bit line hierarchy structure.

In an alternative bit line hierarchy structure, intermediate hierarchy signal lines may be overlapped, e.g. H2 of FIG. 16. In addition, the selective intercoupling MOSFETs between lower hierarchy segments and associated hierarchy intercoupling multiplexers are eliminated. With reference to FIG. 16, four memory sub-arrays $12_1$, $12_2$, $12_3$, $12_4$ are associated with respective read and write bit line hierarchy structures 108',118' respectively, for interfacing data to a given column of memory cells of the memory sub-arrays. The read and write bit line hierarchy structures 108'/118' each includes four separate first hierarchy segments H1 spanning associated memory sub-arrays. The second hierarchy segments H2 span three consecutive memory sub-arrays and have respective overlap regions (with respect to one another) spanning two memory cells. The third hierarchy signal lines (read and write) H3 are global bit lines that span the four memory sub-arrays.

As described hereinbefore, with reference to FIG. 2, selective driver $52_1$ selectively propagates data of its internal read bit line $56_1$ to one of the separate hierarchy signal lines of its associated/proximate hierarchy structure $108_1$. Accordingly, with reference to FIG. 16, the number of outputs required of selective driver 52 is four, but for other embodiments may be more or less. For example, memory sub-array $12_2$ selectively drives one of four different hierarchy segments for sending out data as read from its associated memory sub-array $12_2$. Likewise, selective coupler (multiplexer) $54_1$ selectively couples one of the four hierarchy segments of the associated/proximate hierarchy structure $118_1$ to internal write bit line $58_1$ for writing data into associated memory sub-array $12_2$.

Figure 17:
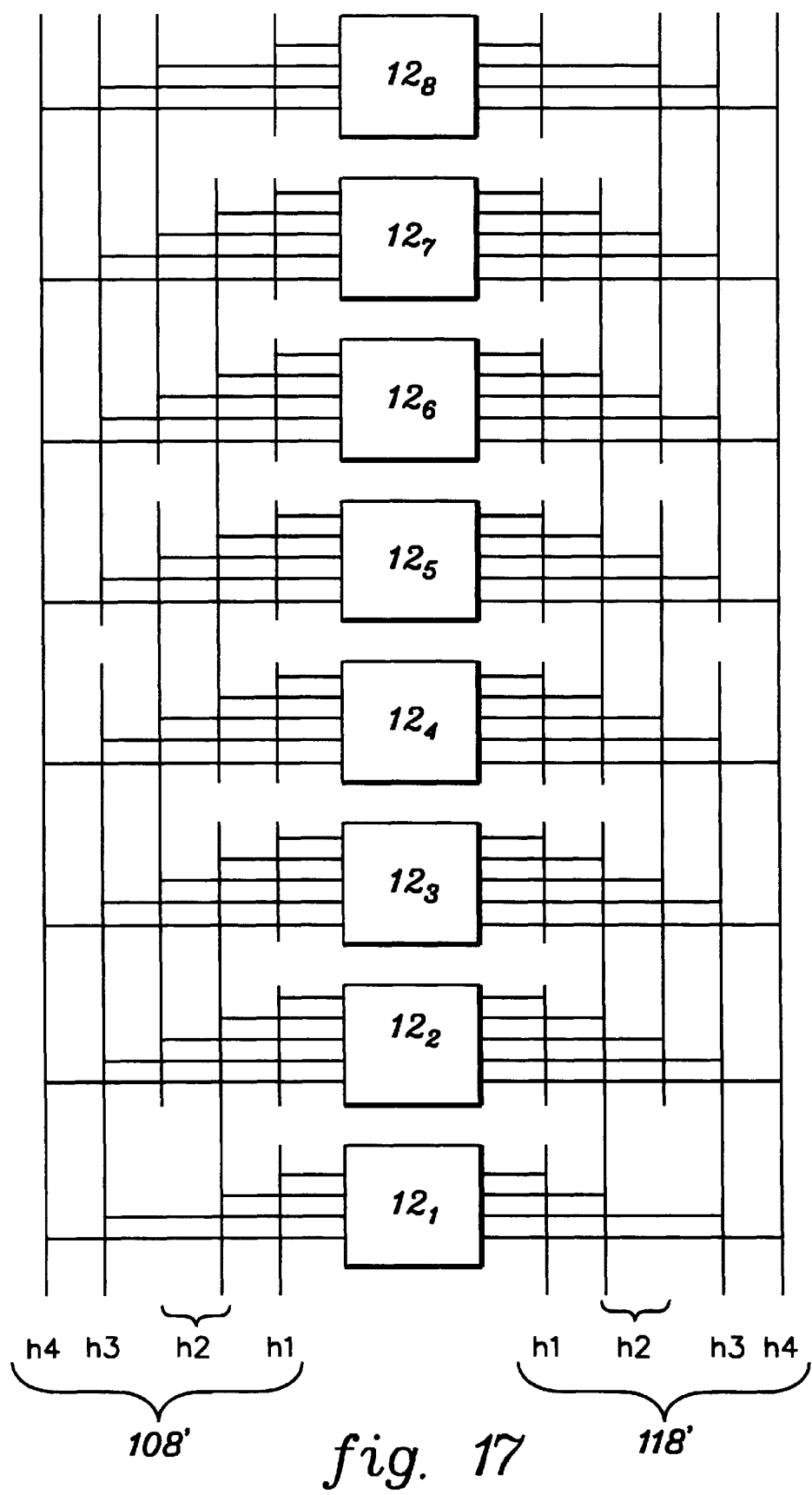
FIG. 17 is a partial schematic diagram illustrating a higher order alternative read/write bit line hierarchy structure.

The bit line hierarchy structures of FIG. 16 each includes three levels of H1,H2,H3 hierarchy. As the number of memory sub-arrays increases, as shown in FIG. 17, the level of hierarchy structures likewise will increase. In FIG. 17, eight memory sub-arrays are interfaced with associated read and write bit line hierarchy structures 108' and 118' respectively, each having four levels of hierarchy H1,H2, H3,H4. Again, the second H2 hierarchy segments overlap one another with overlap regions spanning two memory sub-arrays. Additionally, should the sub-array count and hierarchy signal line counts increase further, overlapping of additional intermediate hierarchy signal lines would be provided. However, not all hierarchies require such overlap, in alternate embodiments.

Figure 18A:
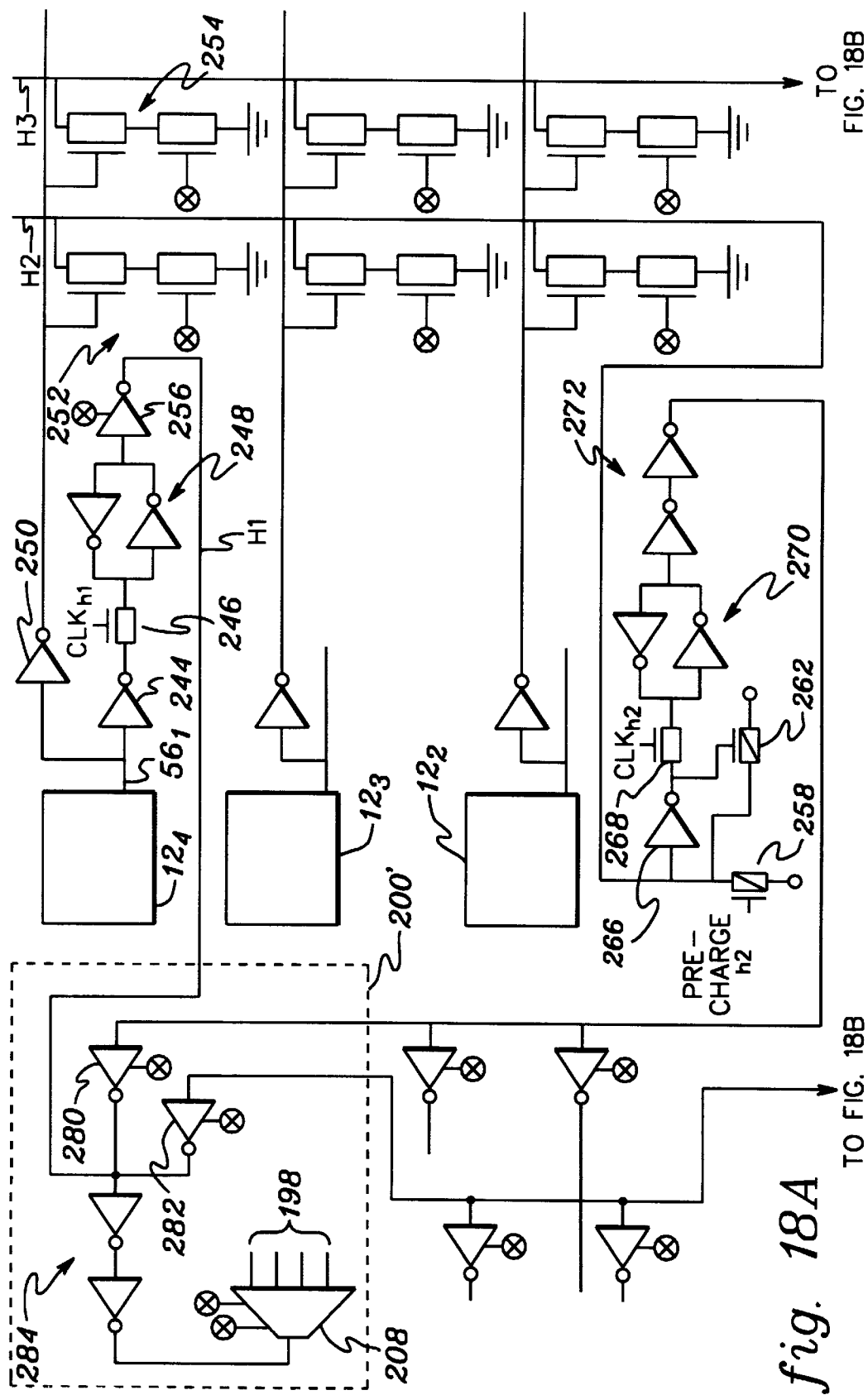
FIGS. 18A–18B are partial schematic diagrams of a read data path network incorporating the alternative read bit line hierarchy structure associated with four memory sub-arrays.
Figure 18B:
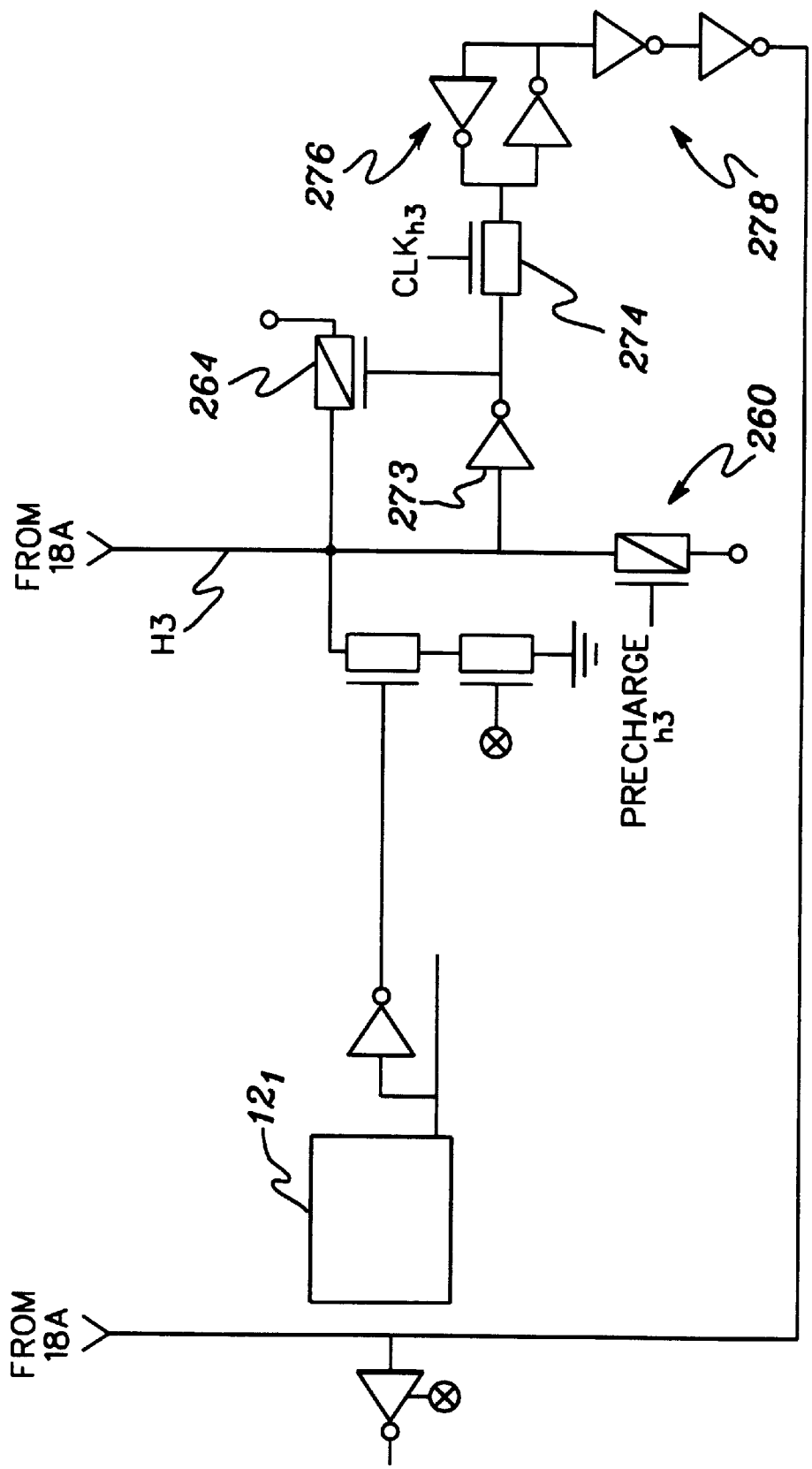

FIGS. 18A and 18B provide a more detailed representation of the read bit line hierarchy structure 108' and associated data paths for propagating read data from, for example, memory sub-array $12_4$ to a primary I/O signal line of primary I/O data bus 26 (FIG. 15 via selective driver 208). A given memory cell of memory sub-array $12_4$ is enabled, per an associated addressed word line (not shown), for driving data as stored therein on its associated internal read bit line $56_1$. Various hierarchy signal paths are available for propagating this data (as read from memory sub-array $12_4$) to a read port 200' of an I/O cell 194 (FIG. 14) of its associated I/O block $18_4$. For a first hierarchy level H1, data of internal read bit line $56_1$ is passed through inverter 244 and clocked via MOSFET 246 into latch 248, when the gate of MOSFET 246 is enabled by an associated first hierarchy clock $CLK_{H1}$. The first hierarchy clock is generated per a read clock associated with reading the memory sub-array (as is explained more fully hereinafter with reference to a second aspect of this alternative data interfacing configuration). Data of latch 248 is selectively output to read port 200' via tri-state inverter 256, in accordance with associated configuration data. When reading a data word from memory sub-array $12_4$, each tri-state inverter 256 associated with each bit of the word is controlled in accordance with the same configuration data. Likewise, the first hierarchy clock $CLK_{h1}$ is applied simultaneously to first hierarchy selective couplers the same as MOSFET 246 as associated with the other remaining bits in the word. When tri-state inverter 256 is enabled, the read data is propagated to read port 200' via the first hierarchy signal line H1 of the read bit line hierarchy structure.

The second and third hierarchy bit lines, H2 and H3 respectively, provide alternative data paths for propagating data to read port 200'. Inverter 250 receives data of internal read bit line $56_1$ and forwards the inverted data to associated MOSFET selection switches 252 and 254 respectively. MOSFET selection switch 252 comprises first and second MOSFET devices having respective channels coupled serially between ground and the associated H2 bit line. The first MOSFET device is enabled per second hierarchy selection configuration data. When the gate of the first MOSFET of selection switch 252 is enabled per the second hierarchy selection configuration data, the second hierarchy bit line H2 is either discharged, or (alternatively) not discharged, in accordance with the data as read from internal read bit line $56_1$ which controls the gate of the second MOSFET device of selection switch 252. Similar selection switches 252 are provided for each of the other internal read bit lines $56_2$, $56_3 \ldots 56_N$ across the word width of the associated memory sub-array $12_4$ for selectively coupling data thereof to respective second hierarchy bit lines of corresponding hierarchy bit line structures. Each of the selection switches 252 of the same memory sub-array share the same configuration data and accordingly, are conditionally enabled together as a word. MOSFET selection switch 254 corresponds to selection switch 252 and functions similarly for driving the third hierarchy bit line H3 in accordance with the read data of internal read bit line $56_1$ when enabled per its third hierarchy configuration data. MOSFET selection switches 252 and 254, within a given memory sub-array, are selectively enabled per associated hierarchy configuration data. For different memory sub-arrays, the selection switches 252 and 254 are selectively enabled per associated hierarchy configuration data unique to each memory sub-array. Accordingly, tri-state inverter 256, and MOSFET selection switches 252,254, may be thought of collectively as providing a substitute for selective driver $52_1$ of FIG. 2B.

The second and third hierarchy bit lines, H2 and H3 respectively, are precharged high via respective P-channel MOSFET devices (selective couplers) 258 and 260. (Internal bit line 56, as well as first hierarchy line H1, could be similarly pre-charged.) The MOSFET devices 258,260 provide selective coupling of associated bit lines, H2, H3, to an upper supply for charging the bit lines in accordance with associated second and third hierarchy precharge signals received at the gates thereof. The charged bit lines, H2, H3, remain charged so long as the respective bit lines are not discharged via MOSFET selection switches 252 and 254 per appropriate read data and configuration data. During a read operation, the precharge FETs 258,260 are disabled, and the noise suppression P-channel MOSFETs 262,264 are driven by respective inverters 266,273 for keeping the associated second and third hierarchy bit lines charged, unless overcome by a read discharge operation. The channel on-resistance of the noise suppression FETs 262,264 are made greater than the combined series ON-resistance of the series MOSFETs of the selection switches 252,254 in order that the selection switches (per appropriate read operations) are able to discharge respective bit lines H2, H3, overcoming the current sourcing capabilities of respective noise suppression FETs 262,264.

Inverter 266, MOSFET 268, latch 270 and buffer 272 are serially disposed between the H2 bit line and associated second hierarchy inputs of read ports 200' of the corresponding I/O cells of respective I/O blocks 18. In operation, a RAM read clock initiates an appropriate sequence of precharge signals (e.g., $PRECHARGE_{h2}$ and $PRECHARGE_{h3}$ driving MOSFETs 258 and 260 respectively) and possibly second or third hierarchy clocks (driving MOSFETS 268 and 274 respectively) for latching associated read bit line data into respective latches 270 or 276. Buffers 272/278 drive respective second and third hierarchy inputs of associated I/O blocks 18 in accordance with the latched data of respective latches 270/276.

Entry to the bit line system can also be gated by the high order enable generated by the address unit of the sub-array.

For purposes of simplicity, the additional overlapping second hierarchy bit line of the read bit hierarchy structure 108', as would be associated with memory sub-arrays $12_1$, $12_2$,$12_3$, is not shown in its overlapping relationship with the illustrated second hierarchy bit line H2 of FIG. 14. However, it will be understood that such an additional second hierarchy bit line (as described with reference to FIG. 17 but not shown in FIG. 18) exists, together with associated MOSFET selection switches, and precharge/drive circuitry for driving corresponding second hierarchy inputs of associated I/O blocks. In addition, it will be understood that memory sub-arrays, $12_1$,$12_2$,$12_3$, have corresponding inverters 244, MOSFETs 246, latches 248 and tri-state inverters 256, as associated with memory sub-array $12_4$, for propagating associated first bit read data of respective internal read bit lines to corresponding first hierarchy inputs H1 of respective I/O blocks. The next section describes operation of read port 200' of an I/O cell 194 of an I/O block 18, in further propagating read data to primary I/O bus 26.

Read port 200' of FIG. 18 is analogous to read port 200 of I/O cell 194 of I/O block 18, (for example I/O block $18_4$ associated with memory sub-array $12_4$) as described hereinbefore with reference to FIGS. 1A, 1B, 14 and 15. It is understood that corresponding read ports 200' are provided in respective I/O blocks, $18_3$,$18_2$,$18_1$ (not shown) associated with memory sub-arrays $12_3$,$12_2$,$12_1$. Tri-state buffers 256, 280, and 282 provide selective propagation of data from respective H1, H2 and H3 hierarchy bit lines into the associated read port 200'. This combination of tri-state inverters may be viewed collectively as providing the same functionality as multiplexer 204, as described hereinbefore with reference to FIG. 15. Generally, only one of the tri-state inverters is selected, per associated configuration data, for propagating read data through buffer 284 and to the input of selective driver 208. Selective driver 208 drives, in accordance with its associated configuration data, a select output of its associated interconnects 198 to the primary I/O bus 26 (FIGS. 1A and 1B).

In this alternative read data interfacing configuration of the present invention, read data is latched into respective hierarchy latches 248,270,276 as received from associated hierarchy bit lines. Accordingly, the optional latch capability of flip/flop 222 as provided in the previously described read port 200, as described hereinbefore with reference to FIG. 15, is not included in alternative read port 200'.

Figure 13:
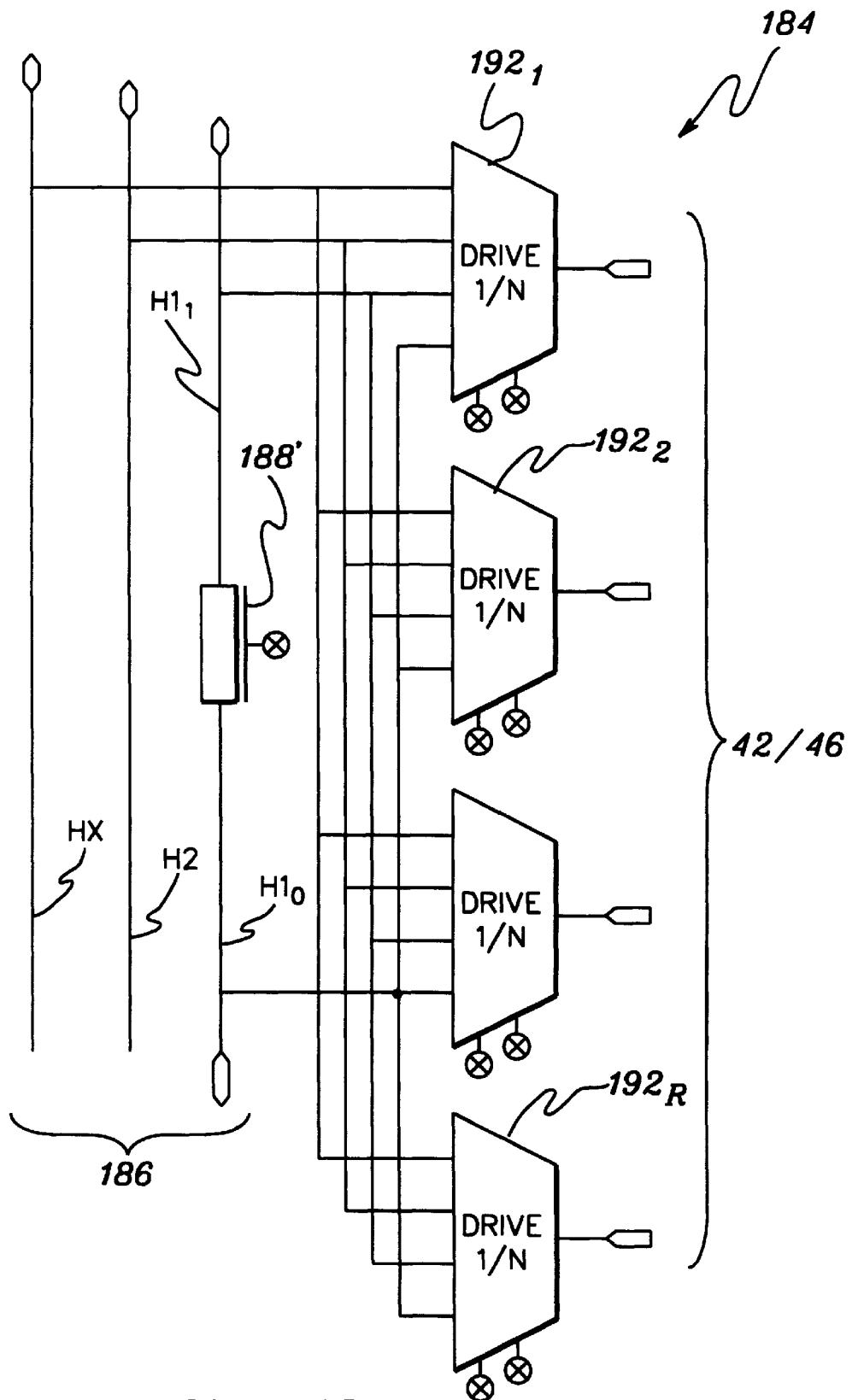
FIG. 13 is a partial schematic diagram of a read matrix switch of the I/O routing matrix of FIG. 11.

Furthermore, this alternative data interfacing configuration for routing data from given memory sub-arrays to the read ports of associated I/O blocks, eliminates an additional degree of freedom in routing of read data, which was otherwise provided by multiplexers 158 of bit line routing matrices 14 (FIGS. 1A, 6A and 7) and corresponding read routing matrix switches 184 of I/O routing matrices 16 (FIGS. 1A, 11 and 13). Thus, this alternative data hierarchy routing embodiment reduces circuit complexity, at the cost of simplified routing capabilities, i.e. reduced degrees of freedom.

Figure 19:
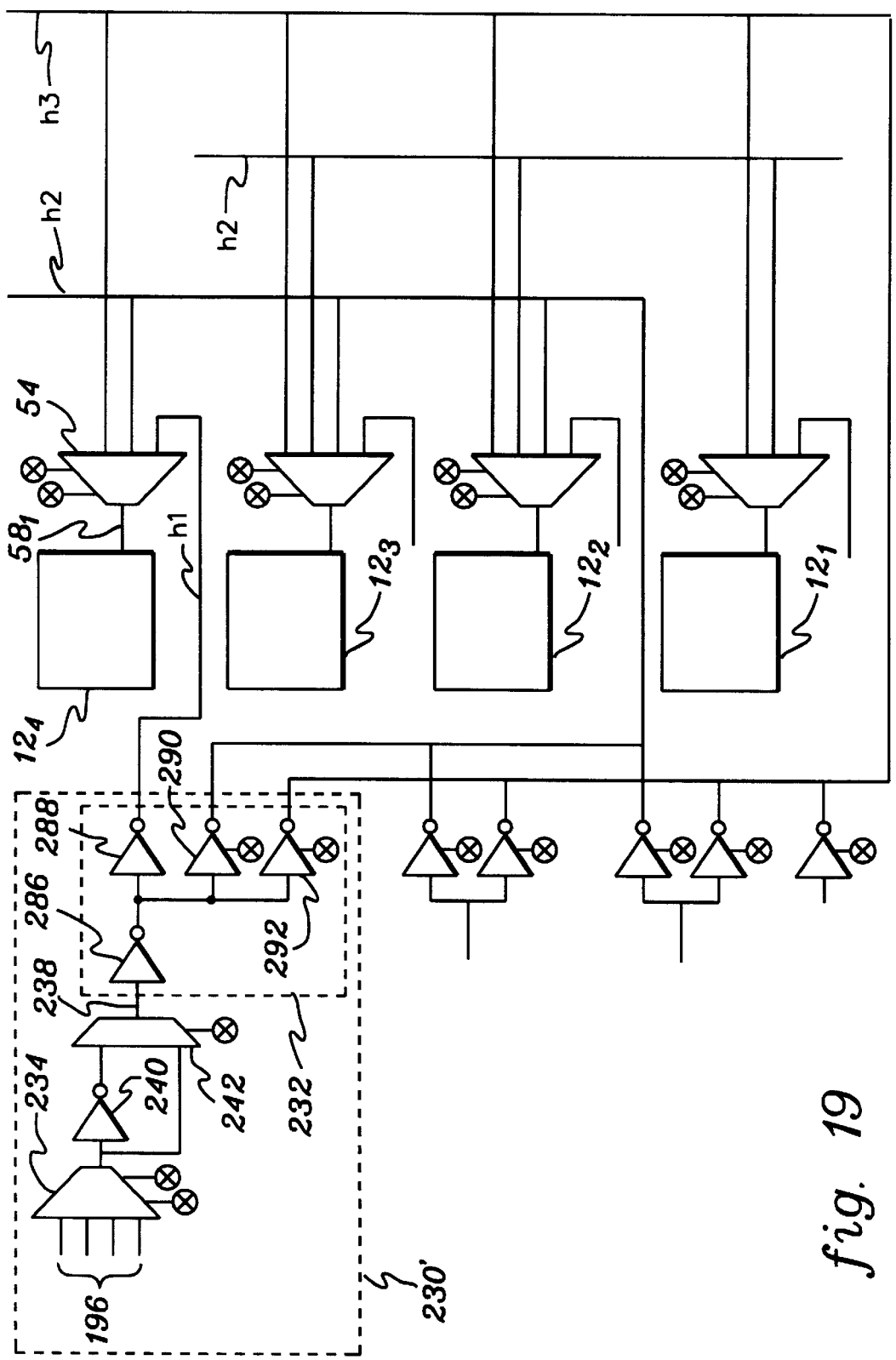
FIG. 19 is a partial schematic diagram of a write port data path network incorporating the alternative write bit line hierarchy structure associated with four memory sub-arrays.

The alternative data interface for writing data into a memory sub-array, as depicted in FIG. 19, is similar to the interface for reading data as described hereinbefore with reference to FIG. 18. A write bit line structure 118' for a single bit of the word width of a memory array, comprises: a global bit line of highest hierarchy, H3; two intermediate hierarchy bit lines, H2, of overlapping relationship; and four local bit lines of first hierarchy H1. These various hierarchy bit lines provide selective coupling into the memory sub-arrays from respective hierarchy outputs of the write ports 230 of associated I/O blocks. Similar write bit line structures are provided (but are not shown) for each bit across the word width N of the memory sub-arrays.

It is assumed that write port 230' is of a given I/O cell 194 of I/O block $18_4$, as associated with memory sub-array $12_4$. Multiplexer 234 is programmable in accordance with associated configuration data for selectively intercoupling one of its plurality of inputs to its associated output. The plurality of inputs 196 of multiplexer 234 are intercoupled to select lines of primary bus 26 (FIGS. 1A and 1B). Multiplexer 234 can also selectively provide a fixed output. The output of multiplexer 234 is coupled to a selective polarity inversion circuit comprising inverter 240 in combination with multiplexer 242. The polarity inversion circuit selectively inverts the signal passing therethrough in accordance with associated configuration data of multiplexer 242.

The output 238 of multiplexer 242 drives the input of a selective drive multiplexer 232, which comprises inverters 286 and 288, and tri-state inverters 290 and 292. Inverter 286 drives inverter 288 and tri-state inverters 290 and 292 per the write data received from multiplexer 242. The output of inverter 288 drives a first hierarchy H1 write bit line associated with memory sub-array 124. The output of tri-state inverter 290 is coupled to one of the overlapping second hierarchy H2 bit lines. The output of tri-state inverter 292 drives the global hierarchy bit line H3.

It will be understood that for write ports 230' of the I/O blocks (not shown), for example $18_3$,$18_2$, as would be associated with overlapping regions of the second hierarchy bit lines, that an additional tri-state inverter (not shown) is provided for enabling selective coupling to the other of the overlapping second hierarchy bit lines H2. Additionally, the configuration data of a given write port 230' is shared in common across all corresponding programmable resources associated with the remaining bits of the width N of the memory sub-array of the associated I/O block (except 234, since routing may need to be more flexible as coupling to outside interface). Multiplexer 54 selects, in accordance with its associated configuration data, input data from one signal line of the write bit line hierarchy structure for propagating data to internal write bit line $58_1$ of its associated memory sub-array. The same configuration data is used for configuring similar multiplexers $54_2, 54_3, \ldots 54_N$ (not shown) across the width N of the memory sub-array.

In an alternative aspect of this embodiment, a buffer (not shown), is included for buffering data of associated hierarchy bit lines H2 and H3 prior to driving the internal sub-array bit line $58_1$. Such buffers are helpful in reducing the node capacitance of respective hierarchy bit lines especially when each of the associated memory sub-arrays are configured with their internal write bit lines coupled to the same hierarchy bit line, e.g. H3, as is required for providing a deep RAM configuration for the FPMA.

In operation, multiplexer 234 receives write data from one of its inputs 196 in accordance with its associated configuration data. This received write data is passed to the polarity inversion circuitry 240,242 which selectively inverts the polarity of the read data in accordance with its associated polarity configuration data. Select drive multiplexer 232 forwards this write data to the associated first hierarchy H1 bit line, and selectively forwards the same write data to the second and third hierarchy bit lines, H2 and H3 respectively, in accordance with associated hierarchy configuration data. Multiplexer 54 in turn selects write data from the appropriate bit line of the associated write bit line hierarchy structure, and forwards this write data to its internal write bit line $58_1$.

For purposes of simplicity, FIG. 19 does not illustrate the write ports of the I/O blocks associated with memory sub-arrays $12_1, 12_2, 12_3$. Likewise, the tri-state inverters of the write ports of the I/O blocks are not shown as associated with providing write data to the overlapping second hierarchy bit line H2. In addition, it will be understood that each multiplexer 54 of associated memory sub-arrays $12_1, 12_2, 12_3$ has respective first hierarchy signal lines H1 coupled for receiving write data from corresponding write ports of associated I/O blocks (not shown).

In an alternative aspect of the present invention, each of the internal read bit lines of the memory sub-arrays incorporates precharge/discharge data transfer scheme similar to the precharge/discharge topology as disclosed hereinbefore with reference to the second and third hierarchy read bit lines of FIG. 18. An addressed word line of the memory sub-arrays would enable selective discharge of an internal bit line in accordance with the data contents of a memory cell associated with the internal bit line and the addressed word line. By providing such a precharge/discharge configuration for the internal read bit line structures, the internal memory cells of the memory sub-arrays can accordingly be made smaller without requiring large drivers for discharging, or charging, the respective internal bit lines.

Alternative Read Capture Latch Topology Providing Simplified Read Bit Line Interface The programmable read bit line hierarchy structure 108', as described with reference to FIGS. 16, 17, 18A and 18B, employs separate latches, for example 248, 270, 276, for interfacing each of the respective hierarchy bit lines to respective hierarchy inputs of the read ports 200' of the I/O cells 194 of associated I/O blocks 18. In a second aspect of the alternative embodiment for interfacing the memory sub-arrays, programmable read bit line structure 108' includes an improved single latch placement solution that eliminates the requirement for the multiplicity of latches.

Figure 20:
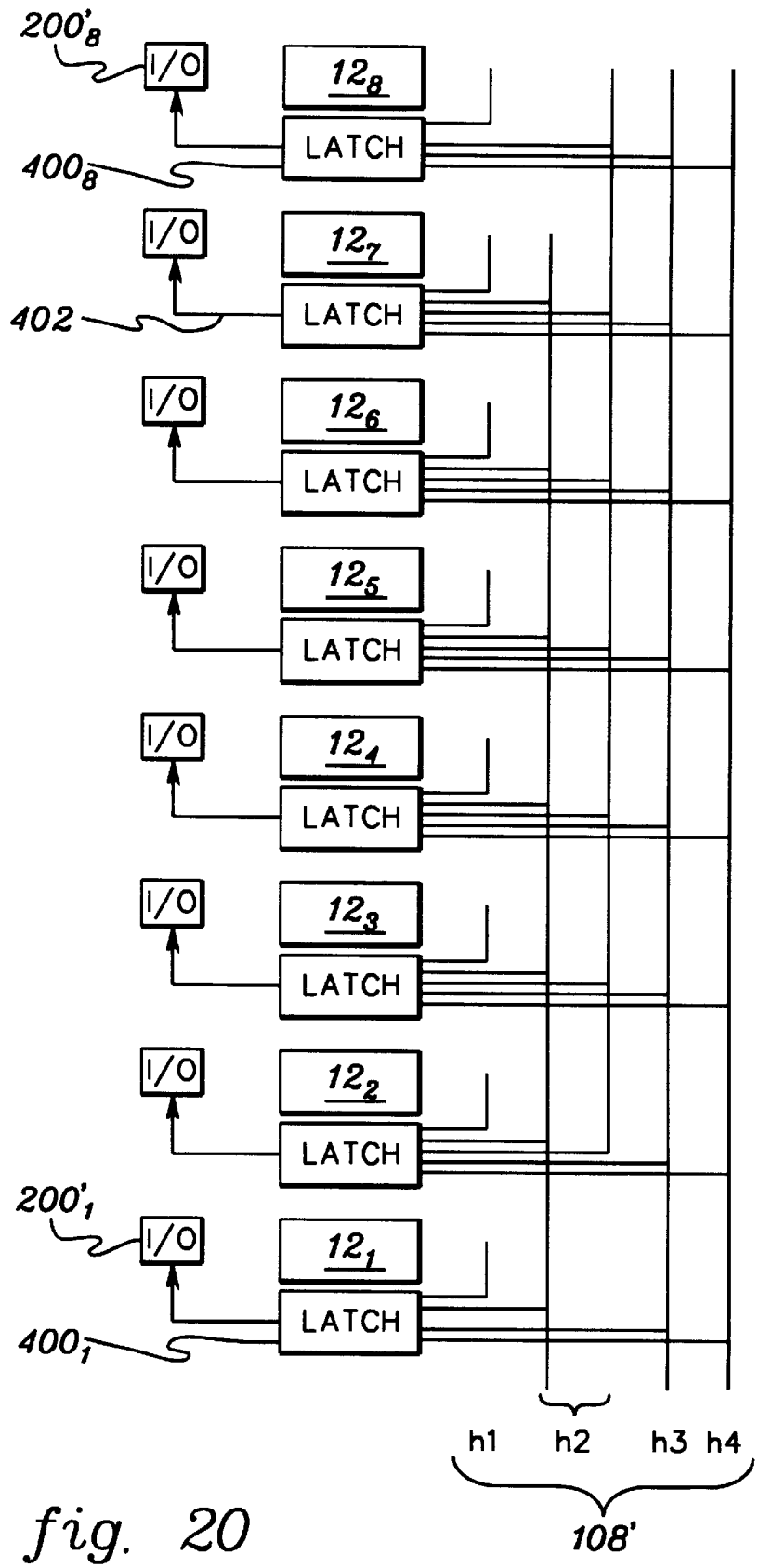
FIG. 20 is a simplified schematic diagram of a read bit line hierarchy structure incorporating alternative read capture latch banks.

With reference to FIG. 20, a read bit line hierarchy structure 108' provides propagation of read data selectively from the memory cells of a given column of memory cells of the eight different memory sub-arrays $12_1, 12_2, \ldots 12_8$, similarly as shown and described hereinbefore with reference to FIG. 17. Not shown in FIG. 20 is the selective coupling of the internal bit line of each sub-array to the different associated hierarchy bit lines of the hierarchy structure proximate thereto. Accordingly, it is understood, as described hereinbefore with reference to FIGS. 2A, 2B, 16 and 17, that selective drivers 52 (or equivalents thereof) selectively propagate data of associated internal read bit lines 56 to one of the separate hierarchy bit lines of respective hierarchy structures 108' in accordance with associated configuration data. Furthermore, it is again noted that bit line structure 108' as shown in FIG. 20, provides data interfacing for merely one column of memory cells, representative of one bit of the N bit width of the programmable memory array, and that corresponding read bit line hierarchy structures 108' are similarly provided for each of the other columns across the width of the memory array.

Figure 21:
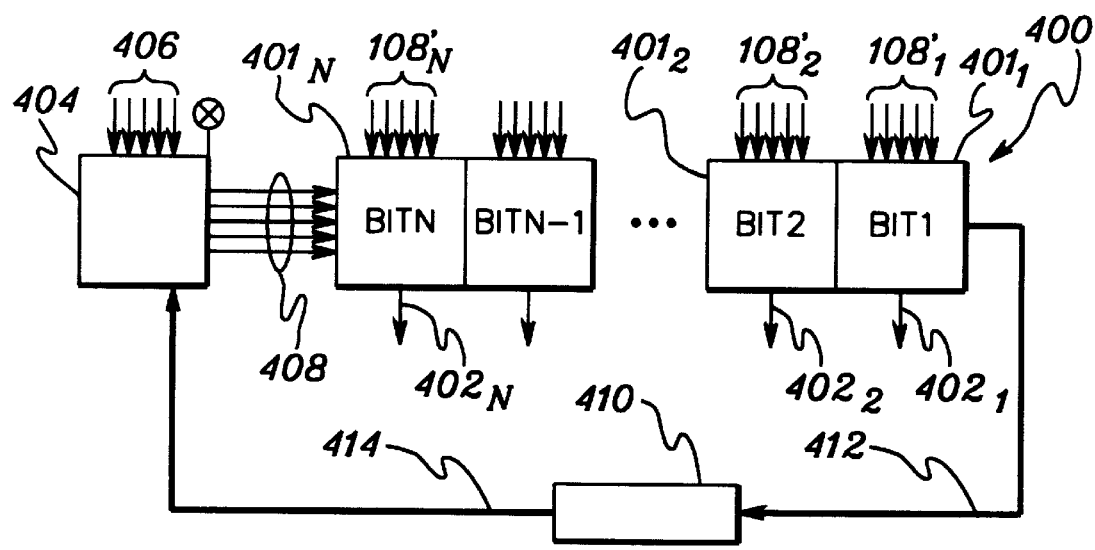
FIG. 21 is a block diagram of a capture latch bank as shown in FIG. 20.

FIGS. 20 and 21 show read capture latch banks $400_1$, $400_2 \ldots 400_8$ intermediate read ports $200_1', 200_2' \ldots 200_8'$ of respective I/O blocks and associated with read bit line hierarchy structures 108' proximate respective memory sub-arrays $12_1, 12_2 \ldots 12_8$. Latch cells $401_1, 401_2 \ldots 401_N$ of a bank 400 each have hierarchical inputs coupled to associated hierarchy bit lines of respective read bit line hierarchy structures $108_1', 108_2' \ldots 108_N'$. The latches capture associated read data synchronous with respective hierarchy capture clocks 408 as generated by clock generator 404. Latched data of latch bank 400 is forwarded to the read ports 200' of respective I/O blocks 18 via interconnects $402_1, 402_2, \ldots 402_N$. Clock generator 404 receives read timing signals at input 406 and generates the respective hierarchy capture clocks 408 in accordance with associated hierarchy configuration data.

Upon receiving a given hierarchy capture clock 412, delay inverter 410 generates a delayed and inverted representation 414 of the capture clock which is sent to clock generator 404 for clearing the respective hierarchy capture clock. Accordingly, clock generator 404 in association with delay inverter 410 provides one shot operation in the generation of the capture clocks.

Figure 22:
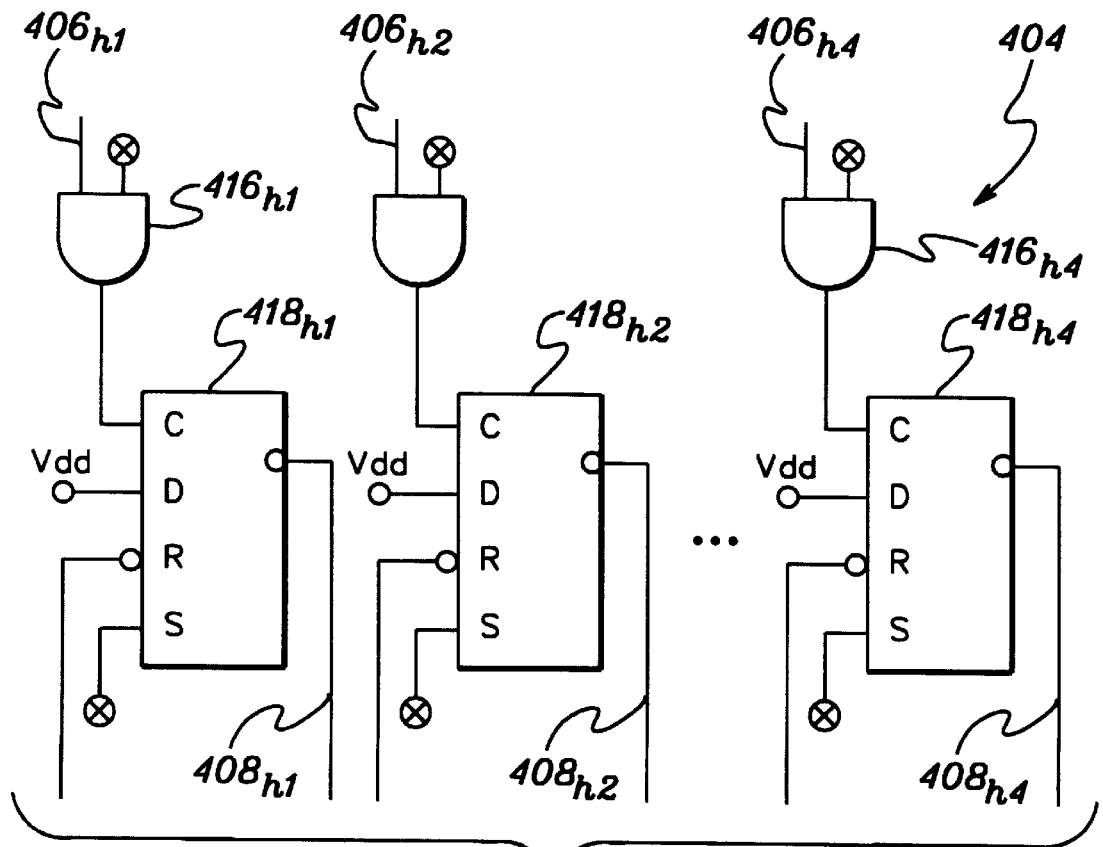
FIG. 22 is a schematic diagram of a clock generator of FIG. 21.

With reference to FIG. 22, clock generator 404 comprises a plurality of flip-flops $418_{h1}, 418_{h2} \ldots 418_{h4}$, with their clock driven by respective AND gates 416. Each AND gate 416 has one input coupled to an associated hierarchy bit line of a timing read bit line hierarchy structure 406, and a second input driven in accordance with associated hierarchy configuration data. Accordingly, the associated hierarchy configuration data determine which hierarchy capture clock 408 is to be generated, and accordingly, from which hierarchy bit line read data will be received and latched within respective latch bank 400.

In operation, for example, AND gate $416_{h1}$ receives a rising edge from the associated first hierarchy timing bit line $406_{h1}$. Assuming this particular AND gate is enabled, the rising edge is forwarded to the clock input of flip-flop $418_{h1}$. Having its data input tied high, flip-flop $418_{h1}$ transitions high, sending out a high logic signal at its output $408_{h1}$ as the first hierarchy capture clock. Latch bank 400 receives the first hierarchy capture clock which enables latch bank 400 to update its contents in accordance with data on associated first hierarchy read bit lines. Delay inverter 410, upon receiving the rising edge of the first hierarchy capture clock, generates the delayed reset signal which is forwarded, via interconnect 414, to the reset input of flip-flop $418_{h1}$ for clearing its output. Falling edge detection can also be employed.

In one alternative embodiment of the clock generator, flip-flops 418 have respective SET inputs driven per asynchronous-latch-configuration data for providing alternative asynchronous, combinational read operation in association with read multiplexers 52 (FIG. 2B) and multiplexers 204/208 (FIG. 15). When the SET inputs are appropriately driven, flip-flops 418 provide high output wherein the latches operate as pass through devices. For embodiments not requiring asynchronous operation, these SET inputs need not be driven per associated asynchronous-latch-configuration data and accordingly may be disregarded or tied to fixed levels to allow normal operation.

Figure 23:
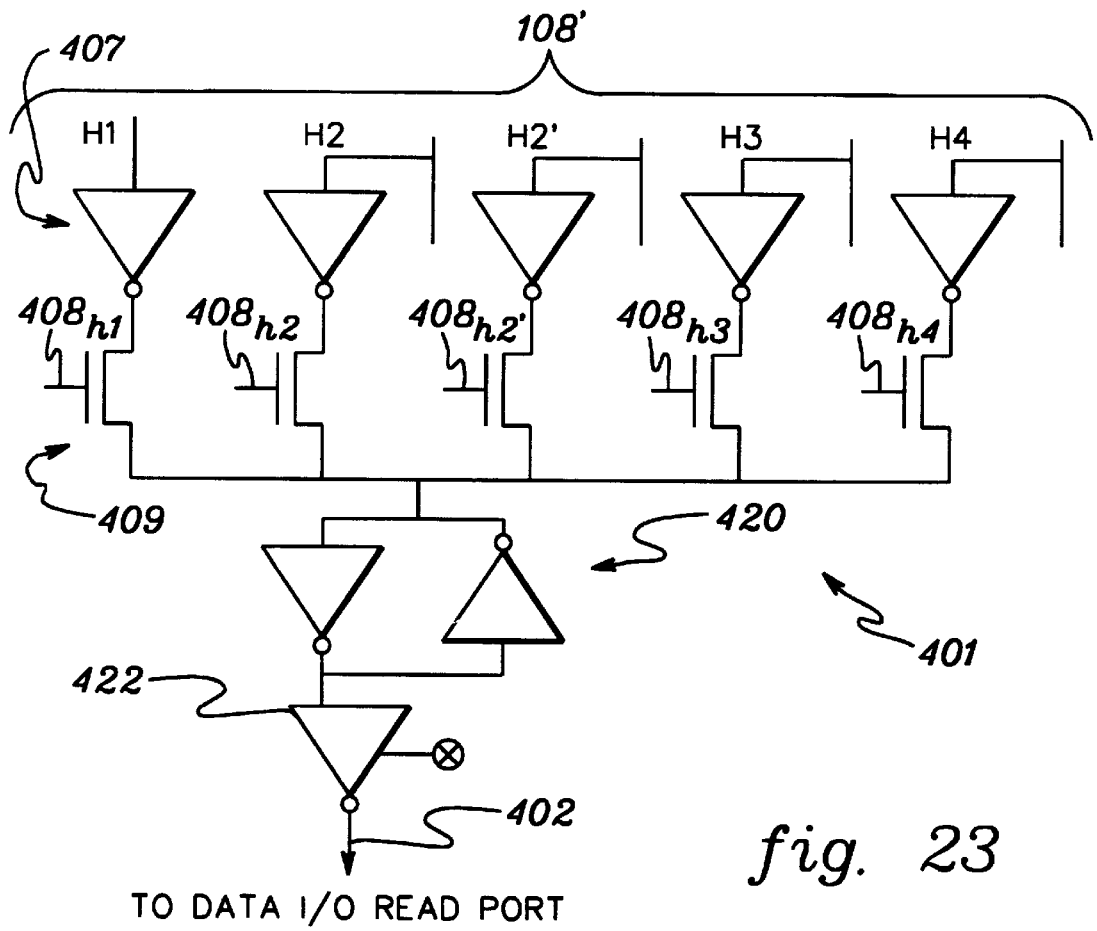
FIG. 23 is a schematic diagram showing a single cell of a read capture latch bank of FIG. 21.

FIG. 23 provides greater detail of a given cell of capture latch 401. Feed back coupled inverters 420, provide the primary latch means for receiving and retaining data. A plurality of MOSFETS 409 provide passgate operation to an input of latch 420. MOSFETS 409 have gates driven by respective hierarchy capture clocks 408 for selectively coupling the input of latch 402 for receiving data of associated hierarchy bit lines of read bit line hierarchy structure 108'. Inverters 407 provide buffering between the respective hierarchy bit lines h1, h2, . . . h4 and latch 420. Additionally, inverters 407 have sufficient drive capabilities for altering the state of latch 420, i.e. each having a greater current source/sink capability than that of the feed back inverter of latch 420. Finally, in driving read port 200' of the associated I/O block 18, tri-state inverter 422 sends out data representative of the retained latch data when enabled per associated latch configuration data. Alternatively, tri-state inverter 422 is replaced by a simple inverter. In operation, first hierarchy bit line hi, for example, of read bit line hierarchy structure 108' forwards data to inverter 407. Inverter 407 drives the controlled channel of its associated first hierarchy passgate of FETs 409 with output data representative of the data received from the first hierarchy bit line. First hierarchy capture clock $408_{h1}$ drive the gate of the first hierarchy FET 409 for enabling the FET to pass first hierarchy data into latch 420. For capturing data of other hierarchy bit lines of hierarchy structure 108', the respective hierarchy capture clocks 408 could similarly have been activated instead for enabling respective MOSFETs 409 for passing respective data into latch 420. Typically, only one hierarchy capture clock is activated at any given time for capturing data within latch 420 of read capture latch cell 401.

To assure that read capture latch bank 400 retains appropriate data as read from a particular word location within an associated memory sub-array 12, an appropriate timing sequence must be provided for a read capture clock 406/408 relative to propagation of data along its associated hierarchy bit line. As mentioned briefly hereinbefore, a timing-read-bit-line-structure is associated with a given "dummy" column of memory cells within the memory array, which timing-read-bit-line-structure is identical to read bit line hierarchy structures 108' of other columns of memory cells in the memory array. However, instead of gating stored (actual) data, per addressably selected word line signal, onto the associated read bit line structure, a known pre-loaded dummy value, e.g. a one, is gated, per the same addressably selected word line, from a dummy memory cell (e.g, a hard wired memory cell not shown) to the analogous timing-read-bit-line-structure. Accordingly, a propagation path for a read timing signal (dummy data) is provided that corresponds to the propagation path of the associated (actual) word data. However, instead of the various hierarchy bit lines of the timing-read-bit-line-hierarchy-structure being coupled to an associated read capture latch intermediate an associated read port 200', the various hierarchy bit lines of the timing-read-bit-line structure 406 are coupled as inputs to clock generator 404 for purposes of triggering select hierarchy capture clocks 408. Accordingly, because of the corresponding propagation paths, at the time a given hierarchy capture clock is synthesized, its associated read data has propagated along corresponding hierarchy read bit lines, through inverters 407, and arrived at the gated channels of respective capture FETS 409.

Figure 24:
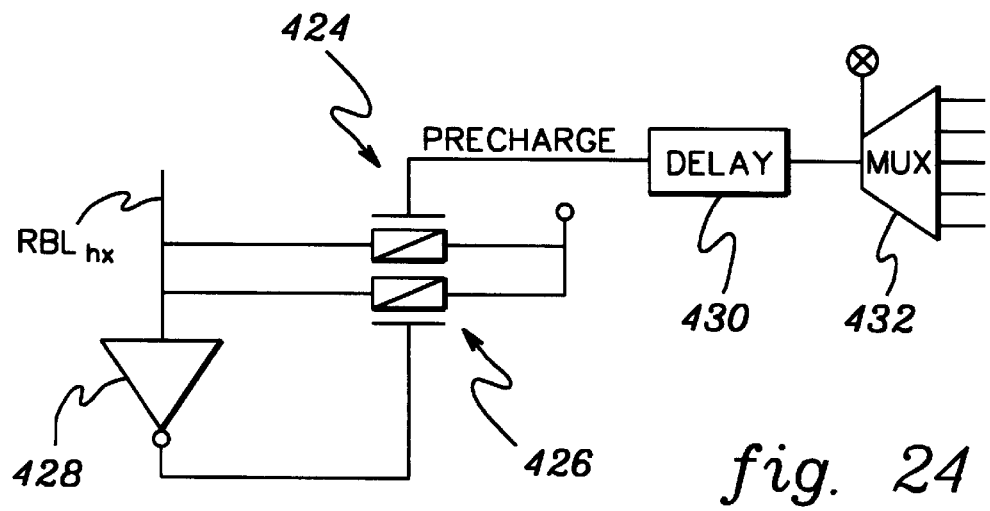
FIG. 24 is a schematic diagram of a precharge circuit.

Precharge circuits, as shown in FIG. 24, arc employed similarly as described hereinbefore with reference to FIGS. 18A and 18 B, for precharging the various hierarchy bit lines of read bit line hierarchy structures 108', and for precharging the various hierarchy bit lines of timing-read-bit-line-hierarchy-structure 406. Multiplexer 432 receives a select read clock from an associated read clock distribution hierarchy structure (not shown) of address bus 28 (FIG. 1A). Multiplexer 432 selects a given input for receiving an associated read clock in accordance with associated hierarchy configuration data. The output of multiplexer 432 drives pulse delay one-shot circuitry 430. Precharge FET 424 is a P-channel MOSFET that selectively couples respective bit line $RBL_{hx}$ to an upper supply voltage $V_{dd}$. FET 424 is selectively enabled in accordance with a precharge signal PRECHARGE, as received from pulse delay circuitry 430. During a read operation and upon receiving an appropriate read clock from multiplexer 432, pulse delay circuitry 430 drives the gate of FET 424 to assure that precharge FET 424 is disabled for a duration corresponding to the capture pulse duration of an associated hierarchy capture clock 408 as generated by generator 404 of read capture latch bank 400 (FIGS. 20–22). During the disabled duration, so long as the logic state of read bit line $RBL_{hx}$ is high, inverter 428 will drive the gate of noise suppression FET 426 to enable this transistor to act as a high resistance pull up resistor to an upper supply voltage $V_{dd}$ for suppressing noise artifacts that might be picked up on the read bit line. Pre-charge is disabled for a time period equal to or greater than that defined by the active edge of the read clock, and the inactive edge of the subsequent capture clock. This is longer than the duration of the capture clock. Capture clock dependency on a timing bit line which discharges associated bit line routing depends on precharge being off, with the suppression circuitry guaranteeing bit line stability.

The channel ON resistance of noise suppression FET 426 is made large enough so that ashen individual memory cells drive the associated read bit line, during a read operation, the state of the associated hierarchy read bit line may be altered. For example, if a given memory cell read provides a logic one to $RBL_{hx}$, inverter 428 inverts the 1 and outputs a 0 for keeping PFFT 426 in its noise suppression condition. In contrast, if the memory cell read provides a 0, the current sinking capabilities of the associated hierarchy read bit line (i.e. switches 252,254 of FIG. 18A) is greater than the current sourcing capabilities of noise suppression FET 426 such that the read bit line is pulled to a logic 0 condition, wherein inverter 428 toggles its output high. The gate of suppression FET 426 receives the high output of inverter 428, disabling the channel thereof. It will be understood that similar precharge circuits are employed for precharging the hierarchy bit lines of the bit line hierarchy structures associated with all bits of the memory array's word width.

Figure 25:
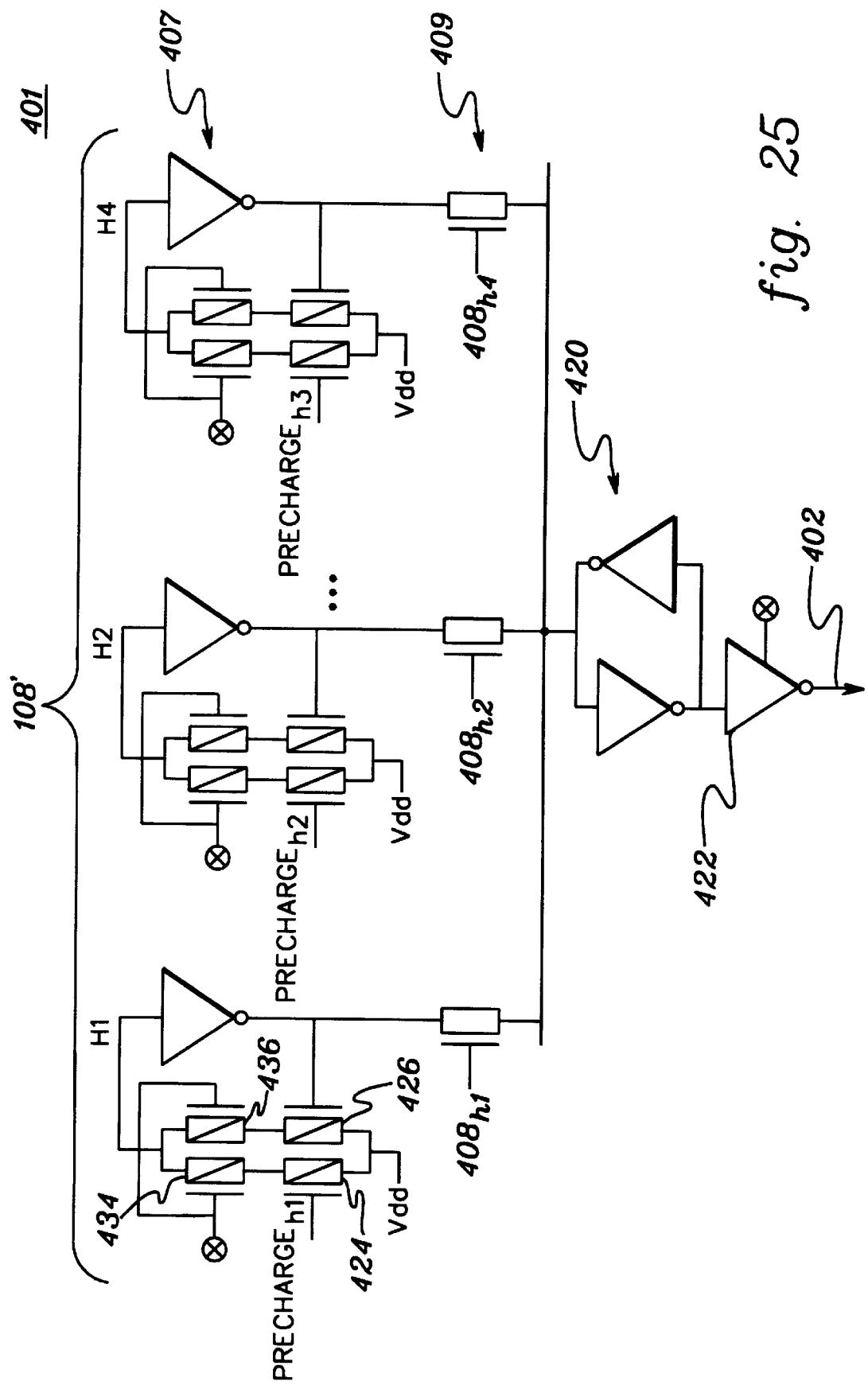
FIG. 25 is a schematic diagram showing precharge circuitry incorporated within a read capture latch.

With reference to FIG. 25, precharge circuitry is integrated together within a latch cell of read capture latch cell 401. In addition, extra selection PFETs provide selective ON/OFF precharge enable functionality. A primary P-channel MOSFET 424 has its channel disposed in series between a predetermined voltage source $V_{DD}$ and first hierarchy bit line h1 of the associated read bit line hierarchy structure 108'. The gate of primary precharge MOSFET 424 is driven by first hierarchy precharge signal PRECHARGE$_{h1}$. A secondary precharge P-channel MOSFET 434 has its channel disposed in series with the primary MOSFET 424 and has its gate driven in accordance with associated first hierarchy precharge configuration data (represented by the circle around the X). Inverter 407 inverts data as received from the first hierarchy bit line h1 and drives the gate of primary noise suppression FET 426 accordingly. Primary noise suppression FET 426 (similarly as described hereinbefore) suppresses noise on the first hierarchy bit line h1 during an interval wherein precharge MOSFET 424 has been disabled as associated with a read operation per the first hierarchy bit line. Secondary suppression FET 436 selectively gates this noise suppression functionality of the precharge circuit in accordance with the same first hierarchy precharge configuration data as that driving the gate of secondary precharge FET 424. The remainder of latch cell 401 operates similarly as described hereinbefore with reference to FIG. 23.

During a read cycle operation, the alternative read bit line structures and associated read capture latch operate as follows. Programmable memory array receives an active edge of a read clock which is distributed, per an appropriately configured read clock distribution hierarchy structure of address bus 28, to the various memory sub-array address units 20 and multiplexers 432 of associated precharge circuits. The precharge circuits accordingly drive respective hierarchy precharge transistors as described hereinbefore for enabling read data propagation on, and capturing from, associated hierarchy bit lines. Appropriate addressing per address units 20, and associated read clock synchronization, addressably activate a valid word line for selecting a given word of the array, at which time data of the word is gated for propagation down respective read bit line structures. At the same time, the addressably selected word line enables a dummy, (or timing) bit of the associated word for sending an active edge transition (timing signal) down a respective hierarchy timing bit line path of the associated timing-bit-line-hierarchy-structure of the sub-array. The (actual) data as read from the given word and the associated (dummy data) timing signal are sent (in parallel) down corresponding hierarchy paths of respective bit line structures. For example, assuming the programmable memory array is configured for employing a first hierarchy level h1 of the read bit line hierarchy structure, then so too will the timing-bit-line-structure be configured for employing a corresponding first hierarchy bit line h1. Accordingly, during a read operation, read data flows down an internal read bit line 56 (FIG. 2B) of a sub-array 12, and through associated routing structures for coupling to, and propagation down, a first hierarchy read bit line h1. Likewise, timing (dummy) data is similarly propagated upon a corresponding dummy structure. The timing data is gated from an extra hard wired (or pre-loaded) memory cell of the associated word, onto an analogous internal "timing" bit line 56', through a corresponding routing structure and down a corresponding hierarchy path of the timing-bit-line-structure. Accordingly, the timing data arrives at capture clock generator 404 (FIG. 21) at substantially the same time that the actual data, as read from the addressed word, arrives at the various latch inputs of latch bank 400. The rising edge of the timing signal, upon being received by generator 404, triggers creation of an appropriate hierarchy capture clock 408 for enabling corresponding hierarchy FETs 409 of respective cells 401 (FIG. 23) of latch bank 400 to capture data of the word into respective latches 420. Next, the associated hierarchy capture clock, as generated by capture clock generator 404, is fed back (via pulse delay block 410) to the feedback input 414 of capture clock generator 404 for clearing the respective hierarchy capture clock. Thereafter, precharge operation of respective precharge circuits are restored for enabling precharge of respective hierarchy bit lines.

In the alternative data interfacing structures for the FPMA 10 as described hereinbefore with reference to FIGS. 18A, 18B, 19 and 20, it is noted that the secondary I/O bus 38 (FIGS. 1A and 1B) and associated read/write bit line hierarchy structures 30/32 of the first described embodiment essentially collapse one upon the other. Accordingly, with reference to FIGS. 1A and 1E, it is not necessary to provide state machine access port 24 the two separate read ports to secondary read port intercoupling 38' and read bit line intercoupling 30'. Instead, state machine access port 24, for the FPMA embodiment of the alternative data interfacing structures, requires merely a single read port coupled to the single read bit line hierarchy structure.

In the embodiments of the present invention as described hereinbefore with reference to FIGS. 1A, 1B, 2A, 2B, 3 and 4, separate "write" and "programming" (initialization) access is provided to memory cells 48 of the respective memory sub-arrays 12. Accordingly, each memory cell 48 required a separately gated write input, MOSFET 82, and separately gated programming input, MOSFET 78, coupled to respective internal write bit lines 58 and programming bit lines PBL respectively.

Address Units

Figure 26A:
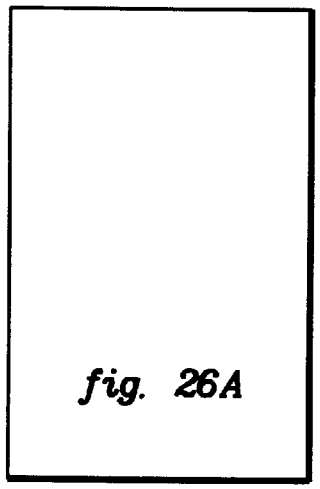
FIGS. 26A–26C are partial schematic diagrams illustrating an address unit.
Figure 26B:
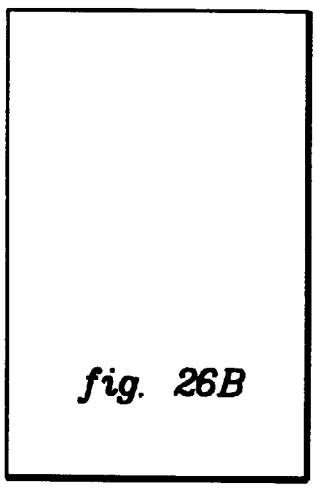
Figure 26C:
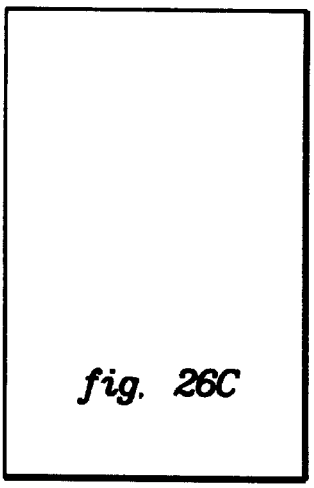
Figure 26A:
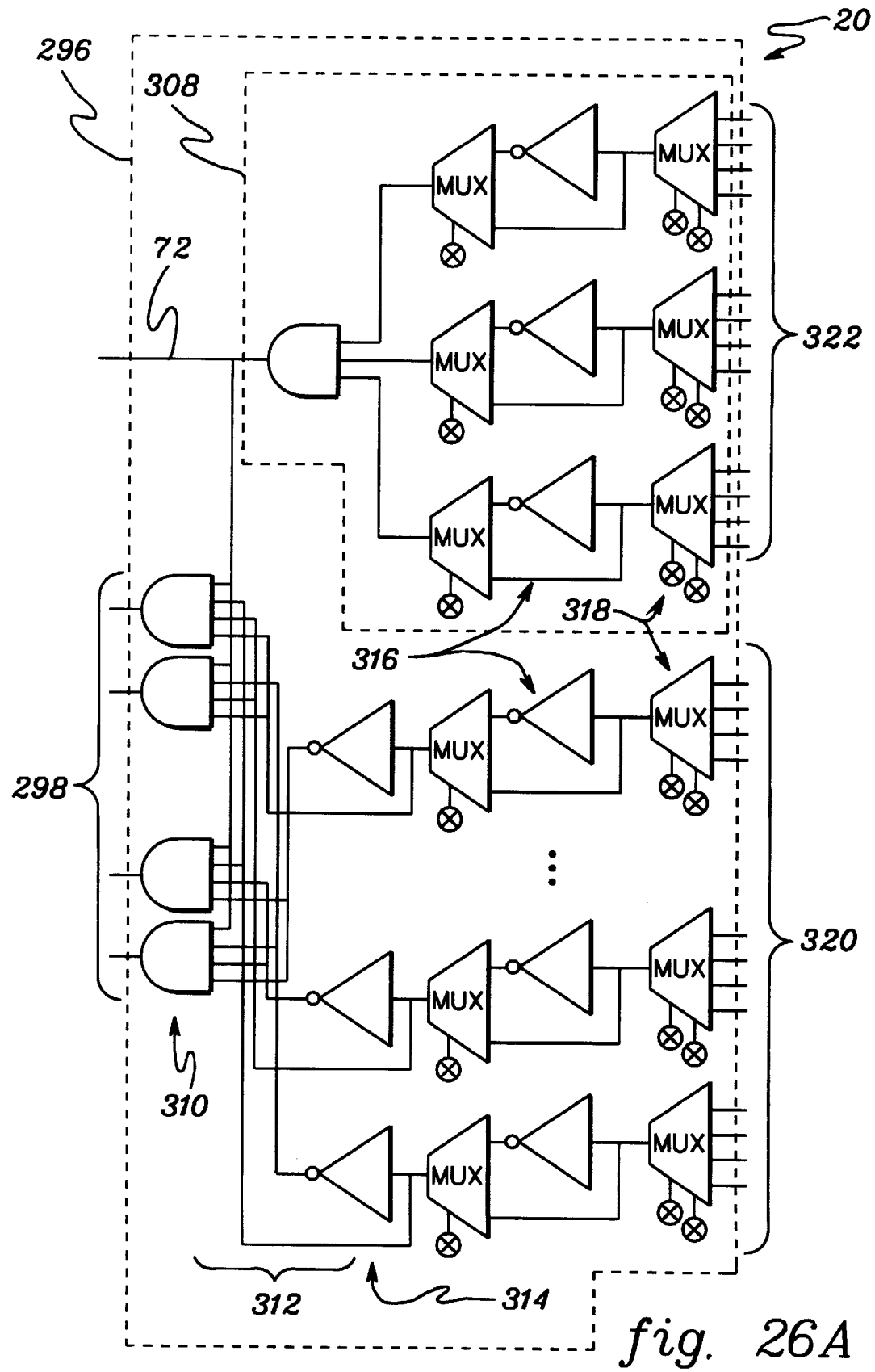
Figure 26B:
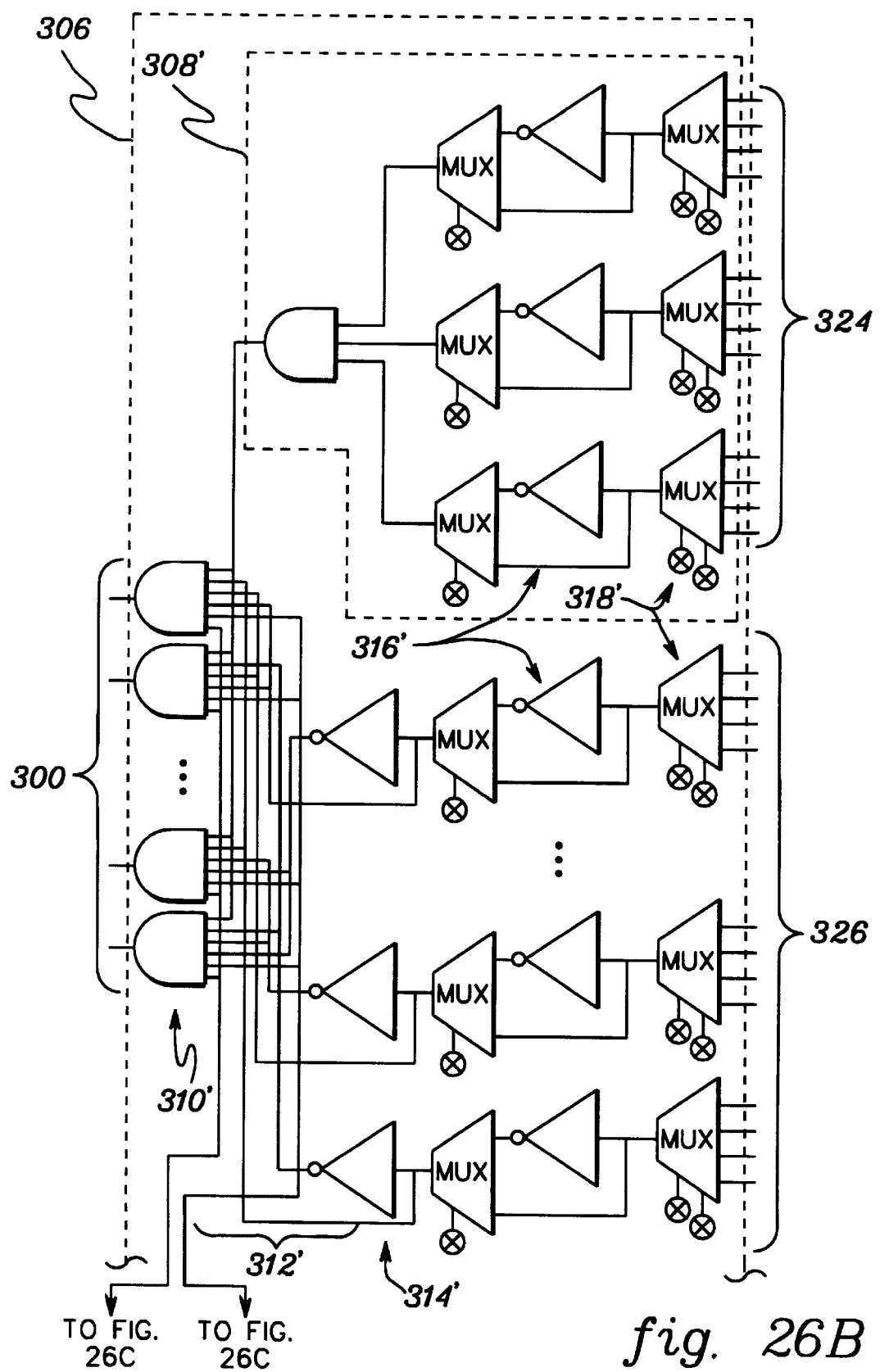
Figure 26C:
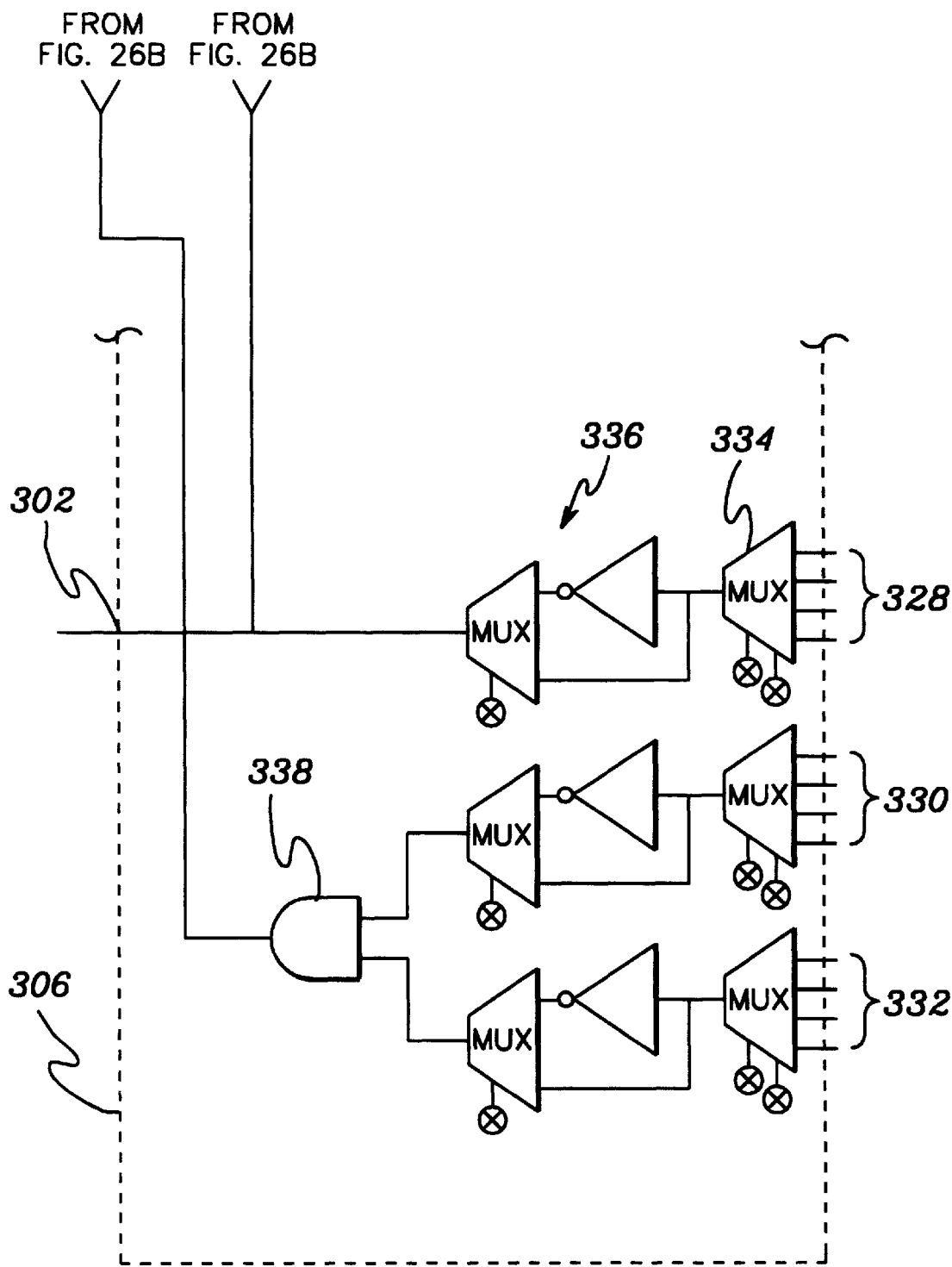

Addressing of FPMA 10, with reference to FIGS. 1A and 1B, is routed primarily along address bus 28. Address units 20 determine which of the memory sub-arrays 12 are addressed, and which of the respective word lines within the particular memory sub-arrays are accessed for sending or receiving data. With reference to FIGS. 26A, 26B, and 26C, each address unit 20 includes a read decoder portion 296 and a write decoder portion 306. Multiplexers 318 and signal polarity inversion circuits 316 determine from which address lines of address bus 28 and of what polarity to receive address information. Inverters 314, pre-code busses 312, 312' and AND gates 310, 310' provide standard address decode circuitry for activating a particular read/write word line, of respective plurality of read/write word lines 298/300, in accordance with associated read(320,322)/write (324, 326) addressing as provided at the outputs of the multiplexer of respective polarity inversion circuits 316. Inverters may be omitted for 320, but retained for 322.

In order to enable selection of a read word line of the plurality of read word lines 298, high order address decoder 308 of read decoder 296 must receive appropriate address data for activating high order address line 72. The high address decoder 308 receives address data at high read address inputs 322 as provided by select lines of address bus 28. Multiplexers 318 determine from which inputs to receive this high address information. Polarity circuits 316 are programmed (per associated configuration data) to establish a particular high end address by which to select high order address line 72. Once the appropriate high end address is received and propagated via associated multiplexers 318 and polarity circuits 316, high order address decoder 308 provides a high address enable signal via line 72 for enabling decoder AND gates 310. With reference to FIGS. 1B and 26A, the high order address lines 72 from the respective address units 20 are coupled to the associated high order address inputs of respective memory sub-arrays 12.

With reference to FIG. 2B, the high address enable signal of line 72 enables selective drive multiplexers 52 of the associated memory sub-array 12 for propagating read data, as read therefrom, to the associated read bit line structure. For example, when the FPMA 10 or a portion thereof, is configured to provide deep RAM functionality, each of the high order address decoder portions 308 will have respective multiplexers 318 and polarity inversion circuits 316 configured to activate respective high order address signal lines 72 via different and unique respective high order address data, so that each memory sub-array may be selectively enabled independently of the other memory sub-arrays. Alternatively, if the FPMA 10 or a portion thereof is configured to provide wide RAM functionality, (i.e. memory sub-arrays 12 in parallel side-by-side), each of the high order address decoders 308 of respective read address decoders 296 of address units 20 are configured, per respective multiplexers 318 and polarity inversion circuits 316, to be addressable by a same high order address. Multiplexers 318 of the high order address decoder 308 may alternatively be configured to select from known DC inputs for enabling, or alternatively disabling, high order addressing at all times. For example, when the memory sub-arrays are to be operated as separate independent memory units, it may be desired that the high order addressing be enabled continuously.

The number of address inputs 320 applied to the low order portion of the read address decoder is equal to that needed to fully address M words of its associated memory sub-array 12. Accordingly, M AND gates 310 selectively drive respective M read word lines 298. On the other hand, the number of high order address input bits 322 corresponds to that required for uniquely addressing the Z memory sub-arrays 12. In a simplified embodiment of the present invention, the selective polarity circuits 316 of the low order lines 320 of the read address decoder 296 are eliminated.

Write address decoder 306 functions similarly to the read address decoder 296 per respective high order addressing 308' and remaining low addressing decoder portions. However, AND gates 310' of the low order decoder portion and pre-code bus 312' include two additional secondary signal lines for implementing reset, write enable, and clock operation. The high order write address decoder 308' receives associated high write addressing from high write address inputs 324 for receiving high order addressing data to selectively enable associated decoder AND gates 310'. The lower order write addressing decoder portion receives associated lower order addressing data from low write address inputs 326. Again, respective multiplexers 318' and polarity circuits 316' determine from which addressing lines of address bus 28 and of what polarity to receive associated address data. In the simplified embodiment of the write address decoder, the polarity inversion circuits 316 of the write address decoder 306 associated with lines 326 are not provided. In addition, address decode can be done using one of many known techniques. Both the inverted and non-inverted signal lines are made available on pre-decode bus 312'. AND gates 310' provide standard decode circuitry for selecting a given word line 300.

With respect to FIG. 26C, the reset line 302 drives the reset input of its associated memory sub-array 12 as shown in FIGS. 1B and 2A. Multiplexer 334 determines from which of inputs 328 to receive a reset signal. Alternatively, multiplexer 334 may select an input of a known DC level. Polarity correction circuit 336 determines a polarity to be associated with the reset signal.

The remaining line of pre-code bus 312' is driven by AND gate 338. AND gate 338 receives two signals, a clock and an enable signal. The clock signal is received from address bus 28 via a given input of clock inputs 330 as selected by an associated multiplexer and polarity inversion circuit. The enable signal is received from address bus 28 via one of a plurality of enable inputs 332 as selected by an associated multiplexer and (optional) polarity inversion circuit.

Either of the associated clock or enable multiplexers and associated polarity inversion circuits can be programmed for enabling, or disabling, associated AND gate 338 continuously. Disabling AND gate 338 prohibits write functionality within the associated memory, preventing data corruption therein and providing read only functionality for the FPMA. AND gate 338 and its associated clock signal provides the basis for synchronous write functionality within FPMA 10. The write clock signal, is activated for a sufficient duration to activate a given write word line and enable the transfer of data into the associated addressed word location of the memory array. In an alternative embodiment for the write decoder 306, a one-shot (not shown) is disposed between the output of AND gate 338 and decoder AND gates 310' for providing a one-shot pulse of sufficient write duration, upon being triggered appropriately by AND gate 338 per the write and enable signals.

In one application, the enable signal is driven for providing respective bit write programming of the FPMA. For example, when the FPMA, or a portion thereof, is configured with respective memory sub-arrays side-by-side, i.e. wide RAM, it may be required that only one word thereof receive write data at a time. Therefore, the specific memory sub-array 12 which is to receive associated word programming data is selectively enabled per its associated enable input 332. Alternatively, the multiplexer associated with the enable input can be programmed for enabling one input of AND gate 338 at all times.

In the embodiments discussed above wherein precharge bit line structures are implemented, read decoder 296 may have as an additional input a read clock which is sourced from the address multiplexer circuitry similar to that in the write decoder. The read clock could alternatively be held active to implement asynchronous functions.

Clock Units

As mentioned hereinbefore, the field programmable memory array 10 of the present invention can be configured to operate in LIFO/FIFO, or rollover modes wherein the words of the various memory sub-arrays 12 are employed as a stack. In a LIFO operating mode, data is taken off of the stack in reverse order in which it is placed onto the stack, i.e. Last In First Out. In a FIFO operating mode, data is taken off the stack in the same order in which it is placed onto the stack, i.e. First In First Out. In a rollover operating mode, stack access is provided via a particular word window, wherein the data of the stack is sequenced past the access window as data is shifted within the stack. As data shifts occur within the stack, data at the top of the stack rolls to the bottom of the stack. Conversely, if the stack rotation is in an opposite direction, data of the bottom of the stack is rolled to the top of the stack. Clock units $22_1, 22_2 \ldots 22_Z$, as shown in FIGS. 1A and 1B, are associated with memory sub-arrays $12_1, 12_2 \ldots 12_Z$ respectively for generating associated read/write clocks and for keeping track of stack advancements or descents.

Figure 27A:
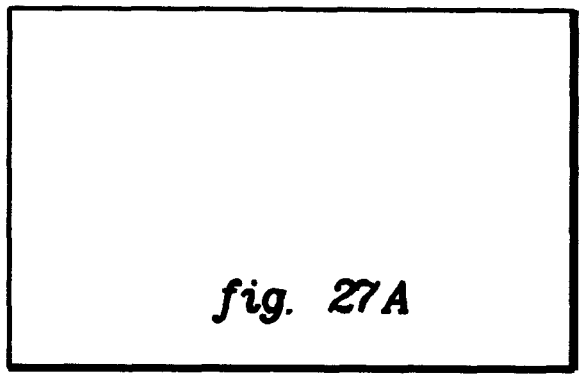
FIGS. 27A–27C are simplified schematic diagrams representative of a clock unit.
Figure 27B:
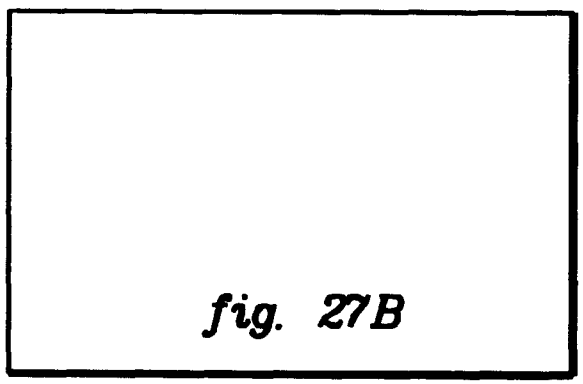
Figure 27C:
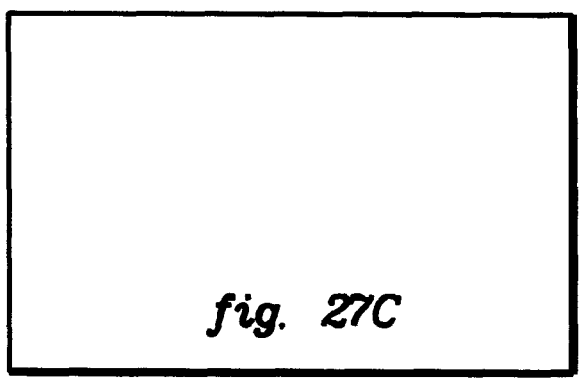
Figure 27A:
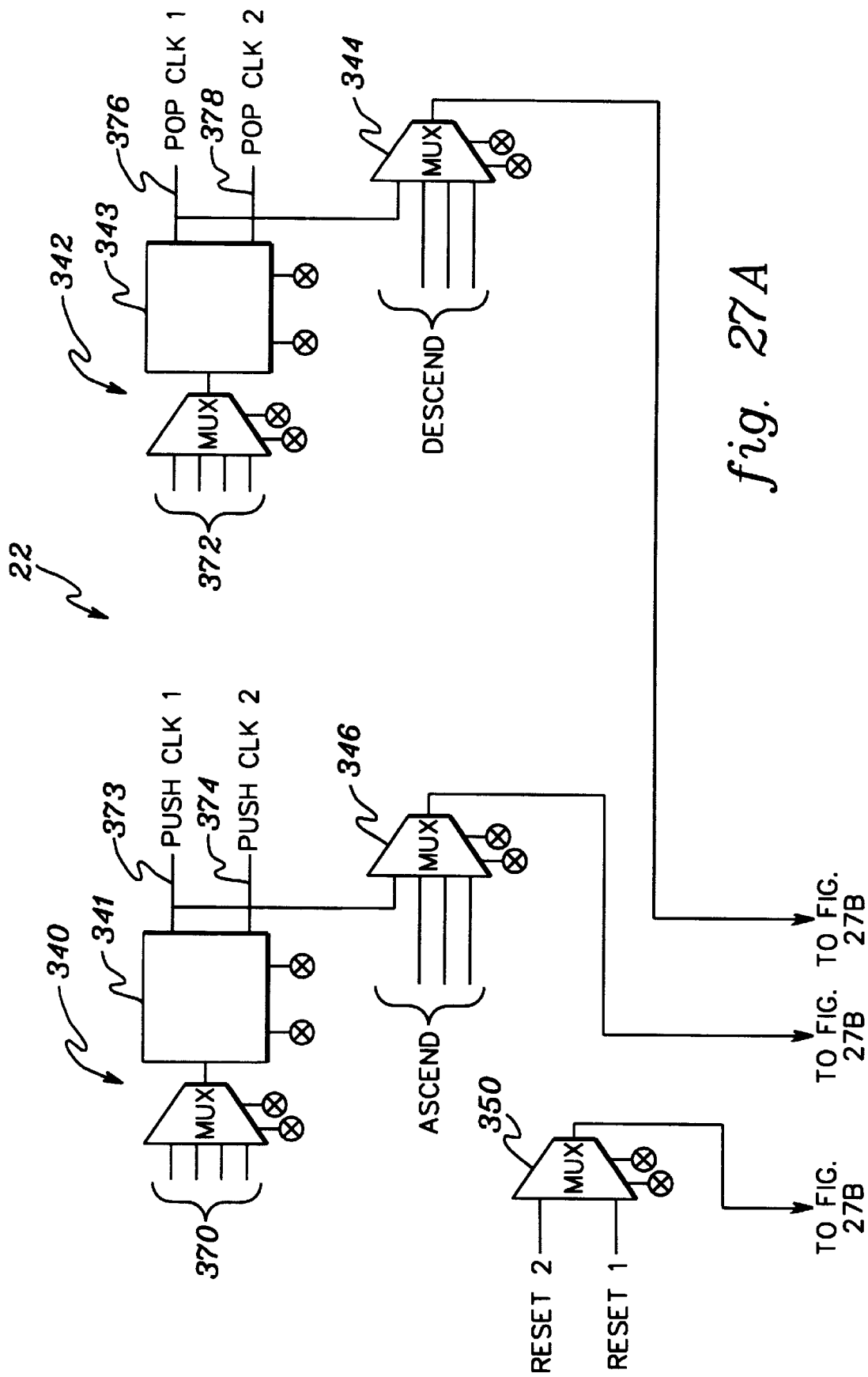
Figure 27B:
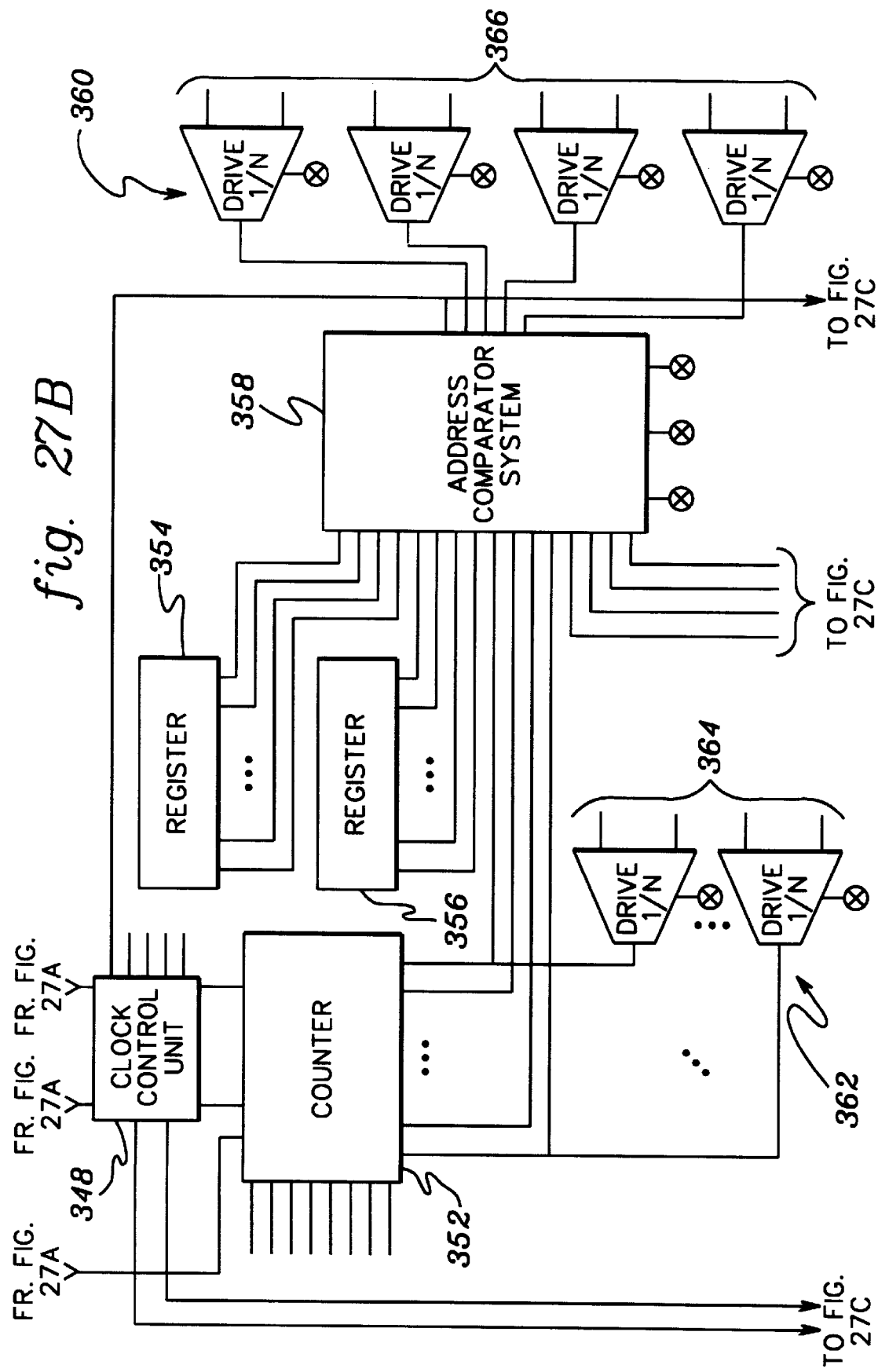
Figure 27C:
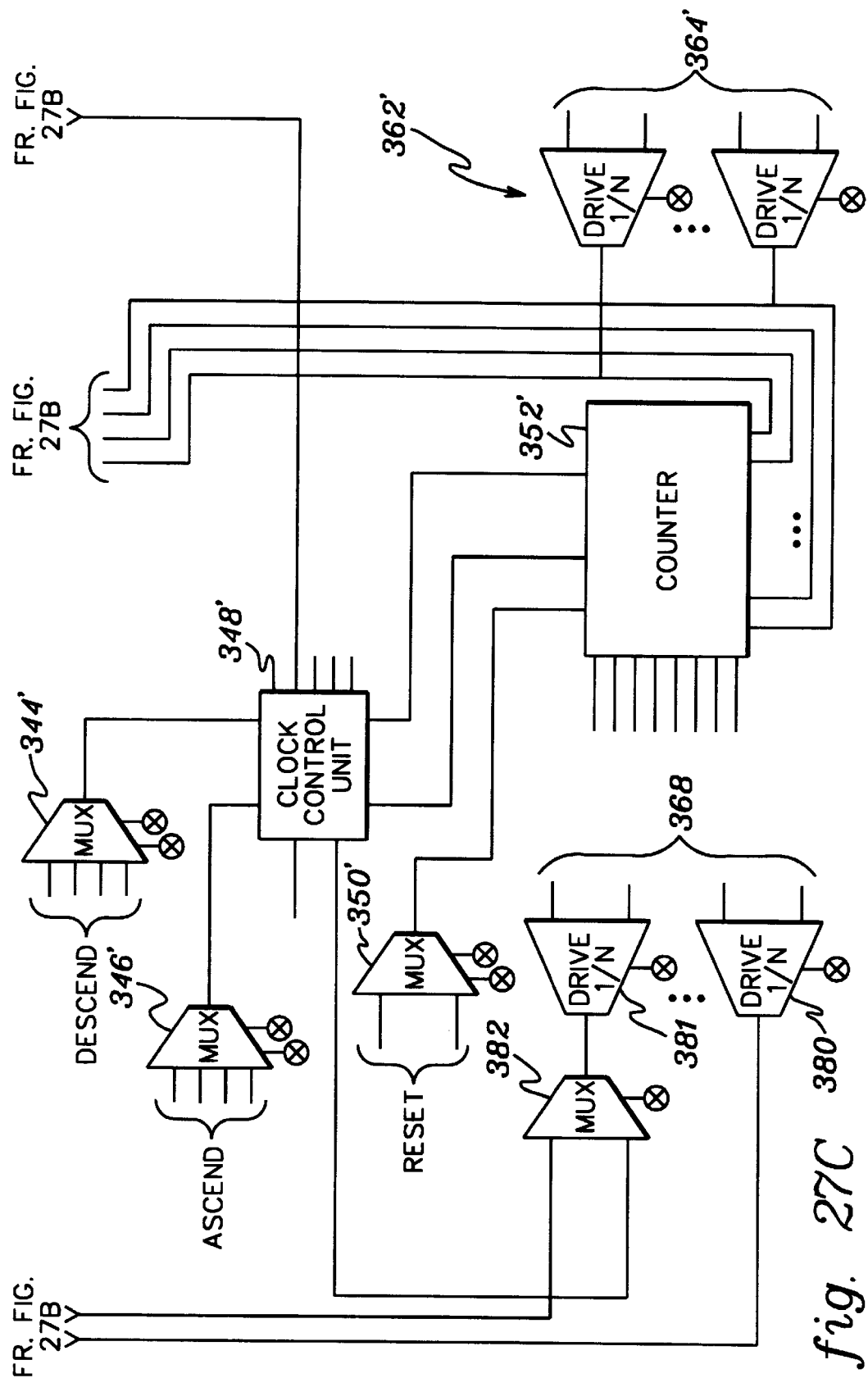
Figure 28A:
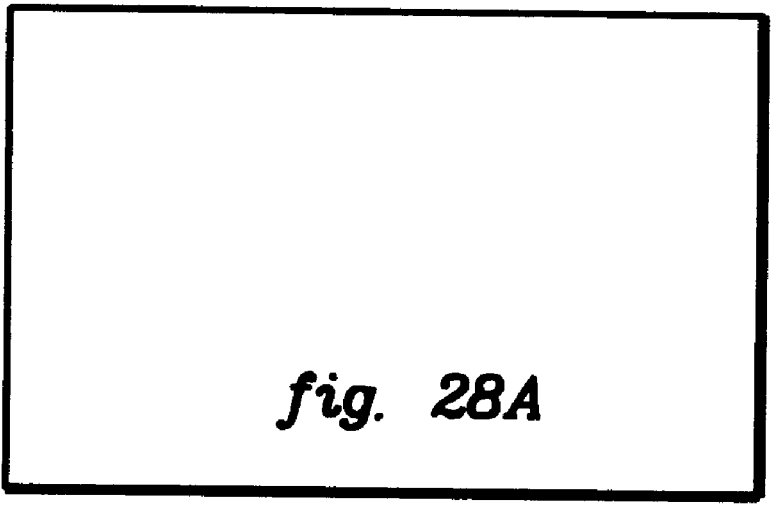
FIGS. 28A–28B are partial schematic diagrams representative of a state machine access port.
Figure 28B:
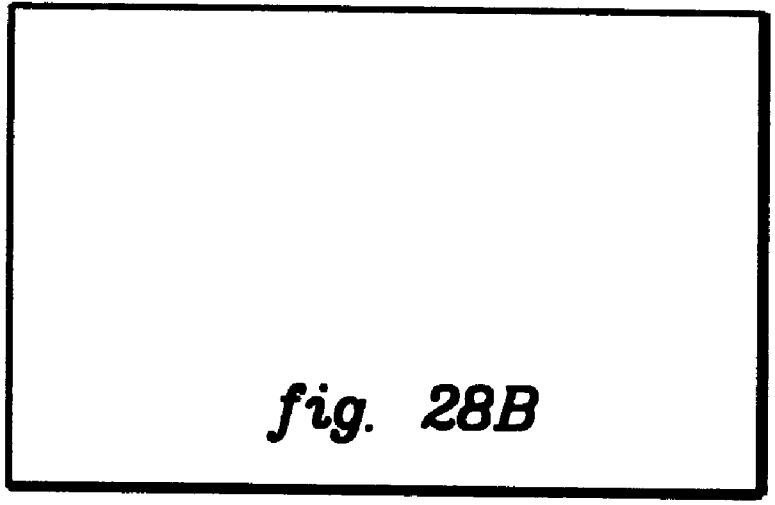
Figure 28A:
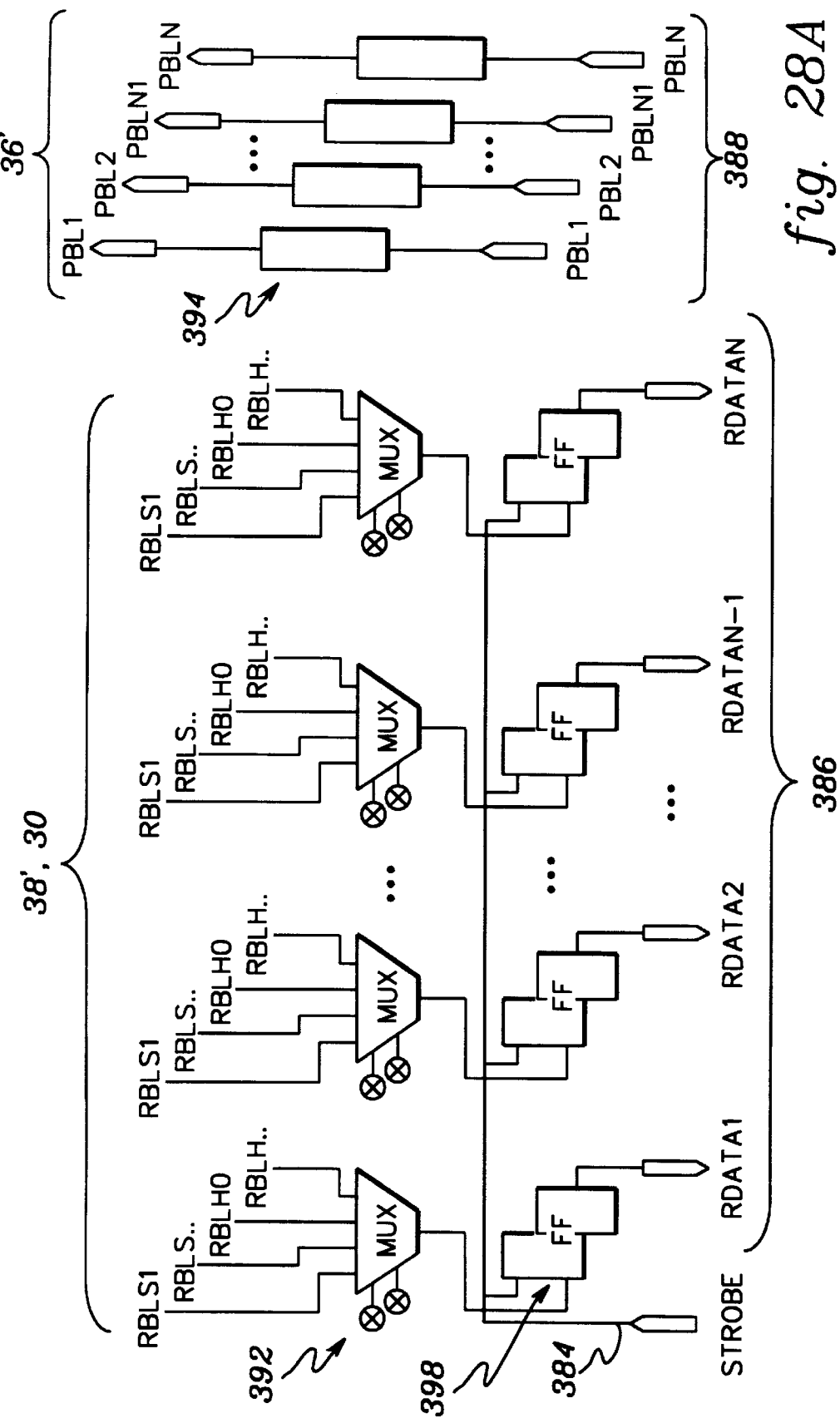
Figure 28B:
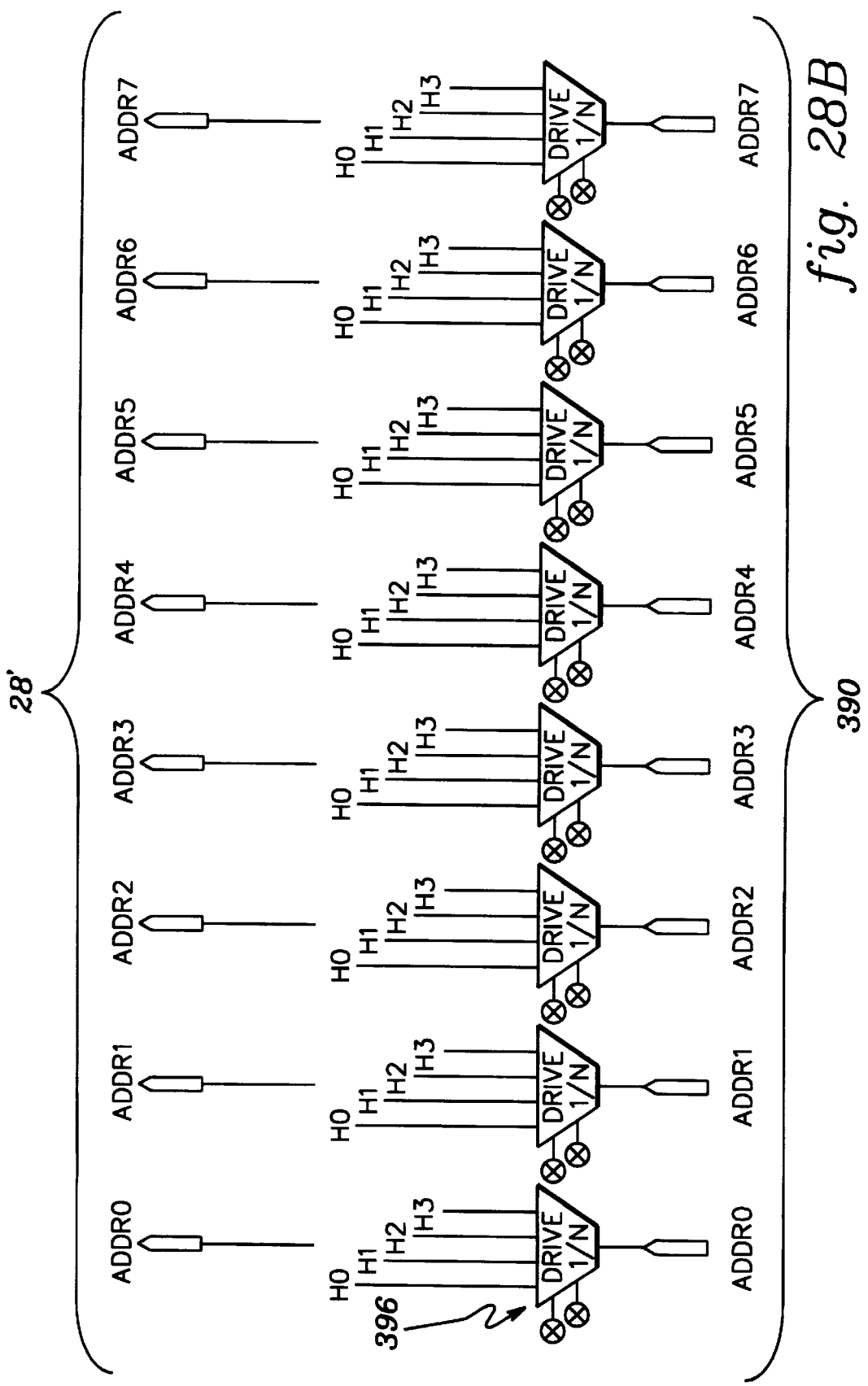

With reference to FIGS. 27A, 27B, and 27C, clock unit 22 includes push clock splitter 340, and pop clock splitter 342. Each clock splitter has an input multiplexer for receiving a select clock signal from one of various clock inputs 370,372 respectively, tied to respective subsets of available address lines of address bus 28. It will be noted that the address lines may comprise hierarchy structures similar to the read and write bit line hierarchy structures as described hereinbefore. Splitter 341 receives a clock signal as selected by its associated multiplexer and generates two non-overlapping first and second phase push clock pulses from the single clock input. The configuration data applied to splitter 341 enable selective polarity correction (optional) of the incoming clock and mode selection for forcing both output clocks into an inactive condition. In normal operations, push clock splitter 340 provides the first and second phase push clock signals via respective interconnects 373 and 374 respectively, to its associated memory sub-array 12, as shown in FIG. 2A. Likewise, pop clock splitter 342 is programmable for providing two non-overlapping first and second phase pop clock pulses via pop clock outputs 376 and 378 respectively, to its associated memory sub-array 12. As shown and described hereinbefore with reference to FIG. 2B, the respective push and pop clock pulses drive transfer cells 50 between respective memory cells of the associated memory sub-array for enabling vertical shifting of data between the memory cells.

Clock unit 22 also includes additional circuitry for keeping track of stack increments and decrements for "physical" LIFO/FIFO operating modes wherein data is actually transferred vertically within a stack as described hereinbefore, or alternatively for keeping track of addressing sequences in a "logical" LIFO/FIFO operating mode. In the "logical" LIFO/FIFO operating mode, pointers keep track of which address location within the stack to place data, and from which address location within the stack to extract data. Accordingly, in the "logical" operating modes, data is transferred in and out of the memory stack using normal read/write data transfers as addressed per respective pointers, without requiring vertical shifting of data therein.

A counting system of clock unit 22 comprises essentially two address counters 352,352' and two boundary registers 354, 356. For physical LIFO/FIFO operating modes, the counters are updated per respective push and pop clock pulses. Address counter 352 receives respective increment or decrement signals from clock control unit 348 upon appropriate triggering by respective initiation signals received from multiplexers 344, 346. In the physical LIFO/FIFO operating modes, these multiplexers 344, 346 select respective pop and push signals as generated by pop and push clock splitters 342, 340. Data in counter 352 is then compared to data of boundary register 354 or 356 for insuring against a stack overflow. The data comparison is provided by address comparator 358. If an overflow condition is present, address comparator 358 generates an appropriate overflow flag which is propagated to a select line of address bus 28 via an associated drive multiplexer 360 for propagation outside of the FPMA.

Multiplexers 350 and 350' enable selective coupling of appropriate reset signals from address bus 28 to counters 352 and 352' respectively. When receiving a reset signal, the associated counter has its internal count reset to a predetermined load value as programmed into respective load registers inside the counter. These particular internal load registers of the counters are programmed with given load values during boot-up configuration of the FPMA.

For logical LIFO/FIFO operating modes, address counters 352, 352' operate as address pointers for indicating write and read address locations of the respective memory sub-arrays. In the LIFO operating mode, counter 352 provides both the read and write addresses associated with sending data into, or receiving data from, memory. When clock control unit 348 receives a descend command, via multiplexer 344, it signals address counter 352 to decrement its address register.

In addition, clock control unit 348 generates an appropriate read signal which is sent to select lines 368 of address bus 28, or alternatively one of the I/O data buses, via associated selective drive multiplexer 381. Alternatively, in writing data to the stack, multiplexer 346 receives an ascend signal from a select line of address bus 28, and transfers this ascend command to clock control unit 348. Clock control unit 348 accordingly forwards an increment signal to address counter 352 and a write signal to a line of address bus 28 via selective drive multiplexer 380. Selective drive multiplexers 362 selectively couple the respective LIFO read/write addressees of counter 352 to select lines 364 of address bus 28.

It will be understood that clock control units 348, 348' provide the timing as necessary between respective increment or decrement signals, and associated write and read signals such that the appropriate read/write addresses of respective counters are presented to the address bus in appropriate synchronization with associated read/write signals.

For the logical FIFO operating mode, two address counters are required, one counter 352 for indicating an address for writing data into the stack, and the other counter 352' for keeping track of which addressable memory location to extract data. When data is written into the stack, clock control unit 348 receives an ascend command via multiplexer 346 and accordingly signals address counter 352 to increment its address count. Clock control unit 348 additionally generates and forwards an appropriate write signal to its select line of the associated address bus 28, or alternatively the I/O data bus, via selective drive multiplexer 380. When data is read from the stack, clock control unit 348' receives an ascend command via multiplexer 346', and accordingly sends a read signal to a select line of address bus 28, via multiplexer 382 and selective driver multiplexer 381. Accordingly, counter 352 provides pointer address for writing data onto the stack, while counter 352' provides the pointer address for reading data from the stack.

Multiplexer 382 selects from which clock control unit, 348 or 348,' to receive the read signal, in accordance with whether or not LIFO or FIFO operation is selected. In LIFO operation, the clock control unit 348 receives both ascend and descend commands and counter 352 provides both read and write addresses for reading from and writing to the memory sub-array. Accordingly, the read signals sourced by clock control unit 348 are coupled to multiplexer 381 via multiplexer 382. In FIFO operation, it is a separate address counter that provides the read address and a separate clock control unit 348' that generates the read signal. Accordingly, multiplexer 382 is programmed in an alternative state for selecting a read signal from clock control unit 348' instead of 348.

In the case of the FIFO operating mode, address comparator 358 compares the address of counter 352 against the address of counter 352' for assuring that one address (either read or write) does not overrun the other address. Should one address overrun the other, address comparator 358 has an output coupled back to clock control units 348 and 348' for signaling an overflow condition, whereupon the clock units may be disabled for preventing stack corruption. Address comparator 358 also compares the addresses of respective counters associated boundary registers 354 or 356. When a given address counter reaches an associated boundary value, the address comparator 358 generates an appropriate flag which is forwarded to a select line of address bus 28 via a selective drive multiplexer 360 and lines 366. In one particular embodiment of the present invention, the flag is propagated to external circuitry, e.g. a configured FPGA, which may then acknowledge the boundary condition and provide a reset signal via multiplexers 350 or 350' to the appropriate address counter 352 or 352'. In this fashion, the stack may be recycled in the FIFO operating mode.

Note, that a clock unit is preferably provided for each memory sub-array 12, as shown in FIG. 1. Alternatively, fewer clock units may be provided in alternate embodiments, resulting in decreased flexibility but decreasing costs in devices and area. Accordingly, separate LIFO or FIFO units may be configured in each of the memory sub-arrays. However, it is only necessary to have at least one such clock unit for the combination of memory sub-arrays, wherein a group of sub-arrays are combined together to provide an enlarged stack. Accordingly, the address counters and associated boundary registers have a sufficient number of bits for fully addressing a stack comprising all Z memory sub-arrays.

The clock units themselves can be configured via configuration data to support multiple array sizes ($2^N$ words). This would include a capability to program read/write address compare systems (e.g., 358) to compare only pertinent address bits and gate the appropriate number of address bits to the address buses of the FPMA.

State Machine Access Port

State machine access port 24, with reference to FIGS. 1A, 1E, 28A and 28B, provides an alternative direct access to the FPMA. In one particular application, a state machine of configuration logic of a known FPGA accesses the memory array as a cache for storing programming data which the state machine will subsequently retrieve for reprogramming various resources of the field programmable gate array. Flip/Flops 398 latch data as read from field programmable memory array 10 and output this latched data to the state machine read port 386. In the particular embodiment of the present invention, wherein the FPMA 10 includes both read bit line intercoupling 30' and secondary I/O intercoupling 38', multiplexers 392 selectively couple flip/flops 398 for receiving read data from one of the two alternative paths. Accordingly, when the FPMA is being used for FPGA configuration cache storage as discussed above, the associated cache memory sub-array need not be limited to the physically adjacent memory sub-array, $12_1$. Indeed, for example memory sub-arrays $12_2$, $12_3$ . . . $12_z$, could be configured for serving as the cache memory with access thereto being provided by the alternative secondary I/O bus 38 via the secondary read port intercoupling 38'. In the alternative embodiment of the present invention, wherein the secondary I/O bus 38 and the read bit line hierarchy structures 30 collapse one upon the other (as described hereinbefore with reference to FIGS. 16–19 and 20–25), multiplexers 392 may be eliminated and the inputs of flip/flops 398 coupled directly to the alternative embodiment read bit line hierarchy structures.

When reading data via the state machine access port from FPMA 10 (FIG. 1A), an address is presented to address port 390 (FIGS. 1E and 28B) of state machine access port 24. Selective drive multiplexers 396 forward the address data to select lines of address bus 28 via the address interconnect 28'. Subsequently, read data of the addressed field programmable memory array, in the multiple read port embodiment, passes through one of the alternative data paths as selected by multiplexers 392, and is received at the inputs of flip/flops 398. A read strobe is then applied, via strobe input 384, to the flip/flops for capturing the read data as retrieved from the field programmable memory array.

To store data (e.g. initialization data) into the FPMA 10 via state machine access port 24, the state machine of the FPGA (not shown) for example, presents data to the programming bit line interconnects 388 which are coupled to the programming bit line intercoupling 36' of the FPMA 10 via bit line interconnects 394. As mentioned hereinbefore, the programming bit line bus 36 provides direct access to memory cells 48 of the memory sub-arrays 12 as addressed in accordance with associated programming word lines. Accordingly, standard address decoding circuitry (not shown) decodes associated programming addresses and drives select programming wordlines 302 (FIG. 1B, and PWLs of FIGS. 2A and 2B) for enabling data transfer into the desired memory cells 48.

Asynchronous Read

An embodiment of the invention enabling asynchronous operation of the above disclosed array is presented.

Figure 29:
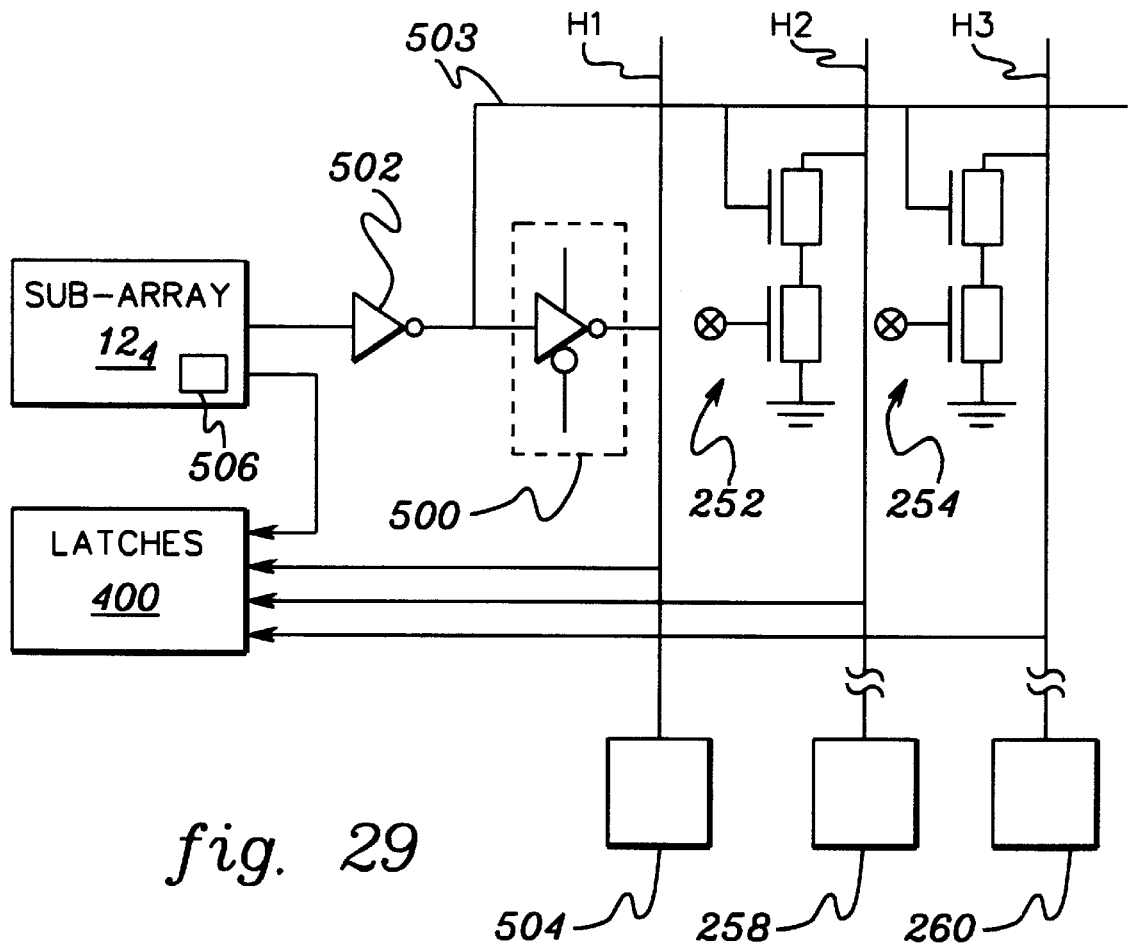
FIG. 29 is a partial schematic diagram of an alternative bit line interface structure allowing asynchronous operation.
Figure 30:
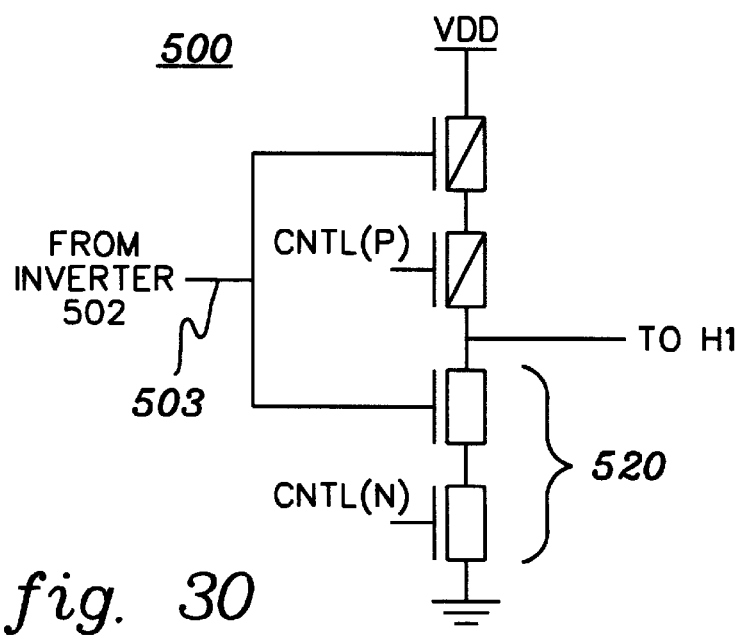
FIG. 30 is a schematic diagram of a device of FIG. 29.

In synchronous mode, internal read bit line network (net necessarily a single bus) is precharged given the process outlined in prior sections and represented by block 506 of FIG. 29 as controlled by appropriate signals. Upon receipt of a valid word line signal at a memory cell of sub-array $12_4$, memory cell data is gated onto the internal read bit line network 506. Cell data either discharges the internal bus precharge or reinforces the precharge value (cell output can drive in either direction). The value on the internal network is inverted via device 502 which provides output signal 503 sourcing connections to upper hierarchy bit lines H2, H3. In an array configured to use the first level hierarchy H1 of the data bus, device 500 (FIG. 30) will provide transmission between its input and output H1. Device 500 is a tristate inverter with separate N and P transmission selection gates CNTL (N) and CNTL (P) and reversed stack order of NFETs and PFETs to provide for minimum output capacitance at 111 in synchronous mode. Tristate control of the connection between 503 and H1 obeys the following truth table where SEL is a configuration bit responsible for allowing connection of the sub-array to this hierarchy, ASYNC is a configuration bit determining whether the read mode is asynchronous (1) or synchronous (0) and HOA is the decoded high order address value (1 is active, 0 inactive) (Those skilled in the art will recognize that logic having inputs SEL, ASYNC and HOA; and outputs CNTL (N) and CNTL (P) can be implemented in a number of ways.):

| ASYNC | SEL | HOA | CNTL (N) | CNTL (P) | COMMENT |
|---|---|---|---|---|---|
| 0 | 0 | 0 | 0 | 1 | H1 not selected |
| 0 | 0 | 1 | 0 | 1 | H1 not selected |
| 0 | 1 | 0 | 1 | 1 | Synchronous mode enables N stack only, HOA is don't care |
| 0 | 1 | 1 | 1 | 1 | Synchronous mode enables N stack only, HOA is don't care |
| 1 | 0 | 0 | 0 | 1 | H1 not selected |
| 1 | 0 | 1 | 0 | 1 | H1 not selected |
| 1 | 1 | 0 | 0 | 1 | Asynch mode, HOA not valid |
| 1 | 1 | 1 | 1 | 0 | Asynch mode + HOA enables bidi drive |

As can be seen in the above table, in synchronous mode, data will be transferred via the N stack 520 of 500 with possible discharge of bit line H1 dependent on data value. Connection to upper hierarchies is made via N-stack devices 252 and 254, and pre-charge thereof via 258 and 260, in a manner described in previous sections (no asynchronous capability for upper hierarchies is provided in the embodiment depicted, although it would be possible).

Data transferred along any of 506, H1, H2, H3 can be latched at capture latch bank 400 given a capture clock as derived by capture clock generation unit using timing read bit line data as discussed above.

For asynchronous operation, precharge devices within blocks 504 and 506 are turned off via configuration bits. Data propagated by the memory cell sub-array is inverted by device 502. Given a valid high order address along with proper SEL and ASYNC settings as defined above, device 500 provides a tristate interface with bit line hierarchy H1 to transfer data of either polarity without precharge. (Longer delays are thus tolerated in asynchronous mode given the absence of pre-charge.) Capture clock generation circuitry as previously discussed may be forced inactive via a set pin to the set dominant DFF as controlled via configuration bit, allowing data from either an internal bit line or H1 to propagate through the latch circuitry in an asynchronous manner. Asynchronous operation is not designed into upper level hierarchies H2 or H3 in the embodiment depicted and therefore, blocks 252 and 254 will not be enabled via configuration bit in this mode, although it is possible that alternative embodiments will incorporate asynchronous operation at higher levels of hierarchy.

It should also be noted that the internal read bit line network in the sub-array can be a two tier communication network in the sub-array, the first tier, connecting 16 cells, and terminating in a structure similar to 500 with gating control provided by ASYNC and an internal x16 decode line within the address section, and precharge controlled in a like manner to that described for block 504, and a second tier connecting the terminus of the first tier, and providing connection to 506 and 502.

Accordingly, what has been disclosed is a field programmable memory array which can be configured to provide wide RAM functionality, deep RAM functionality, multiple RAM functionality, LIFO/FIFO functionality, and rollover capabilities.

In addition, the field programmable memory array was disclosed at being employed as a local cache for an external circuit such as a field programmable gate array.

Memory cells of the associated memory sub-arrays were disclosed with multiple inputs and multiple outputs, and also with optional associated transfer circuitry for providing serial scan or vertical shift capabilities in alternate embodiments.

To support various arrangements for the memory sub-arrays of the field programmable memory array, programmable data line structures of various hierarchy and associated routing resources were disclosed for propagating data to or from the memory cells of the field programmable memory array.

Programmable address units were also disclosed for enabling appropriate address decoding in support of the various memory arrangements and functionalities. Programmable clock units were disclosed for generating the clock signals for accessing the memory and implementing physical or logical LIFO/FIFO functionalities within the respective memory sub-arrays.

Finally, the state machine access port was disclosed for permitting the field programmable memory array to be accessed more directly by external circuitry, for example, a state machine of an associated field programmable gate array.

In the absence of any explicit language to the contrary, when a term or phrase such as "each X" is used herein when referring to any collection or plurality of Xs, it should be understood that only two Xs are required to initially satisfy the collection or plurality, and that the term or phrase such as "each X" would therefore refer only to the Xs needed to initially satisfy the collection or plurality. Other Xs may exist outside of the satisfied collection or plurality which may therefore not be necessarily encompassed by the term or phrase such as "each X."

It will be evident to one of ordinary skill in the art that there are numerous ways of providing the connections required in the multiplexers, switches, etc., discussed above. For example, a signal path in a multiplexer could comprise a pass transistor, an EPROM, a fusible link or an anti-fuse which effects the desired isolation or connection between the attached lines. A user, upon requiring a connection through any particular structure, would then only be required to perform the proper programming to effect the connection. A laser-program device could also employ optional welds at the intersection. The required connections are provided either by including or excluding the weld. A mask-program device would simply include or omit the relevant connections. Any structure for signal selection in which before programming, a plurality of signals are available for selection, and after programming, one of the signals is selected and a path provided between the two lines, is referred to herein as a multiplexer. Thus, a multiplexer, as used herein and unless otherwise expressly indicated, can support unidirectional or bidirectional connections. In addition, a single multiplexer depicted herein may actually be a hierarchical multiplexing scheme including many stages of signal selection. A "connection," as used throughout herein, and unless otherwise expressly indicated, broadly denotes either a direct, conductive connection between conductors, or an indirect (e.g., buffered/inverted) interface in which the information from one conductor is nevertheless supplied to the other conductor. Similarly, an "input" or an "output" denotes either a direct or indirect (e.g., buffered/inverted) interface, unless otherwise expressly indicated.

The terms "enable signal, enable data, etc." as used herein, should be broadly construed to encompass any type of signal which could effect the necessary circuit state. Enable signals could be logic signals, clock signals, etc. In addition, the term "signal" when used herein, may be a single signal line, or a plurality of signal lines, and generally denotes the presence of data necessary to effect the proper circuit operation.

The term "array," when used herein, broadly denotes either the entirety of circuits formed on an integrated circuit or multiple integrated circuits forming a system, or any arbitrarily sized portion of the circuits in an integrated circuit or multiple integrated circuits forming a system. Thus, one larger array may be considered to comprise many smaller arrays.

While the invention has been particularly shown and described with reference to preferred embodiments thereof, it will be understood by those skilled in the art that various other changes in form and detail may be made therein without departing from the spirit and scope of the invention.

What is claimed is:

1. A programmable intercoupling circuit of a programmable memory array having a primary I/O bus and a secondary I/O bus, said programmable intercoupling circuit comprising:

a first selective coupler having an output and a plurality of inputs, inputs of said plurality of inputs being coupled to select primary interconnects of said primary I/O bus interconnects, said first selective coupler being programmable for selectively propagating a signal between said output and one input of said plurality of inputs in accordance with a first select signal; and a second selective coupler having an input electrically coupled for receiving a signal associated with the output of said first selective coupler, and a plurality of outputs, outputs of said plurality of outputs being coupled to select secondary interconnects of said secondary I/O bus, said second selective coupler being programmable for selectively propagating a signal between said input and a selectable one output of said plurality of outputs in accordance with a second select signal.

2. A programmable intercoupling circuit of a programmable memory array having a primary I/O bus and a secondary I/O bus, said programmable intercoupling circuit comprising:

a first selective coupler having an output and a plurality of inputs, inputs of said plurality of inputs being coupled to select primary interconnects of said primary I/O bus interconnects, said first selective coupler being programmable for selectively propagating a signal between said output and one input of said plurality of inputs in accordance with a first select signal; and a second selective coupler having an input electrically coupled for receiving a signal associated with the output of said first selective coupler, and a plurality of outputs, outputs of said plurality of outputs being coupled to select secondary interconnects of said secondary I/O bus, said second selective coupler being programmable for selectively propagating a signal between said input and one output of said plurality of outputs in accordance with a second select signal, wherein said first selective coupler comprises a multiplexer and said second selective coupler comprises of 1-of-N driver.

3. A programmable intercoupling circuit of a programmable memory array having a primary I/O bus and a secondary I/O bus, said programmable intercoupling circuit comprising:

a first selective coupler having an output and a plurality of inputs, inputs of said plurality of inputs being coupled to select primary interconnects of said primary I/O bus interconnects, said first selective coupler being programmable for selectively progpagating a signal between said output and one input of said plurality of inputs in accordance with a first select signal; and a second selective coupler having an input electrically coupled for receiving a signal associated with the output of said first selective coupler, and a plurality of outputs, outputs of said plurality of outputs being coupled to select secondary interconnects of said secondary I/O bus, said second selective coupler being programmable for selectively progatating a signal between said input and one output of said plurality of outputs in accordance with a second select signal, said programmable intercoupling circuit further comprising a programmable polarity circuit electrically disposed for propagating a select signal between the output of said first selective coupler and the input of said second selective coupler, said programmable polarity circuit being programmable for selectively inverting the polarity of said select signal.

4. A programmable intercoupling circuit according to claim 3, wherein said programmable polarity circuit comprises:

a third selective coupler having first and second inputs, and an output coupled to said input of said second selective coupler, said third selective coupler being programmable for selectively coupling one of said first and second inputs to its output, said first input being coupled to the output of said first selective coupler; and an inverter electrically coupled between the output of said first selective coupler and the second input of said third selective coupler.

5. A programmable read port of a programmable memory array having a primary I/O bus and a secondary I/O bus and employing a programmable intercoupling circuit for propagating data as retrieved from said programmable memory array, said programmable intercoupling circuit comprising:

a first selective coupler having an output and a plurality of inputs, inputs of said plurality of inputs being coupled to select primary interconnects of said primary I/O bus interconnects, said first selective coupler being programmable for selectively propagating a signal between said output and one input of said plurality of inputs in accordance with a first select signal; and a second selective coupler having an input electrically coupled for receiving a signal associated with the output of said first selective coupler, and a plurality of outputs, outputs of said plurality of outputs being coupled to select secondary interconnects of said secondary I/O bus, said second selective coupler being programmable for selectively propagating a signal between said input and one output of said plurality of outputs in accordance with a second select signal, said programmable read port comprising:

a selective latching circuit disposed between the output of said first selective coupler and the input of said second selective coupler, said selective latching circuit being programmable for selectively propagating data to the input of said second selective coupler related to data as latched from the output of said first selective coupler, or alternatively propagating data to the input of said second selective coupler related directly to data of the output of said first selective coupler, the selectivity of said selective latching circuit being determined per a third select signal.

6. A programmable read port according to claim 5, wherein said selective latching circuit comprises:

a third selective coupler having an output coupled to the input of said second selective coupler, and at least first and second inputs, one of said inputs being selectively coupled, in accordance with said third select signal, to said output for propagating a signal therebetween; and a flip-flop having a data input coupled to the output of said first selective coupler, an output coupled to said first input of said third selective coupler for sending data corresponding to latched data therein, said flip-flop capturing, as latch data therein, data at said data input synchronous with a latching clock signal;

wherein the second input of said third selective coupler is coupled directly to the output of said first selective coupler.

7. A programmable read port according to claim 6, further comprising:

an inverter coupled serially between the output of said first selective coupler and a third input of said third selective coupler.

8. A programmable read port according to claim 6, wherein said flip-flop has an additional complementary output coupled to a fourth input of said third selective coupler.

9. A programmable read port according to claim 6, further comprising a clock multiplexer having a first input coupled to receive a first clock signal from a select primary interconnect of said primary I/O bus, and a second input coupled to receive a second clock signal from a select secondary interconnect of said secondary I/O bus, said clock multiplexer being programmable for selectively propagating, in accordance with a clock select signal, one of said first and second clock signals to said flip-flop as said latching clock signal.

10. A programmable read port according to claim 9, further comprising means for selectively inverting at least one of said first and second clock signals in accordance with a clock polarity select signal.

11. A programmable intercoupling circuit of a programmable memory array having a primary I/O bus and a secondary I/O bus, said programmable intercoupling circuit comprising:

a programmable read port having means for selectively propagating, in accordance with a first select signal, a first signal from a selectable secondary interconnect of said secondary I/O bus to a selectable primary interconnect of said primary I/O bus; and a programmable write port having means for selectively propagating, in accordance with a second select signal, a second signal from a selectable primary interconnect of said primary I/O bus to a selectable secondary interconnect of said secondary I/O bus.

12. A programmable intercoupling circuit of a programmable memory array having a primary I/O bus and a secondary I/O bus, said programmable intercoupling circuit comprising:

a programmable read port having means for selectively propagating, in accordance with a first select signal, a first signal from a select secondary interconnect of said secondary I/O bus to a select primary interconnect of said primary I/O bus; and a programmable write port having means for selectively propagating, in accordance with a second select signal, a second signal from a select primary interconnect of said primary I/O bus to a select secondary interconnect of said secondary I/O bus, wherein said programmable read port comprises:

a first multiplexer having an output and a plurality of inputs coupled to select secondary interconnects of said secondary I/O bus, said multiplexer being programmable for propagating a signal between its output and one of said plurality of inputs in accordance with a first portion of said first select signal; and a second multiplexer having an input electrically coupled to the output of the first multiplexer, and a plurality of outputs coupled to select primary interconnects of said plurality of primary interconnects, said second multiplexer being programmable for selectively propagating a signal between its input and one of said plurality of outputs in accordance with a second portion of said first select signal.

13. A programmable I/O intercoupling circuit according to claim 12, wherein said programmable write port comprises:

a first multiplexer having an output and a plurality of inputs, inputs of said plurality of inputs being coupled to select primary interconnects of said primary I/O bus, said first multiplexer being programmable for selectively propagating a signal between its output and one of said plurality of inputs in accordance with a first portion of said second select signal; and a second multiplexer having an input receiving data corresponding to output data of said first multiplexer, and a plurality of outputs coupled to select secondary interconnects of said secondary I/O bus, said second multiplexer selectively coupling its input and one of said plurality of outputs in accordance with a second portion of said second select signal.

14. A programmable intercoupling circuit according to claim 13, wherein said programmable write port further comprises a programmable polarity circuit for propagating a signal between the output of said first multiplexer and the input of said second multiplexer, said programmable polarity circuit being programmable for selectively inverting said signal.

15. A programmable intercoupling circuit according to claim 14, wherein said programmable polarity circuit comprises:

a third multiplexer having first and second inputs, and an output coupled to the input of said second multiplexer, said third multiplexer being programmnable for selectively coupling one of said first and second inputs to its output, said first input being coupled to the output of said first multiplexer; and an inverter electrically coupled between the output of said first multiplexer and the second input of said third multiplexer.

16. A programmable I/O intercoupling circuit according to claim 13, wherein said programmable read port further comprises:

a selective latching circuit disposed between the output of said first multiplexer and the input of said second multiplexer, said selective latching circuit being programmable for selectively propagating data to the input of said second multiplexer related to data captured from the output of said first multiplexer, or alternatively propagating data to the input of said second multiplexer related directly to data of the output of said first multiplexer, the selectivity of said selective latching circuit being determined per a third select signal.

17. A programmable I/O intercoupling circuit according to claim 16, wherein said selective latching circuit comprises:

a third multiplexer having an output coupled to the input of said second multiplexer, and at least first and second inputs, one of said inputs being selectively coupled, in accordance with said third select signal, to said output thereof for propagating a signal therebetween;

a flip-flop having a data input coupled to the output of said first multiplexer, an output coupled to said first input of said third multiplexer for sending data corresponding to latched data therein, data at said data input being latched within said flip-flop synchronous with a latching clock signal;

the second input of said third multiplexer being coupled directly to the output of said first multiplexer.

18. A programmable intercoupling circuit according to claim 17, further comprising;

an inverter coupled serially between the output of said first multiplexer and a third input of said third multiplexer.

19. A programmable intercoupling circuit according to claim 17, wherein said flip-flop has an additional complementary output coupled to a third input of said third multiplexer.

* * * * *